United States Patent
Takeya et al.

(10) Patent No.: US 9,219,137 B2
(45) Date of Patent: Dec. 22, 2015

(54) VERTICAL GALLIUM NITRIDE TRANSISTORS AND METHODS OF FABRICATING THE SAME

(71) Applicant: Seoul Semiconductor Co., Ltd., Ansan-si (KR)

(72) Inventors: Motonobu Takeya, Ansan-si (KR); Kwan Hyun Lee, Ansan-si (KR); June Sik Kwak, Ansan-si (KR); Young Do Jong, Ansan-si (KR); Kang Nyung Lee, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 0 days.

(21) Appl. No.: 14/177,825

(22) Filed: Feb. 11, 2014

(65) Prior Publication Data
US 2014/0225122 A1    Aug. 14, 2014

(30) Foreign Application Priority Data

Feb. 12, 2013 (KR) .................. 10-2013-0014873
Jun. 20, 2013 (KR) .................. 10-2013-0070692
Jul. 11, 2013 (KR) .................. 10-2013-0081623
Jul. 24, 2013 (KR) .................. 10-2013-0087317

(51) Int. Cl.
*H01L 29/15* (2006.01)
*H01L 29/778* (2006.01)
*H01L 29/32* (2006.01)
(Continued)

(52) U.S. Cl.
CPC ............ *H01L 29/7788* (2013.01); *B82Y 10/00* (2013.01); *H01L 21/6835* (2013.01); *H01L 29/0619* (2013.01); *H01L 29/0646* (2013.01); *H01L 29/0653* (2013.01); *H01L 29/32* (2013.01); *H01L 29/66431* (2013.01); *H01L 29/66462* (2013.01); *H01L 29/66666* (2013.01); *H01L 29/66712* (2013.01); *H01L 29/66727* (2013.01); *H01L 29/66909* (2013.01); *H01L 29/7802* (2013.01); *H01L 29/7828* (2013.01); *H01L 29/802* (2013.01); *H01L 29/045* (2013.01); *H01L 29/122* (2013.01); *H01L 29/2003* (2013.01); *H01L 29/34* (2013.01); *H01L 29/41741* (2013.01); *H01L 29/41766* (2013.01); *H01L 29/41775* (2013.01); *H01L 29/42368* (2013.01); *H01L 29/8083* (2013.01); *H01L 2221/6835* (2013.01); *H01L 2221/68363* (2013.01); *H01L 2221/68381* (2013.01)

(58) Field of Classification Search
CPC .................. H01L 29/7788; H01L 29/2003
USPC .................................................. 257/76, 98
See application file for complete search history.

(56) References Cited

U.S. PATENT DOCUMENTS 6,396,085 B1 * 5/2002 Yoshida .................. 257/135
2006/0006458 A1 * 1/2006 Motai et al. .............. 257/330
2012/0319127 A1 12/2012 Chowdhury et al.

*Primary Examiner* — Tan N Tran
(74) *Attorney, Agent, or Firm* — H.C. Park & Associates, PLC

(57) ABSTRACT

A vertical gallium nitride transistor according to an exemplary embodiment of the present invention includes a semiconductor structure including a first semiconductor layer of a first conductivity-type having a first surface and sidewalls, a second semiconductor layer of the first conductivity-type surrounding the first surface and the sidewalls of the first semiconductor layer, and a third semiconductor layer of a second conductivity-type disposed between the first semiconductor layer and the second semiconductor layer, the third semiconductor layer separating the first and second semiconductor layers from each other.

8 Claims, 46 Drawing Sheets

(51) Int. Cl.
| | | | |
|---|---|---|---|
| *H01L 29/66* | (2006.01) | *H01L 29/34* | (2006.01) |
| *H01L 21/683* | (2006.01) | *H01L 29/417* | (2006.01) |
| *H01L 29/78* | (2006.01) | *H01L 29/04* | (2006.01) |
| *H01L 29/06* | (2006.01) | *H01L 29/20* | (2006.01) |
| *H01L 29/80* | (2006.01) | *H01L 29/423* | (2006.01) |
| *B82Y 10/00* | (2011.01) | *H01L 29/808* | (2006.01) |
| | | *H01L 29/12* | (2006.01) |

# VERTICAL GALLIUM NITRIDE TRANSISTORS AND METHODS OF FABRICATING THE SAME

CROSS-REFERENCE TO RELATED APPLICATIONS

This application claims priority from and the benefit of Korean Application Nos. 10-2013-0014873, 10-2013-0070692, 10-2013-0081623 and 10-2013-0087317, filed on Feb. 12, 2013, Jun. 20, 2013, Jul. 11, 2013 and Jul. 24, 2013, respectively, which are incorporated by reference for all purposes as if fully set forth herein.

BACKGROUND

1. Field

Exemplary embodiments of the present disclosure relate to transistors and methods of fabricating the same and, more particularly, to vertical gallium nitride transistors and methods of fabricating the same.

2. Discussion of the Background

In the electronics industry, high voltage transistors operating at a high speed are increasingly in demand with the development of information and communication techniques. In response to such a demand, use of gallium nitride (GaN) transistors has been proposed. GaN transistors may exhibit a relatively fast switching characteristic and a relatively high breakdown voltage characteristic as compared with conventional silicon transistors. Thus, GaN transistors may be very attractive as candidates for improving the performance of communication systems. Particularly, high electron mobility transistors (HEMTs) fabricated using a gallium nitride (GaN) material may operate using a two-dimension electron gas (2DEG) generated at an interface in a heterogeneous material. Thus, electron mobility of the HEMTs may be improved to allow the HEMTs to operate at a high speed.

In general, GaN transistors may be fabricated to have a planar-type configuration. In such a case, there may be a limitation in improving carrier mobility. This is because an electric field at a channel surface disturbs movement of the carriers. Further, when the planar-type GaN transistors operate, an electric field may be concentrated at corners of gate electrodes of the planar-type GaN transistors. This may lead to degradation of the breakdown voltage characteristic of the planar-type GaN transistors.

Recently, vertical GaN transistors have been proposed to solve the above disadvantages. For example, current aperture vertical electron transistors (CAVETs) are taught in U.S. patent publication No. US 2012/0319127 A1 to Chowdhury et al., entitled "current aperture vertical electron transistors with ammonia molecular beam epitaxy grown P-type gallium nitride as a current blocking layer". According to the U.S. patent publication No. US 2012/0319127 A1, a source electrode and a drain electrode are disposed to vertically face each other, and a P-type gallium nitride (P-GaN) layer acting as a current blocking layer is disposed between the source and drain electrodes. Accordingly, a channel current may flow in a vertical direction from the drain electrode toward the source electrode, through an aperture provided by the P-type gallium nitride (P-GaN) layer.

In order to fabricate the vertical GaN transistors, a process for epitaxial growth of a GaN layer may be used. For example, the GaN layer may be grown on a c-plane sapphire substrate using a metal organic chemical vapor deposition (MOCVD) process for reasons of low fabrication cost in spite of a relatively high lattice constant and a thermal coefficient mismatch. However, the GaN layer grown on the c-plane sapphire substrate using the MOCVD process may have a high defect density because of a lattice constant difference between the c-plane sapphire substrate and the GaN layer grown on the c-plane sapphire substrate. That is, a number of threading dislocations (TDs) may be formed in the GaN layer to be parallel with a growing direction of the GaN layer. The threading dislocations (TDs) may act as non-radiative recombination centers or charged scattering centers to affect the mobility of the carriers. In particular, if the threading dislocations (TDs) are formed to be parallel with a vertical direction corresponding to a movement direction of the carriers in the vertical GaN transistors, a breakdown voltage of drain junctions of the vertical GaN transistors may be remarkably reduced, and may degrade the reliability of the vertical GaN transistors.

The above information disclosed in this Background section is only for enhancement of understanding of the background of the invention and therefore it may contain information that does not form any part of the prior art nor what the prior art may suggest to a person of ordinary skill in the art.

SUMMARY OF THE INVENTION

Exemplary embodiments of the present invention provide vertical gallium nitride transistors and methods of fabricating the same.

Additional features of the invention will be set forth in the description which follows, and in part will be apparent from the description, or may be learned by practice of the invention.

According to an exemplary embodiment of the present invention, a vertical gallium nitride transistor includes a first semiconductor layer of a first conductivity type having a top surface, a bottom surface and sidewalls, a second semiconductor layer of the first conductivity type surrounding the bottom surface and the sidewalls of the first semiconductor layer, a semiconductor layer of a second conductivity type disposed between the first semiconductor layer and the second semiconductor layer to separate the first and second semiconductor layers from each other, a source electrode disposed on the top surface of the first semiconductor layer and electrically connected to the first semiconductor layer, a gate electrode disposed on a top surface of the semiconductor layer between the first and second semiconductor layers, and a drain electrode on a bottom surface of the second semiconductor layer. The first semiconductor layer, the semiconductor layer and the second semiconductor layer constitute a semiconductor structure.

According to another exemplary embodiment, a vertical gallium nitride transistor includes a drain electrode, a first semiconductor layer of a first conductivity type disposed on the drain electrode, and a second semiconductor layer disposed on the first semiconductor layer. The second semiconductor layer is an undoped semiconductor layer. A third semiconductor layer of a second conductivity type and a source electrode are disposed on the second semiconductor layer to be spaced apart from each other. An insulation layer is disposed on the third semiconductor layer, and a gate electrode is disposed on the insulation layer. A blocking layer is disposed between the first and second semiconductor layers. The blocking layer is disposed below the source electrode to block a vertical current path between the source electrode and the drain electrode.

According to another exemplary embodiment, a vertical gallium nitride transistor includes a substrate, a buffer layer on the substrate, a mask pattern disposed on the buffer layer to expose portions of the buffer layer, a gallium nitride layer covering the mask pattern and the exposed portions of the buffer layer, a first drift layer on a portion of the gallium nitride layer, a current blocking pattern disposed on the first drift layer to expose a portion of the first drift layer, a second drift layer on the exposed portion of the first drift layer, a donor layer on the current blocking pattern, a channel layer disposed on the current blocking pattern to surround sidewalls of the donor layer, a gate electrode disposed on the second drift layer and insulated from the second drift layer by a gate insulation layer between the gate electrode and the second drift layer, a source electrode disposed on the donor layer and electrically connected to the donor layer, and a drain electrode disposed on the gallium nitride layer to be spaced apart from the first drift layer.

According to another exemplary embodiment, a vertical gallium nitride transistor includes a substrate, a buffer layer on the substrate, a mask pattern disposed on the buffer layer to expose portions of the buffer layer, a gallium nitride layer covering the mask pattern and the exposed portions of the buffer layer, a first drift layer on a portion of the gallium nitride layer, a current blocking pattern disposed on the first drift layer to expose a portion of the first drift layer, a second drift layer on the exposed portion of the first drift layer, a heterogeneous semiconductor layer disposed on the second drift layer to form a two dimension electron gas (2DEG) layer at a top surface of the second drift layer, a donor layer on the current blocking pattern, a channel layer disposed on the current blocking pattern to surround sidewalls of the donor layer, a gate electrode on the heterogeneous semiconductor layer, a source electrode disposed on the donor layer and electrically connected to the donor layer, and a drain electrode disposed on the gallium nitride layer to be spaced apart from the first drift layer.

According to another exemplary embodiment, a method of fabricating a vertical gallium nitride transistor includes forming a gallium nitride layer on a growth substrate, patterning the gallium nitride layer to form stripe patterns and to recess the growth substrate, and growing a plurality of gallium nitride layers on the stripe patterns. The plurality of gallium nitride layers cover sidewalls and top surfaces of the stripe patterns. A support substrate is attached to the plurality of gallium nitride layers. The growth substrate is detached from the stripe patterns to expose the stripe patterns and the plurality of gallium nitride layers. Source electrodes are formed on the exposed stripe patterns. A gate insulation layer is formed on the gallium nitride layers between the source electrodes. A gate electrode is formed on the gate insulation layer.

According to another exemplary embodiment, a method of fabricating a vertical gallium nitride transistor includes forming seed patterns of a first conductivity type on a first substrate, growing the seed patterns to form a first semiconductor layer of a first conductivity type, forming blocking layers on the first semiconductor layer to vertically overlap with the seed patterns, and forming second semiconductor layers on portions of the first semiconductor layer between the blocking layers. The second semiconductor layers are formed of an undoped semiconductor layer. A third semiconductor layer of a second conductivity type is formed on the blocking layers and the second semiconductor layers. An insulation layer is formed on the third semiconductor layer. Gate electrodes are formed on insulation layer and source electrodes are formed between the gate electrodes. A second substrate is attached onto the gate electrodes and the source electrodes. The first substrate is detached from the seed patterns and the first semiconductor layer. A drain electrode is formed on the seed patterns and the first semiconductor layer.

According to another exemplary embodiment, a method of fabricating a vertical gallium nitride transistor includes forming a buffer layer on a substrate, forming mask patterns on the buffer layer to expose portions of the buffer layer, forming a gallium nitride layer on the mask patterns and the exposed portions of the buffer layer, forming a first drift layer on the gallium nitride layer, forming current blocking patterns on the first drift layer to expose portions of the first drift layer, forming second drift layers on the exposed portions of the first drift layer, forming a channel layer on the second drift layers, forming a donor layer on the channel layer, planarizing the donor layer and the channel layer to expose top surfaces of the second drift layers, forming gate electrodes insulated from the second drift layers by a gate insulation layer between the gate electrodes and the second drift layers, forming source electrodes electrically connected to the donor layers remaining on the current blocking patterns, and forming a drain electrode on a portion of the gallium nitride layer.

According to another exemplary embodiment, a method of fabricating a vertical gallium nitride transistor includes forming a buffer layer on a substrate, forming mask patterns on the buffer layer to expose portions of the buffer layer, forming a gallium nitride layer on the mask patterns and the exposed portions of the buffer layer, forming a first drift layer on the gallium nitride layer, forming current blocking patterns on the first drift layer to expose portions of the first drift layer, forming second drift layers on the exposed portions of the first drift layer, forming a channel layer on the second drift layers, forming a donor layer on the channel layer, planarizing the donor layer and the channel layer to expose top surfaces of the second drift layers, forming a heterogeneous semiconductor layer on the exposed second drift layers to form a two dimension electron gas layer at the top surfaces of the second drift layers, forming gate electrodes insulated from the heterogeneous semiconductor layer by a gate insulation layer between the gate electrodes and the heterogeneous semiconductor layer, forming source electrodes electrically connected to the donor layers remaining on the current blocking patterns, and forming a drain electrode on a portion of the gallium nitride layer.

According to another exemplary embodiment, a method of fabricating a vertical gallium nitride transistor includes forming mask patterns on a first gallium nitride layer to expose portions of the first gallium nitride layer, forming second gallium nitride layers on the exposed portions of the first gallium nitride layer, forming third gallium nitride layers on the second gallium nitride layers, forming a fourth gallium nitride layer covering the third gallium nitride layers, forming current blocking patterns on the fourth gallium nitride layer to expose portions of the fourth gallium nitride layer, forming a fifth gallium nitride layer on the current blocking patterns and the exposed portions of the fourth gallium nitride, and forming a sixth gallium nitride layer on the fifth gallium nitride layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

FIGS. 12 to 27 are cross-sectional views illustrating a method of fabricating the vertical gallium nitride transistor according to an exemplary embodiment of the present invention.

FIG. 23, 24A, and FIG. 24B are cross-sectional views illustrating a method of fabricating a vertical gallium nitride according to an exemplary embodiment of the present invention.

DETAILED DESCRIPTION OF THE ILLUSTRATED EMBODIMENTS

Figure 1:
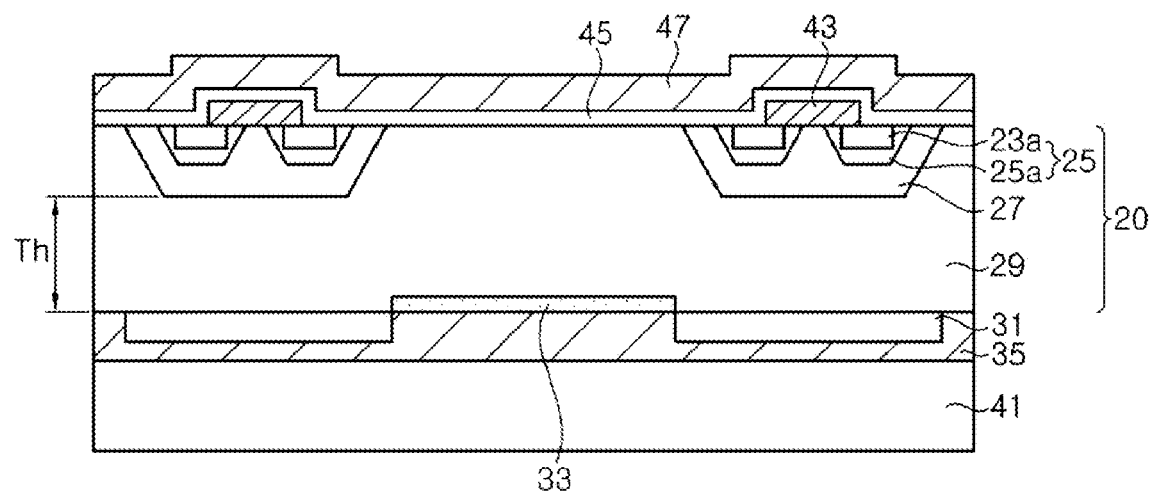
FIG. 1 is a cross-sectional view illustrating a vertical gallium nitride transistor according to an exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

FIG. 1 is a cross-sectional view illustrating a vertical gallium nitride transistor according to an exemplary embodiment of the present invention. Referring to FIG. 1, the vertical gallium nitride transistor according to the present exemplary embodiment may include a semiconductor structure 20, a source electrode 43, a drain electrode 35, a gate electrode 47, a current blocking layer 31, a gate insulation layer 45, and a support substrate 41.

The semiconductor structure 20 may include a top surface and a bottom surface. Further, the semiconductor structure 20 may include a first semiconductor layer 25 of a first conductivity type, a semiconductor layer 27 of a second conductivity type, and a second semiconductor layer 29 of the first conductivity type. In addition, the semiconductor structure 20 may include a low resistive layer 33. The first conductivity type may be an N-type and the second conductivity type may be a P-type in the present exemplary embodiment. For example, in one exemplary embodiment, the first conductivity type may be a P-type and the second conductivity type may be an N-type. In the present exemplary embodiment, the semiconductor structure 20 may be a gallium nitride (GaN) material. However, in one exemplary embodiment, the semiconductor structure 20 may be a III-V group compound semiconductor material, such as a gallium arsenide (GaAs) material or a gallium phosphide (GaP) material. In one exemplary embodiment, the semiconductor structure 20 may be a binary component semiconductor material, a ternary component semiconductor material, or a four component semiconductor material.

The first semiconductor layer 25 of the first conductivity type may include a stripe pattern 23a. The first semiconductor layer 25 of the first conductivity type may further include an additional semiconductor layer 25a of the first conductivity type covering sidewalls and a bottom surface of the stripe pattern 23a. The stripe pattern 23a may be disposed to be adjacent to a top surface of the semiconductor structure 20 and may extend in one direction. For example, the stripe pattern 23*a* may extend to be parallel with a <1-100> orientation or a <11-20> orientation. Further, a bottom surface of the stripe pattern 23*a* may be a c-plane. The stripe pattern 23*a* may be formed of, for example, a gallium nitride (GaN) material having the first conductivity type. The stripe pattern 23*a* may be formed of an N-type semiconductor material having a relatively high impurity concentration. The additional semiconductor layer 25*a* of the first conductivity type may cover the sidewalls and the bottom surface of the stripe pattern 23*a*, as described above. The additional semiconductor layer 25*a* of the first conductivity type may be the same material (e.g., a gallium nitride material) as the stripe pattern 23*a*. Further, the additional semiconductor layer 25*a* may have the same impurity concentration as the stripe pattern 23*a* or a similar impurity concentration to the stripe pattern 23*a*. The stripe pattern 23*a* and the additional semiconductor layer 25*a* surrounding the stripe pattern 23*a* may constitute the first semiconductor layer 25. Alternatively, the additional semiconductor layer 25*a* may be absent. In such a case, the stripe pattern 23*a* may correspond to the first semiconductor layer 25. A bottom surface of the additional semiconductor layer 25*a* may be a c-plane, and sidewalls of the additional semiconductor layer 25*a* may be a (11-22) plane or a (1-101) plane. If the additional semiconductor layer 25*a* is a gallium nitride (GaN) material, a top surface of the additional semiconductor layer 25*a* may be a nitride face (N-face) and a bottom surface of the additional semiconductor layer 25*a* may be a gallium face (Ga-face).

The semiconductor layer 27 of the second conductivity type may surround sidewalls and a bottom surface of the first semiconductor layer 25. Thus, a top surface of the semiconductor layer 27 may correspond to a portion of a top surface of the semiconductor structure 20, as illustrated in FIG. 1. The semiconductor layer 27 of the second conductivity type may be a gallium nitride (GaN) material doped with P-type impurities such as magnesium ions. The semiconductor layer 27 of the second conductivity type may also have a stripe shape extending along the first semiconductor layer 25. The number of semiconductor layers 27 included in the semiconductor structure 20 may be two or more. That is, the plurality of semiconductor layers 27 may be disposed in the semiconductor structure 20, and the first semiconductor layer 25 may be disposed in each of the semiconductor layers 27. A distance between the semiconductor layers 27 may be about 7 micrometers to about 9 micrometers. At the top surface of the semiconductor structure 20, a width of the exposed semiconductor layers 27 located between the first and second semiconductor layers 25 and 29 may be about 2 micrometers. As illustrated in FIG. 1, the two or more of the first semiconductor layers 25 may be disposed in each of the semiconductor layers 27. The first semiconductor layers 25 in each semiconductor layer 27 may have a width of about 7 micrometers or less.

The second semiconductor layer 29 of the first conductivity type may surround bottom surfaces and sidewalls of the semiconductor layers 27. Thus, each of the semiconductor layers 27 may be disposed between the first and second semiconductor layers 25 and 29 to separate the first semiconductor layers 25 from the second semiconductor layer 29. The second semiconductor layer 29 may be, for example, a gallium nitride (GaN) material. A portion of the second semiconductor layer 29 may be exposed at the top surface of the semiconductor structure 20, as illustrated in FIG. 1. A bottom surface of the second semiconductor layer 29 may correspond to a bottom surface of the semiconductor structure 20. The second semiconductor layer 29 may be intentionally doped with impurities such as silicon atoms. Alternatively, the second semiconductor layer 29 may be an undoped layer. If the second semiconductor layer 29 is doped with impurities of the first conductivity type, an impurity concentration of the second semiconductor layer 29 may be lower than that of the first semiconductor layer 25.

The second semiconductor layer 29 may be exposed at the bottom surface of the semiconductor structure 20, as described above. A thickness Th of the second semiconductor layer 29 measured under the semiconductor layers 27 may be controlled to improve a breakdown voltage characteristic of the transistor. The thickness Th may be greater than a thickness $X_n$ (i.e., a width) of a depletion layer formed in the second semiconductor layer 29, when a reverse bias is applied between the semiconductor layers 27 and the second semiconductor layer 29. If a reverse bias is applied between the semiconductor layers 27 and the second semiconductor layer 29, a depletion layer having a thickness $X_p$ may also be formed in the semiconductor layers 27. In such a case, the thicknesses $X_n$ and $X_p$ of the depletion layers may be expressed by the following equations 1 and 2, respectively.

$$x_n = \sqrt{\frac{2\varepsilon N_a}{qN_d(N_d + N_a)}(\phi_B - V_b)} \qquad \text{(Equation 1)}$$

$$x_p = \sqrt{\frac{2\varepsilon N_d}{qN_a(N_d + N_a)}(\phi_B - V_b)} \qquad \text{(Equation 2)}$$

In the equations 1 and 2, "$\varepsilon$" denotes a permeability [F/m] of the semiconductor layers (e.g., a gallium nitride material) and "q" denotes a quantity of elementary charge [Coulomb]. Further, "$N_a$" denotes an acceptor concentration [cm$^{-3}$] in the semiconductor layers 27 and "$N_d$" denotes a donor concentration [cm$^{-3}$] in the second semiconductor layer 29. In addition, "$\phi_B$" denotes a built-in potential of a P—N junction between the semiconductor layers 27 and the second semiconductor layer 29 and "$V_b$" denotes a reverse bias voltage (i.e., a negative voltage) applied to the P—N junction between the semiconductor layers 27 and the second semiconductor layer 29.

The built-in potential "$\phi_B$" may be expressed by the following equation 3.

$$\phi_B = \frac{kT}{q}\log\frac{N_a N_d}{n_i^2} \qquad \text{(Equation 3)}$$

In the equation 3, "k" denotes a Boltzmann constant [V] and "T" denotes an absolute temperature. In addition, "ni" denotes a carrier concentration in an intrinsic semiconductor layer.

When no bias is applied to the P—N junction between the semiconductor layers 27 and the second semiconductor layer 29, a maximum electric field "$E_{max}$" in the P—N junction may be expressed by the following equation 4.

$$E_{max} = -\frac{qN_a}{\varepsilon}x_n \qquad \text{(Equation 4)}$$

When the acceptor concentration $N_a$ in the semiconductor layers 27, the donor concentration $N_d$ in the second semiconductor layer 29, and the reverse bias $V_b$ are given, the thicknesses $X_n$ and $X_p$ of the depletion layers and the maximum electric field $E_{max}$ in the P—N junction may be calculated using the equations 1, 2, 3, and 4. When the second semiconductor layer 29 is a gallium nitride (GaN) material, the gallium nitride (GaN) material may be damaged in an electric field of about 3.3 MV/cm or greater. Thus, the reverse bias voltage $V_b$ should be controlled such that the maximum electric field Emax is less than 3.3 MV/cm and the thickness $X_n$ of the depletion layer in the second semiconductor layer 29 should be less than the thickness Th of the second semiconductor layer 29. For example, when the acceptor concentration $N_a$ is $3 \times 10^{17}/cm^3$ and the donor concentration $N_d$ is $2 \times 10^{16}/cm^3$, the depletion widths $X_n$ and $X_p$ and the maximum electric fields $E_{max}$ according to various reverse bias voltages $V_b$ may be summarized as listed in the following table 1.

TABLE 1

| $V_b$ (V) | $X_n$ (µm) | $X_p$ (µm) | $E_{max}$ (MV/cm) |
|---|---|---|---|
| 600 | 5.44 | 0.36 | 2.07 |
| 900 | 6.66 | 0.44 | 2.53 |
| 1200 | 7.69 | 0.51 | 2.93 |
| 1500 | 8.6 | 0.57 | 3.27 |

Referring to Table 1, when the reverse bias voltage Vb is 1500 Volts, the maximum electric field $E_{max}$ is 3.27 MV/cm which less than 3.3 MV/cm. Thus, if the thickness Th of the second semiconductor layer 29 is greater than the depletion thickness $X_n$ of 8.6 micrometers, the P—N junction may normally operate without any breakdown. As a result, if the thickness Th of the second semiconductor layer 29 is greater than 9 micrometers, the P—N junction may have a breakdown voltage of about 1500 Volts or greater.

The low resistive layer 33 may be disposed on a bottom surface of the semiconductor structure 20. The low resistive layer 33 may be an etch damage layer formed by etching a portion of the second semiconductor layer 29 using a dry etch process. The low resistive layer 33 may be disposed on a bottom surface of the second semiconductor layer 29 between the adjacent semiconductor layers 27 and may have a width which is less than a distance between the adjacent semiconductor layers 27. The low resistive layer 33 may reduce a contact resistance value of the drain electrode 35.

The current blocking layers 31 may be disposed on a bottom surface of the semiconductor structure 20 opposite to the semiconductor layers 27. Each of the current blocking layers 31 may have a width which is approximately equal to or greater than a width of each semiconductor layer 27. The threading dislocations (TD) may be generated under the first semiconductor layers 25 to have a relatively high density. The current blocking layers 31 may reduce a leakage current that flows through the threading dislocations (TD). The low resistive layer 33 may be disposed between the adjacent current blocking layers 31.

The drain electrode 35 may be disposed on the bottom surface of the semiconductor structure 20 to cover the low resistive layer 33 and the current blocking layers 31. The drain electrode 35 may be electrically connected to the semiconductor structure 20 through the low resistive layer 33 corresponding to a high impurity concentration layer which is heavily doped with impurities of the first conductivity type. The drain electrode 35 may be formed of, for example, a metal layer such as a titanium (Ti)/platinum (Pt)/gold (Au) layer. The drain electrode 35 may extend to cover the current blocking layers 31, as illustrated in FIG. 1. The drain electrode 35 may include a bonding metal for bonding the semiconductor structure 20 to the support substrate 41.

Any substrate may be suitable for the support substrate 41. For example, a silicon substrate or a metal substrate may be used as the support substrate 41 in consideration of a cost or a fabrication process.

The source electrode 43 may be disposed to be electrically connected to the first semiconductor layers 25. The source electrode 43 may also be connected to the semiconductor layers 27. As described above, at least two first semiconductor layers 25 may be disposed in each of the semiconductor layers 27, and the source electrode 43 may be connected to the first and second semiconductor layers 25 and 27. Alternatively, the source electrode 43 may be connected to the first semiconductor layers 25, and a separate electrode may be connected to the semiconductor layer 27. The source electrode 43 may be formed of a conductive layer acting as an ohmic contact layer with respect to the first semiconductor layers 25. For example, the source electrode 43 may be formed of a titanium (Ti)/nickel (Ni)/platinum (Pt)/gold (Au) layer. Even though FIG. 1 illustrates a couple of separate source electrodes 43 which are connected to first semiconductor layers 25, the couple of separate source electrodes 43 may be electrically connected to have the same electric potential.

The gate insulation layer 45 may be disposed to cover the source electrodes 43 and the top surface of the semiconductor structure 20. The gate insulation layer 45 may be formed of a silicon oxide ($SiO_2$) layer and may be formed to have a thickness of about 60 nanometers to about 1000 nanometers. The gate electrode 47 may be disposed on the gate insulation layer 45. The gate electrode 47 may extend to cover the source electrodes 43. The gate electrode 47 may be disposed on the semiconductor layers 27 exposed at the top surface of the semiconductor structure 20 such that channel layers are formed between the first and second semiconductor layers 25 and 29. Further, the gate electrode 47 may extend to cover the second semiconductor layer 29 between the adjacent semiconductor layers 27.

An operation of the vertical GaN transistor having the aforementioned configuration will be described hereinafter. First, if no bias voltage is applied to the gate electrode 47, the vertical GaN transistor may be turned off because no channel layers are formed between the first and second semiconductor layers 25 and 29. Thus, the vertical GaN transistor may be normally turned off. If a positive voltage is applied to the gate electrode 47, channel layers may be formed in the semiconductor layers 27 under the gate electrode 47. Thus, carriers (e.g., electrons) may be drifted by a voltage difference between the drain electrode 35 and the source electrodes 43 from the source electrodes 43 toward the drain electrode 35 through the channel layers. That is, the carriers may move from the first semiconductor layers 25 toward the second semiconductor layer 29 through the channel layers formed in the semiconductor layers 27 under the gate electrode 47. The carriers injected into the second semiconductor layer 29 may move to the drain electrode 35. In such a case, the current blocking layers 31 may prevent the carriers from moving in a vertical direction.

Figure 2:
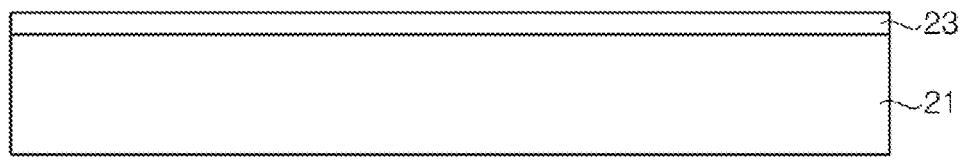
FIGS. 2 to 9 are cross-sectional views illustrating a method of fabricating the vertical gallium nitride transistor according to the exemplary embodiment of FIG. 1.

FIG. 2, FIG. 3, FIG. 4, FIG. 5, FIG. 6, FIG. 7, FIG. 8, and FIG. 9 are cross-sectional views illustrating a method of fabricating the vertical gallium nitride transistor shown in FIG. 1. Referring to FIG. 2, a semiconductor layer 23 such as a gallium nitride (GaN) layer may be grown on a growth substrate 21. The growth substrate 21 may be any substrate that facilitates the growth of the semiconductor layer 23. For example, the growth substrate 21 may be a sapphire substrate. The semiconductor layer 23 and semiconductor layers mentioned hereinafter may be grown using a metal organic chemical vapor deposition (MOCVD) process or a molecular beam epitaxy (MBE) growth technique. The semiconductor layer 23 may include a nuclear layer (not shown). The semiconductor layer 23 may be doped with impurities of a first conductivity type. The first conductivity type may be an N-type.

Figure 3:
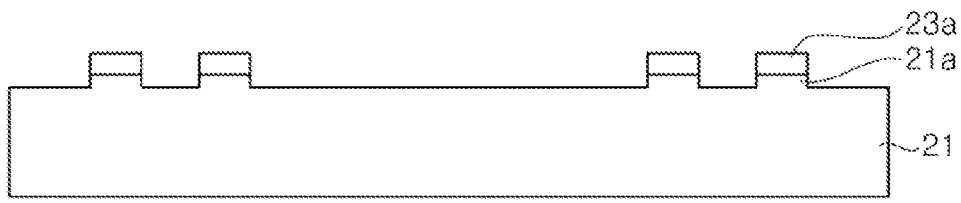

Referring to FIG. 3, the semiconductor layer 23 may be patterned to form stripe patterns 23a. The semiconductor layer 23 may be patterned using a photolithography process and an etch process. When the growth substrate 21 is a sapphire substrate, the stripe patterns 23a may be formed to be parallel with a <1-100> orientation or a <11-20> orientation. While the semiconductor layer 23 is patterned, the growth substrate 21 may be over-etched to form protrusions 21a under the stripe patterns 23a. The stripe patterns 23a may include two groups of stripe patterns 23a, and each group of stripe patterns 23a may include at least two stripe patterns 23a which are adjacent to each other. Each group of the stripe patterns 23a may be formed in a region having a width of about 7 micrometers, and a distance between the two groups of stripe patterns 23a may be about 10 micrometers. Each of the stripe patterns 23a may be formed to have sidewalls which are perpendicular to a top surface of the growth substrate 21, but not limited thereto. For example, the stripe patterns 23a may be formed to have sloped sidewalls.

Figure 4:
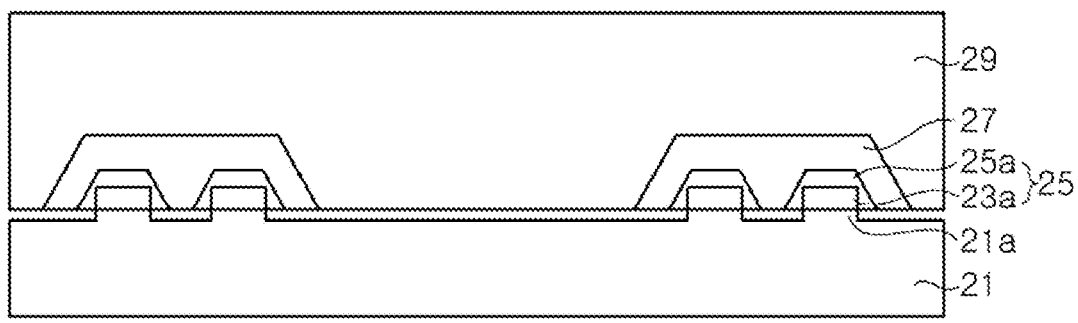

Referring to FIG. 4, additional semiconductor layers 25a of the first conductivity type may be grown on respective stripe patterns 23a. The additional semiconductor layers 25a may be grown to cure etch damage applied to the sidewalls of the stripe patterns 23a. The additional semiconductor layers 25a may be grown to have substantially the same impurity concentration as the stripe patterns 23a. Further, the additional semiconductor layers 25a may be grown to have the same composition as the stripe patterns 23a. Accordingly, each stripe pattern 23a and the corresponding additional semiconductor layer 25a may become a single homogeneous body to constitute a first semiconductor layer 25. Alternatively, a process for growing the additional semiconductor layers 25a may be omitted. In such a case, each of the stripe patterns 23a may be the first semiconductor layer 25. The additional semiconductor layers 25a may be grown on top surfaces and sidewalls of the stripe patterns 23a. Semiconductor layers 27 of a second conductivity type may be grown on the first semiconductor layers 25, and a second semiconductor layer 29 of the first conductivity type may be grown on the semiconductor layers 27. The semiconductor layers 27 may be grown on top surfaces and sidewalls of the first semiconductor layers 25, and the second semiconductor layer 29 may be grown on top surfaces and sidewalls of the semiconductor layers 27. The second semiconductor layer 29 of the first conductivity type may be grown to have an impurity concentration which is lower than that of the first semiconductor layers 25 of the first conductivity type. The second semiconductor layer 29 of the first conductivity type may be grown to be an undoped layer without intentional impurities. The second semiconductor layer 29 may be formed such that the second semiconductor layer 29 on the semiconductor layers 27 has a thickness of about 5 micrometers to about 10 micrometers.

When the growth substrate 21 is a c-plane sapphire substrate, top surfaces of the semiconductor layers 25a, 27, and 29 may be grown in a [0001] orientation to have c-planes and may correspond to gallium faces (Ga-faces). Further, sidewalls of the semiconductor layers 25a, 27, and 29 may be grown in a [11-22] orientation or a [1-101] orientation to have (11-22) planes or (1-101) planes. Plane orientations of the sidewalls of the semiconductor layers 25a, 27, and 29 may be determined according to a length direction of the stripe patterns 23a. For example, if the length direction of the stripe patterns 23a is consistent with a <1-100> orientation, the sidewalls of the semiconductor layers 25a, 27, and 29 may be grown to have (11-22) planes. Alternatively, if the length direction of the stripe patterns 23a is consistent with a <11-20> orientation, the sidewalls of the semiconductor layers 25a, 27, and 29 may be grown to have (1-101) planes. A vertical growth rate and a lateral growth rate of each of the semiconductor layers 25a, 27, and 29 may be controlled by adjusting process conditions for forming the semiconductor layers 25a, 27, and 29. For example, a vertical growth rate and a lateral growth rate of each of the semiconductor layers 25a, 27, and 29 may be controlled by adjusting growth conditions such as a growth temperature and/or a flow rate of each source gas. Thus, the process conditions may be appropriately adjusted such that a vertical thickness of each semiconductor layer 25a, 27, or 29 is equal to or different from a lateral thickness thereof. The threading dislocations (TD) generated in the stripe patterns 23a may be vertically (i.e., upwardly) transferred. Thus, a threading dislocation (TD) density at top surfaces of the stripe patterns 23a may be greater than a threading dislocation (TD) density at sidewalls of the stripe patterns 23a. The semiconductor layers grown on the pair of adjacent stripe patterns 23a (or the pair of adjacent additional semiconductor layers 25a) may contact each other to constitute a single layer of the semiconductor layers 27, and the semiconductor layers grown on the separate semiconductor layers 27 may contact each other to constitute a single layer of the second semiconductor layer 29.

Figure 5:
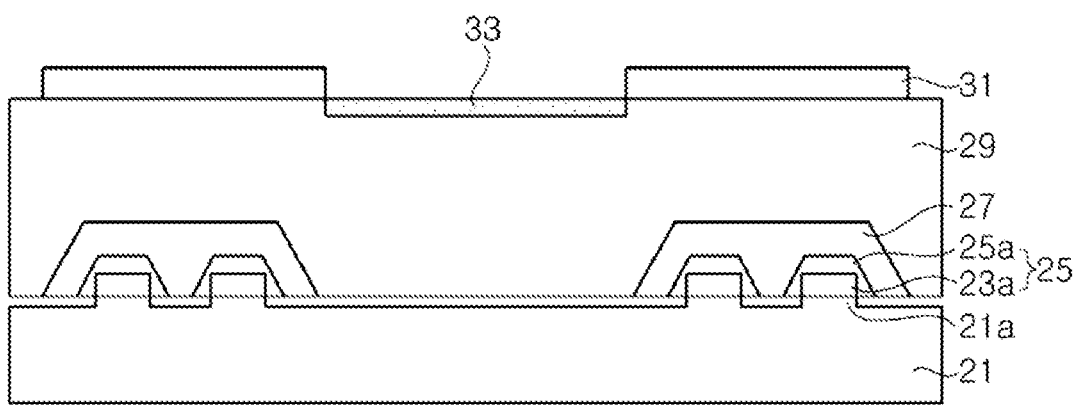

Referring to FIG. 5, current blocking layers 31 may be formed on the second semiconductor layer 29. The current blocking layers 31 may be formed by depositing a silicon oxide ($SiO_2$) layer on the second semiconductor layer 29 and by patterning the silicon oxide ($SiO_2$) layer. The current blocking layers 31 may be formed on the semiconductor layers 27. Thus, portions of the second semiconductor layer 29 between the semiconductor layers 27 may be exposed by the current blocking layers 31. A width of each of the current blocking layers 31 may be equal to or greater than a top surface width of each of the semiconductor layers 27. Portions of the semiconductor layers 25a, 27, and 29 vertically grown on the stripe patterns 23a may have a relatively high threading dislocation (TD) density. Thus, the current blocking layers 31 may reduce a leakage current that flows through the threading dislocations (TD) generated on the top surfaces of the stripe patterns 23a. The second semiconductor layer 29 may be etched using a dry etch process with the current blocking layers 31 acting as etch masks, thereby forming an etch damage layer 33 between the current blocking layers 31. The etch damage layer 33 may function as a low resistive layer. If the semiconductor layers 27 are formed of a gallium nitride (GaN) layer doped with magnesium (Mg) atoms, the magnesium (Mg) atoms in the semiconductor layers 27 may be activated before or after formation of the current blocking layers 31. For example, the magnesium (Mg) atoms in the semiconductor layers 27 may be activated using an annealing process that is performed at a temperature of about 700 degrees Celsius to about 900 degrees Celsius for about 30 minutes.

Figure 6:
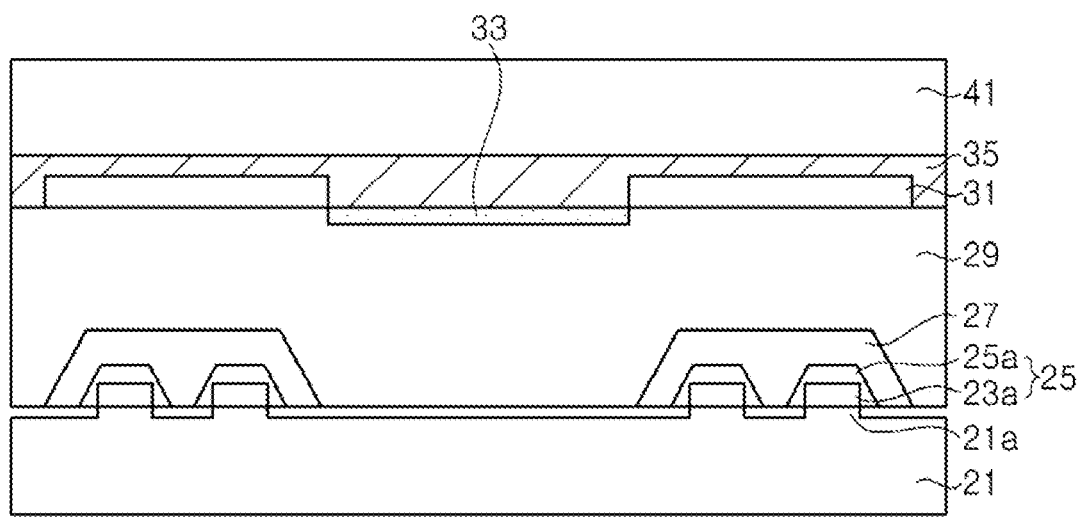

Referring to FIG. 6, a support substrate 41 may be attached to the second semiconductor layer 29. The support substrate 41 may be formed by depositing a metal layer 35 (corresponding to a drain electrode) such as a titanium (Ti)/platinum (Pt)/gold (Au) layer on the current blocking layers 31 and the low resistive layer 33 and by bonding the support substrate 41 to the metal layer 35. Alternatively, the support substrate 41 may be formed on the metal layer 35 using a plating process. The support substrate 41 is not limited to a specific substrate. That is, any substrate may be suitable for the support substrate 41. For example, the support substrate 41 may be formed of a ceramic substrate, a semiconductor substrate, or a metal substrate. More specifically, the support substrate 41 may be formed of an aluminum nitride (AlN) substrate, an aluminum silicide (AlSi) substrate, a silicon (Si) substrate, a copper (Cu) substrate, a molybdenum (Mo) substrate, or a tungsten (W) substrate. In one exemplary embodiment, the support substrate 41 and the metal layer 35 may constitute a single unified substrate. The metal layer 35 may be electrically connected to the low resistive layer 33 and may be disposed between the support substrate 41 and the second semiconductor layer 29. The metal layer 35 may act as a drain electrode.

Figure 7:
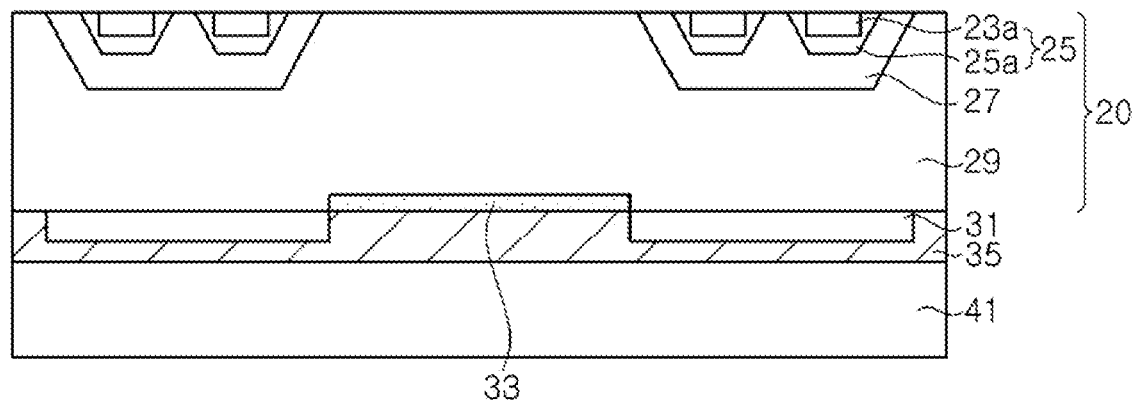

Referring to FIG. 7, the growth substrate 21 may be removed from the semiconductor layers 25, 27, and 29 including the stripe patterns 25a. The growth substrate 21 may be detached from the semiconductor layers 25, 27, and 29 using a laser lift-off technique. In such a case, exposed surfaces of the semiconductor layers 25, 27, and 29 may be damaged by a laser, and gallium droplets may remain on the exposed surfaces of the semiconductor layers 25, 27, and 29. Thus, a wet etch process or a combination of a wet etch process and a dry etch process may be applied to the exposed surfaces of the semiconductor layers 25, 27, and 29 to recess the exposed surfaces of the semiconductor layers 25, 27, and 29. As a result, the surface damage layer and the gallium droplets may be removed from the semiconductor layers 25, 27, and 29. The dry etch process for recessing the exposed surfaces of the semiconductor layers 25, 27, and 29 may correspond to a reactive ion etching (RIE) process, and the wet etch process for recessing the exposed surfaces of the semiconductor layers 25, 27, and 29 may be performed using a potassium hydroxide (KOH) solution, a sodium hydroxide (NaOH) solution or a phosphoric acid ($H_3PO_4$) solution as an etchant. A photoresist layer may be formed to cover a surface of the support substrate 41 and sidewalls of the second semiconductor layer 29 to prevent the support substrate 41 and the second semiconductor layer 29 from being damaged or etched during the wet etch process. After the exposed surfaces of the semiconductor layers 25, 27, and 29 are recessed and cleaned using the wet process, the semiconductor layers 25, 27, and 29 may constitute a semiconductor structure 20 and the exposed surfaces of the semiconductor layers 25, 27, and 29 may correspond to a top surface of the semiconductor structure 20.

Figure 8:
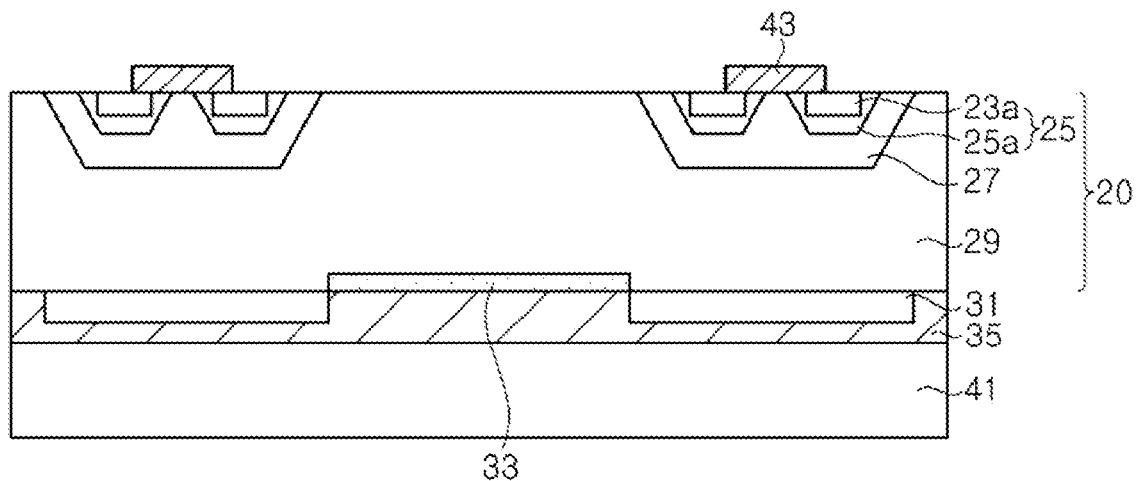

Referring to FIG. 8, source electrodes 43 may be formed on the top surface of the semiconductor structure 20. The source electrodes 43 may be formed to be electrically connected to the first semiconductor layers 25. Each of the source electrodes 43 may also be formed to be electrically connected to the semiconductor layer 27 between the pair of adjacent first semiconductor layers 25. Thus, the source electrodes 43 may be separated from the second semiconductor layer 29 by the semiconductor layers 27. The source electrodes 43 may be formed by depositing a multi-layered metal material, for example, a titanium (Ti)/nickel (Ni)/platinum (Pt)/gold (Au) layer and by patterning the multi-layered metal material using a photolithography process and an etch process or using a lift-off process.

Figure 9:
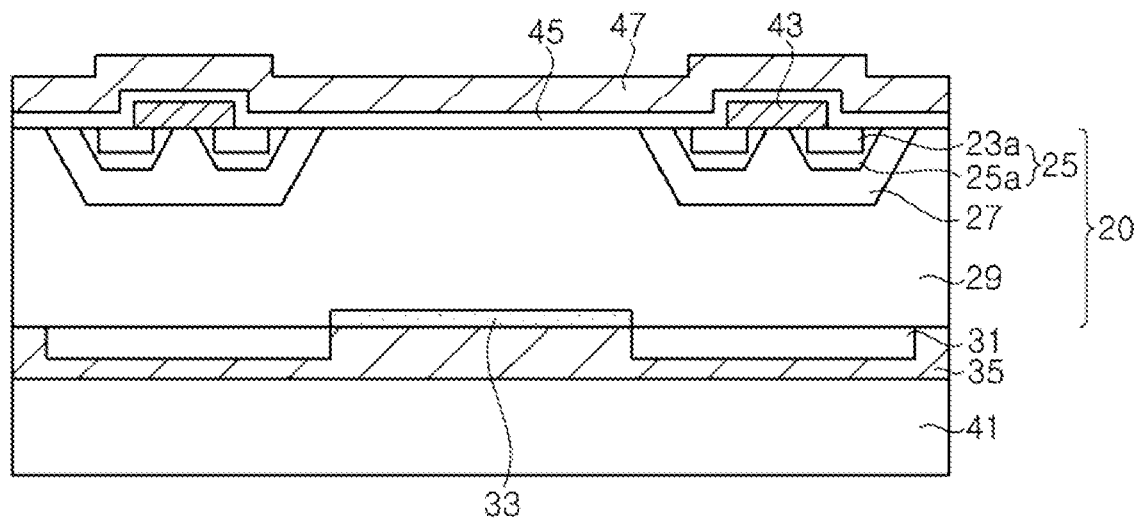

Referring to FIG. 9, a gate insulation layer 45 may be formed on the semiconductor structure 20. The gate insulation layer 45 may be formed of a silicon oxide layer or a silicon nitride layer. The gate insulation layer 45 may be formed to cover the semiconductor layers 27 and the second semiconductor layer 29 which are exposed at the top surface of the semiconductor structure 20. In addition, the gate insulation layer 45 may be formed to cover the source electrodes 43. A gate electrode 47 may be formed on the gate insulation layer 45. The gate electrode 47 may be formed to cover the semiconductor layers 27 between the first and second semiconductor layers 25 and 29. Moreover, the gate electrode 47 may be formed to extend onto the second semiconductor layer 29 exposed at the top surface of the semiconductor structure 20. The gate electrode 47 may be formed to induce an inversion channel layer at surfaces of the semiconductor layers 27 between the first and second semiconductor layers 25 and 29 when a gate voltage over a threshold voltage is applied to the gate electrode 47. Further, carriers injected or drifted into the second semiconductor layer 29 through the inversion channel layer may be uniformly distributed in the second semiconductor layer 29 between the semiconductor layers 27 because the gate electrode 47 is formed to extend onto the second semiconductor layer 29 between the semiconductor layers 27.

Figure 10:
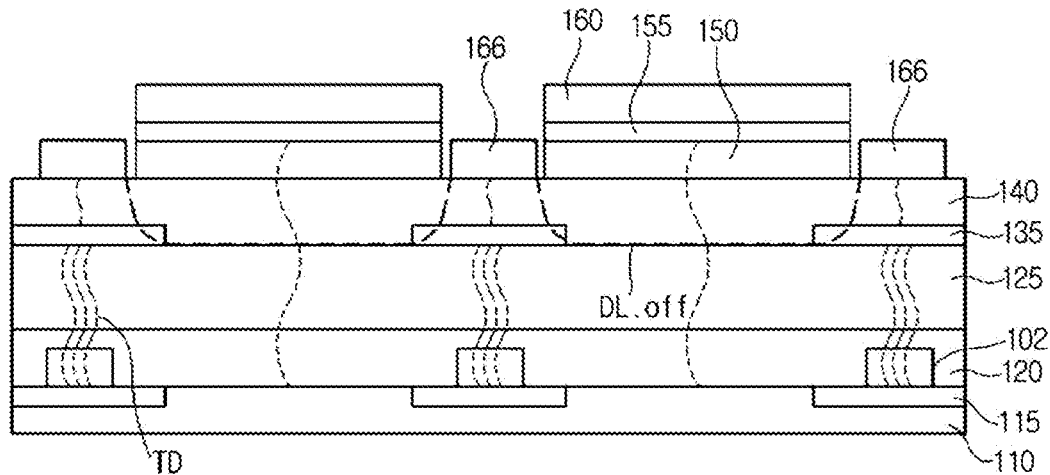
FIG. 10 is a cross-sectional view illustrating an off-state of a vertical gallium nitride transistor according to an exemplary embodiment of the present invention.
Figure 11:
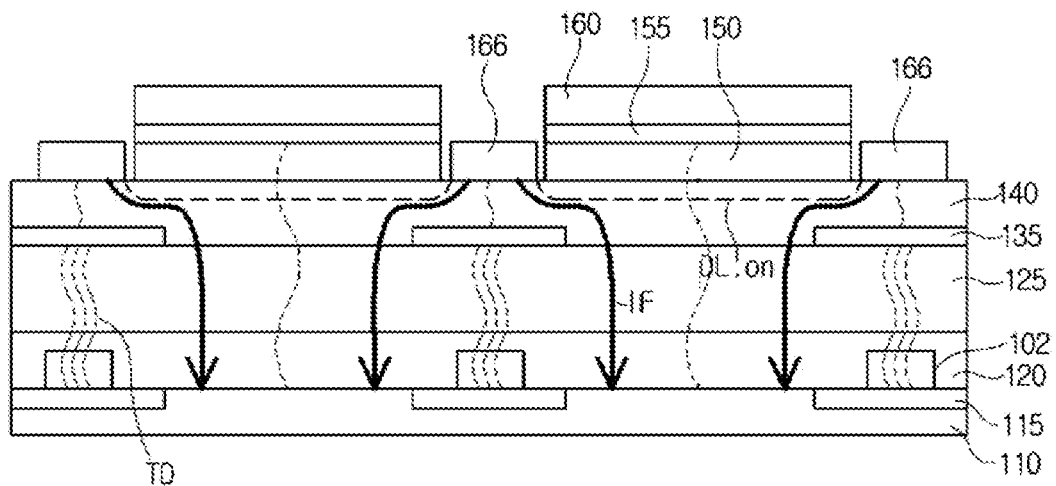
FIG. 11 is a cross-sectional view illustrating an on-state of the vertical gallium nitride transistor according to the exemplary embodiment of FIG. 10.

FIG. 10 is a cross-sectional view illustrating an off-state of a vertical gallium nitride transistor according to an exemplary embodiment of the present invention, and FIG. 11 is a cross-sectional view illustrating an on-state of the vertical gallium nitride transistor shown in FIG. 10.

Referring to FIG. 10 and FIG. 11, the vertical gallium nitride transistor may include a drain electrode 110, first semiconductor layers 120 and 125 sequentially stacked on the drain electrode 110 and doped with impurities of a first conductivity type (e.g., an N-type), a second semiconductor layer 140 stacked on the first semiconductor layer 125 and formed of an undoped semiconductor layer, source electrodes 166 stacked on the second semiconductor layer 140, third semiconductor layers 150 of a second conductivity type (e.g., a P-type) stacked on the second semiconductor layer 140, insulation layers 155 stacked on the third semiconductor layers 150, gate electrodes 160 stacked on the insulation layers 155, and blocking layers 135 disposed between the first and second semiconductor layers 125 and 140 and located under the source electrodes 166 to block vertical current paths between the source electrodes 166 and the drain electrode 110. The vertical gallium nitride transistor may further include additional blocking layers 115 that are disposed between the drain electrode 110 and the first semiconductor layer 120 to be parallel with the blocking layers 135. The blocking layers 135 and the additional blocking layers 115 may be formed of an insulating oxide layer such as a silicon oxide ($SiO_2$) layer or an insulating nitride layer such as a silicon nitride (SiN) layer. Further, the insulation layers 155 may be formed of a silicon oxide ($SiO_2$) layer. The vertical gallium nitride transistor may also include a vertical drain electrode that penetrates the first semiconductor layers 120 and 125 doped with the impurities of the first conductivity type and the second semiconductor layer 140 formed of an undoped-GaN layer to be directly or indirectly connected to the first semiconductor layer 120.

The first semiconductor layers 120 and 125 may be formed of a first gallium nitride (GaN) layer having a first band gap energy. The first semiconductor layer 120 may correspond to a GaN layer which is heavily doped with N-type impurities and the first semiconductor layer 125 may correspond to a GaN layer which is lightly doped with N-type impurities. The first semiconductor layer 120 may be formed to have a thickness of about 100 micrometers to about 500 micrometers and an impurity concentration of about $1 \times 10^{18}/cm^3$, and the first semiconductor layer 125 may be formed to have a thickness of about 2 micrometers to about 20 micrometers and an impurity concentration of about $1 \times 10^{17}/cm^3$. The second semiconductor layer 140 may be the same material layer as the first semiconductor layers 120 and 125. The second semiconductor layer 140 may be formed of an undoped GaN layer and may be formed to have a thickness of about 0.2 micrometers to about 1.0 micrometers on the blocking layers 135. In one exemplary embodiment, the second semiconductor layer 140 may be lightly doped with N-type impurities to have an impurity concentration of about $0.1 \times 10^{16}/cm^3$ to about $5 \times 10^{16}/cm^3$. The third semiconductor layer 150 may be formed of a P-type GaN layer. The third semiconductor layer 150 may be formed to have an impurity concentration of about $0.1 \times 10^{18}/cm^3$ to about $1 \times 10^{18}/cm^3$. The third semiconductor layer 150 may be doped with P-type impurities such as zinc atoms or magnesium atoms. The first, second and third semiconductor layers 120, 125, 140, and 150 may be formed using an MOCVD process, an MBE process or a hydride vapor phase epitaxy (HVPE) process. In the present exemplary embodiment, the N-type GaN layer corresponding to the first semiconductor layer 120 may be grown using seed layers 102 formed on the drain electrode 110.

As illustrated in FIG. 10, when no bias voltage is applied to the gate electrodes 160, depletion regions DL in the second semiconductor layer 140 under the third semiconductor layers 150 may be generated to reach the blocking layers 135. In such a case, the depletion regions (DL_off) may completely contact the blocking layers 135. Thus, the depletion regions DL_off and the blocking layers 135 may block all the current paths between the source electrodes 166 and the drain electrode 110. As a result, the vertical GaN transistor may be normally turned off.

Since the first semiconductor layers 120 and 125 are formed of N-type GaN layers, threading defects (TD) may be upwardly generated from the seed layers 102 due to strain. In addition, since the semiconductor layers 120, 125, and 140 are grown on the seed layers 102, the threading defects (TD) may also be generated at interface regions between the seed layers 102. Moreover, when the semiconductor layers 120, 125, and 140 are grown on a sapphire substrate, the threading defects (TD) may be generated in the semiconductor layers 120, 125, and 140 due to a lattice constant difference between the semiconductor layers (i.e., GaN layers) and the sapphire substrate. That is, the threading defects (TD) may be formed due to defects generated at interfaces between grains of the GaN layers because crystallographic properties of the GaN grains grown from the seed layers 102 are different from each other.

In general, the threading defects (TD) may cause a leakage current. However, according to the present exemplary embodiment, the depletion regions DL_off may act as current blocking layers (CBL). Thus, even though the threading defects (TD) are formed in the semiconductor layers 120, 125, and 140, the blocking layers 135 and the depletion regions DL_off contacting the blocking layers 135 may prevent leakage currents between the source electrodes 166 and the drain electrode 110 from flowing. Therefore, the vertical GaN transistor may have a normally-off characteristic. Under the blocking layers 135, the first semiconductor layers 120 and 125, which are formed of N-type GaN layers using am epitaxial lateral overgrowth (ELO) technique, may be disposed. The first semiconductor layer 125 having the threading dislocations (TD) may be completely covered with the blocking layers 135 and the depletion regions DL_off acting as current blocking layers. That is, the blocking layers 135 may block the leakage currents that flow through the first semiconductor layers 120 and 125 having a relatively high density of the threading dislocations (TD) upwardly grown from the seed layers 102, and the depletion regions DL_off may block the leakage currents that flow through the first semiconductor layers 120 and 125 having a relatively low density of the threading dislocations (TD) generated at interface regions between the seed layers 102. Further, the depletion regions DL may have a relatively low density due to the threading dislocations (TD) because the second semiconductor layer 140 in the depletion regions DL is located between the seed layers 102. Thus, the vertical GaN transistor may exhibit a high drain breakdown voltage.

As illustrated in FIG. 11, if a positive voltage is applied to the gate electrode 160, a forward bias is applied between the second and third semiconductor layers 140 and 150 to reduce a thickness of the depletion region DL. In such a case, the depletion regions (DL_on) may be separated from the blocking layers 135. Thus, if a drain voltage is applied between the drain electrode 110 and the source electrodes 166, an on-current (i.e., a drain current) may flow through the second semiconductor layer 140 between the depletion regions DL_on and the blocking layers 135 along current paths IF.

In order that the vertical GaN transistor operates at an off state or an on state, the first to third semiconductor layers 120, 125, 140 and 150 may have appropriate impurity concentrations and appropriate thicknesses, as described above. In particular, the second semiconductor layer 140 (i.e., undoped GaN layer) acting as a channel modulation layer may be formed to a thickness of about 0.2 micrometers to about 1.0 micrometers to induce the depletion regions DL.

FIGS. 12 to 27 are cross-sectional views illustrating a method of fabricating a vertical gallium nitride transistor shown in FIG. 10 and FIG. 11. The method of fabricating the vertical gallium nitride transistor may include a first step of forming seed patterns 102 of a first conductivity type on a first substrate 101, a second step of growing the seed patterns 102 to sequentially form first semiconductor layers 120 and 125 doped with impurities of a first conductivity type (e.g., an N-type), a third step of forming blocking layers 135 on the first semiconductor layer 125 to face respective ones of the seed patterns 102, a fourth step of forming second semiconductor layers 140 having an intrinsic property on respective exposed portions of the first semiconductor layer 125, a fifth step of forming a third semiconductor layer 150 (e.g., a GaN layer) of a second conductivity type (e.g., a P-type) on the blocking layers 135 and the second semiconductor layers 140, a sixth step of forming an insulation layer 155 on the third semiconductor layer 150, a seventh step of forming gate electrodes 160 disposed on the insulation layer 155 and source electrodes 166 disposed between the gate electrodes 160, an eighth step of attaching a second substrate 109 to a surface of the resultant opposite to the first substrate 101, a ninth step of removing the first substrate 101, and a tenth step of forming a drain electrode 110 on a surface of the resultant opposite to the second substrate 109.

Figure 12:
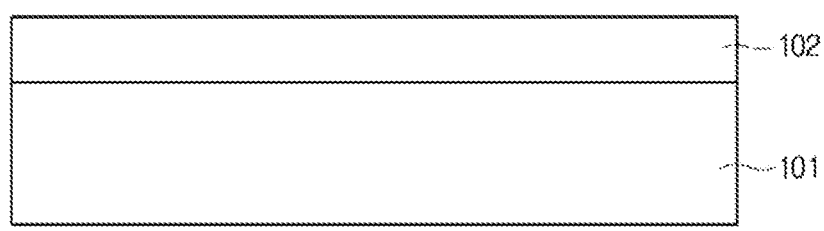
Figure 13:
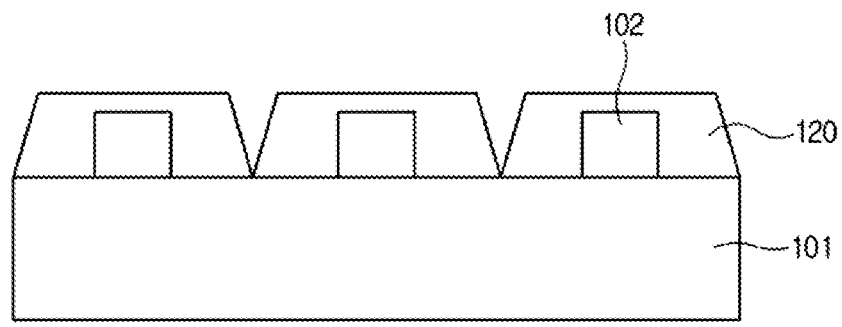

In the step of forming the seed patterns 102, any substrate, which is capable of growing a semiconductor layer, may be suitable for the first substrate 101. For example, the first substrate 101 may be a sapphire substrate. The seed patterns 102 may be formed of an undoped GaN layer having an excellent adhesion to the first substrate 101. As illustrated in FIG. 12, the seed patterns 102 may be formed by forming a GaN layer on the first substrate 101 and by patterning the GaN layer using an etch process to form GaN patterns (see "102" of FIG. 3). In such a case, the GaN layer may be formed to a thickness of about 1 micrometer to about 2 micrometers. Referring to FIG. 13, a GaN layer heavily doped with N-type impurities may be grown on the seed layer 102 to form a first semiconductor layer 120. The first semiconductor layer 120 may be formed using an MOCVD process, an MBE process or a HVPE process.

Figure 14:
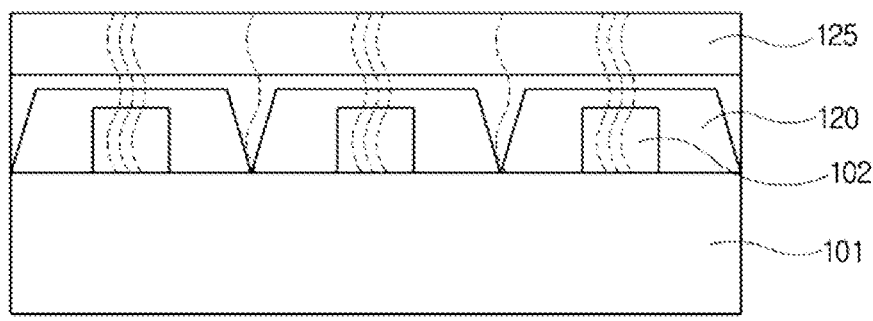

Referring to FIG. 14, a GaN layer lightly doped with N-type impurities may be grown on the first semiconductor layer 120 to form a first semiconductor layer 125. That is, the steps of forming the first semiconductor layers 120 and 125 may include a step of growing the seed patterns 102 to form the first semiconductor layer 120 and a step of forming the first semiconductor layer 125 on the first semiconductor layer 120. Thus, the first semiconductor layers 120 and 125 may be formed to include a lower GaN layer 120 heavily doped with N-type impurities and an upper GaN layer 125 lightly doped with N-type impurities which are sequentially stacked on the first substrate 101. While the lower GaN layer 120 and the upper GaN layer 125 are formed, threading dislocations (TD) (dotted line) may be upwardly grown from the seed patterns 102 due to strains. A density of the threading dislocations (TD) may be increased as additional growth processes are performed in subsequent steps.

Figure 15:
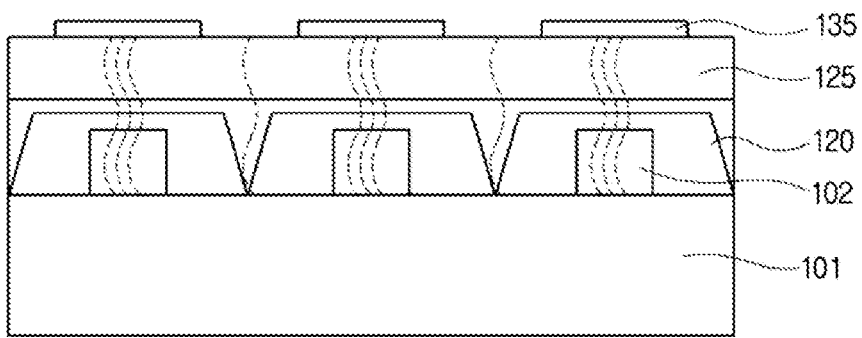

Referring to FIG. 15, the blocking layers 135 may be formed on the upper GaN layer 125 to face respective ones of the seed patterns 102. Each of the blocking layers 135 may be formed of an insulation layer having a width which is greater than a width of each seed pattern 102. The blocking layers 135 may be formed by forming an oxide layer or a nitride layer on the upper GaN layer 125 using an inductively coupled plasma chemical vapor deposition (ICP-CVD) process and by patterning the oxide layer or the nitride layer.

Figure 16:
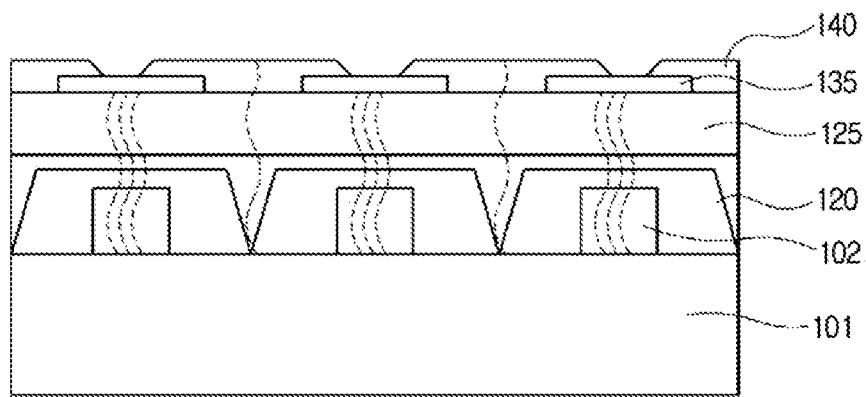

Referring to FIG. 16, the second semiconductor layer 140 may be formed of an undoped GaN layer. The second semiconductor layers 140 may be formed to cover edges of the blocking layers 135. Alternatively, the second semiconductor layers 140 may be formed to cover entire surfaces of the blocking layers 135. In such a case, the second semiconductor layers 140 may contact each other to constitute a single layer.

Figure 17:
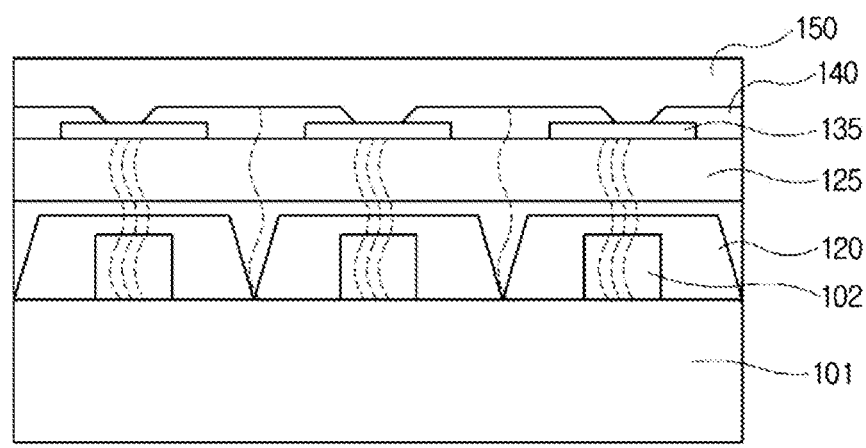

Referring to FIG. 17, the third semiconductor layer 150 may be formed of a P-type GaN layer on entire surfaces of the blocking layers 135 and the second semiconductor layers 140.

Figure 18:
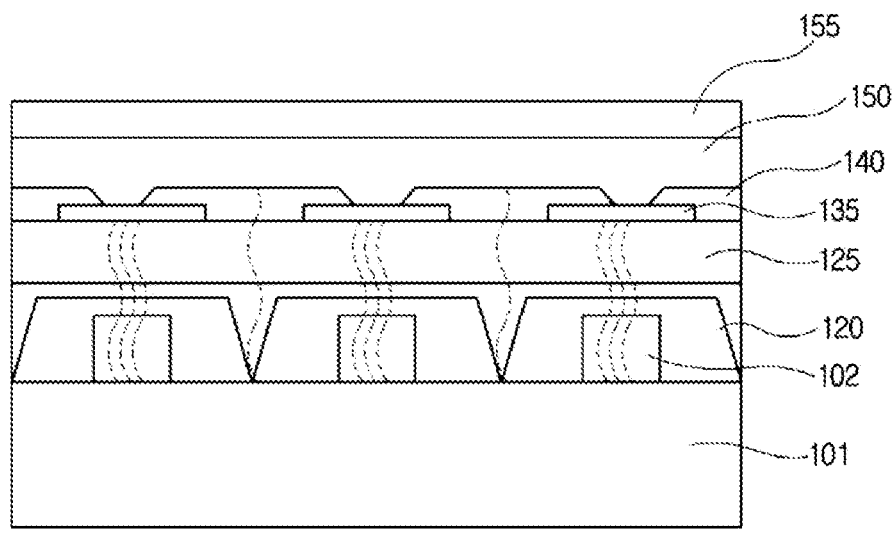

Referring to FIG. 18, the insulation layer 155 may be formed on the third semiconductor layer 150, for example, the P-type GaN layer.

Figure 19:
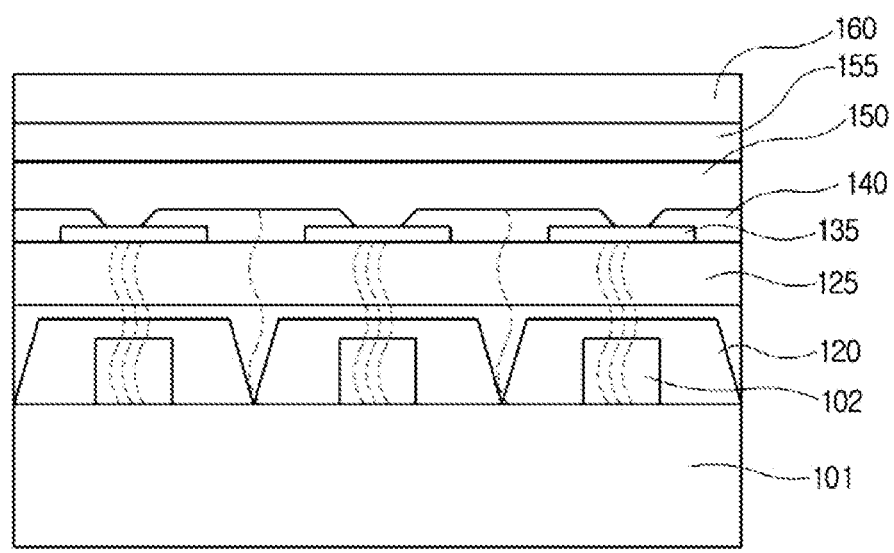
Figure 20:
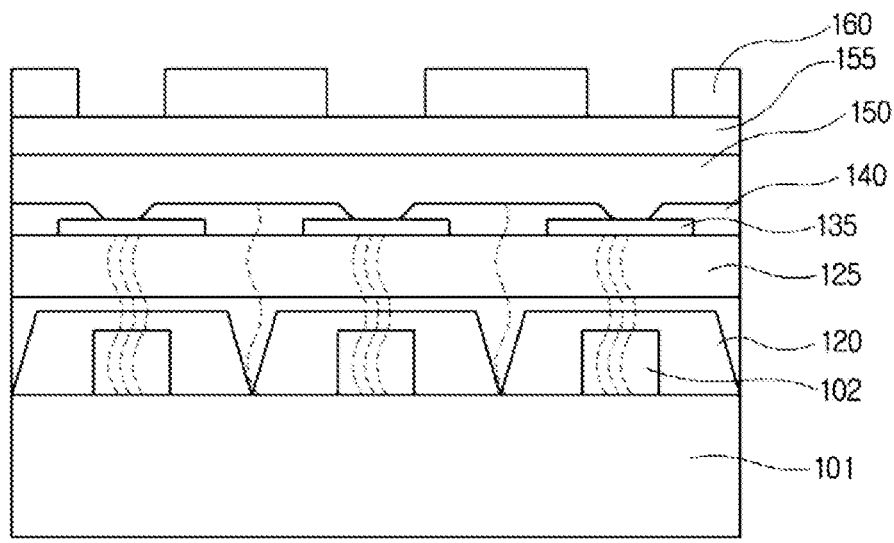
Figure 21:
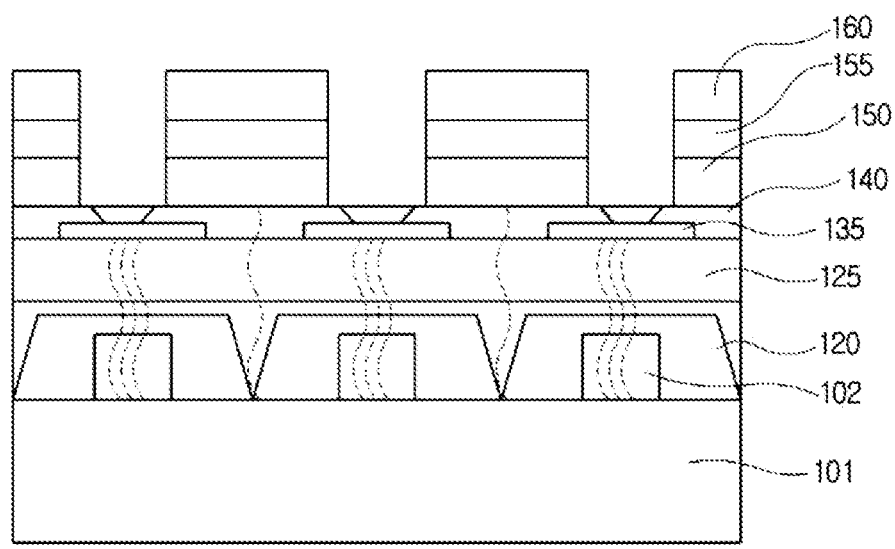
Figure 22:
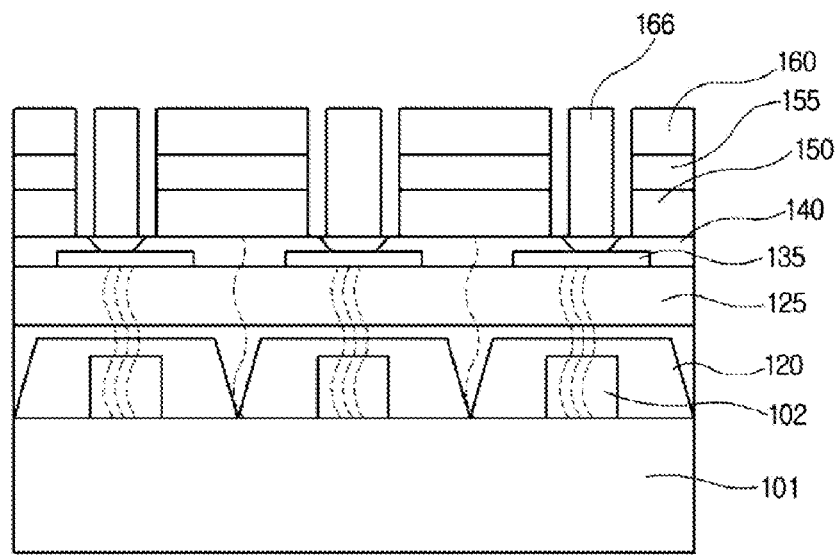
Figure 23:
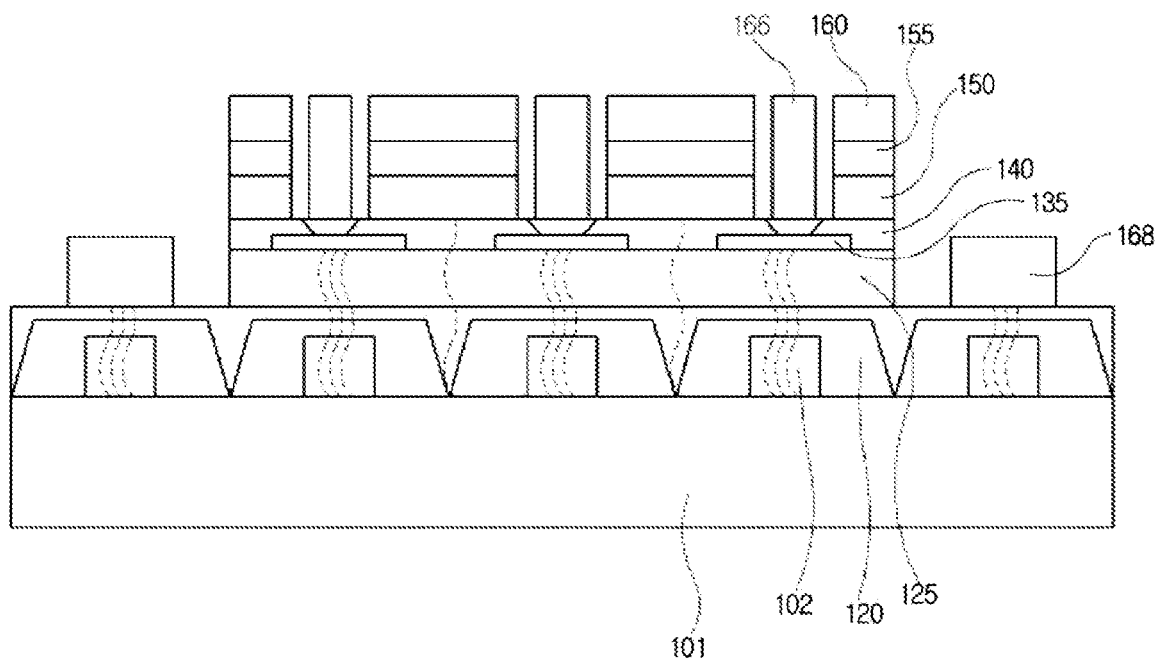
Figure 24A:
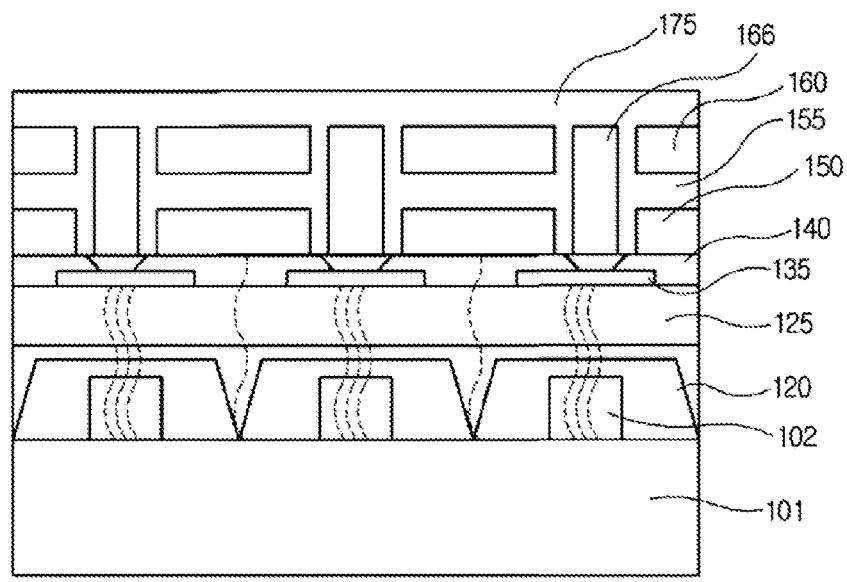

Referring to FIGS. 19 to 24A, the step of forming the source electrodes 166 and the gate electrodes 160 may include a step of forming a metal layer 160 on the insulation layer 155 as illustrated in FIG. 19, a step of patterning the metal layer 160 to form the gate electrodes 160 as illustrated in FIG. 20, a step of patterning the insulation layer 155 and the P-type GaN layer 150 to form openings that expose portions of the second semiconductor layer 140 on the blocking layers 135 as illustrated in FIG. 21, a step of forming the source electrodes 166 composed of a metal layer in the openings as illustrated in FIG. 22, and a step of forming a passivation layer 175 that fills spaces between the source electrodes 166 and the gate electrodes 160 and covers the source electrodes 166 and the gate electrodes 160 as illustrated in FIG. 24A. The passivation layer 175 may include an oxide insulation layer and a nitride insulation layer. The source electrodes 166 may be formed to be electrically isolated from the gate electrodes 160. Thus, the source electrodes 166 may be formed by depositing an insulation layer on the substrate including the openings, patterning or etching the insulation layer to expose portions of the second semiconductor layer 140 on the blocking layers 135, and forming a metal layer contacting the exposed portions of the second semiconductor layer 140. Alternatively, the source electrodes 166 may be formed by forming a metal layer that fills the openings and by patterning or etching the metal layer.

Figure 24B:
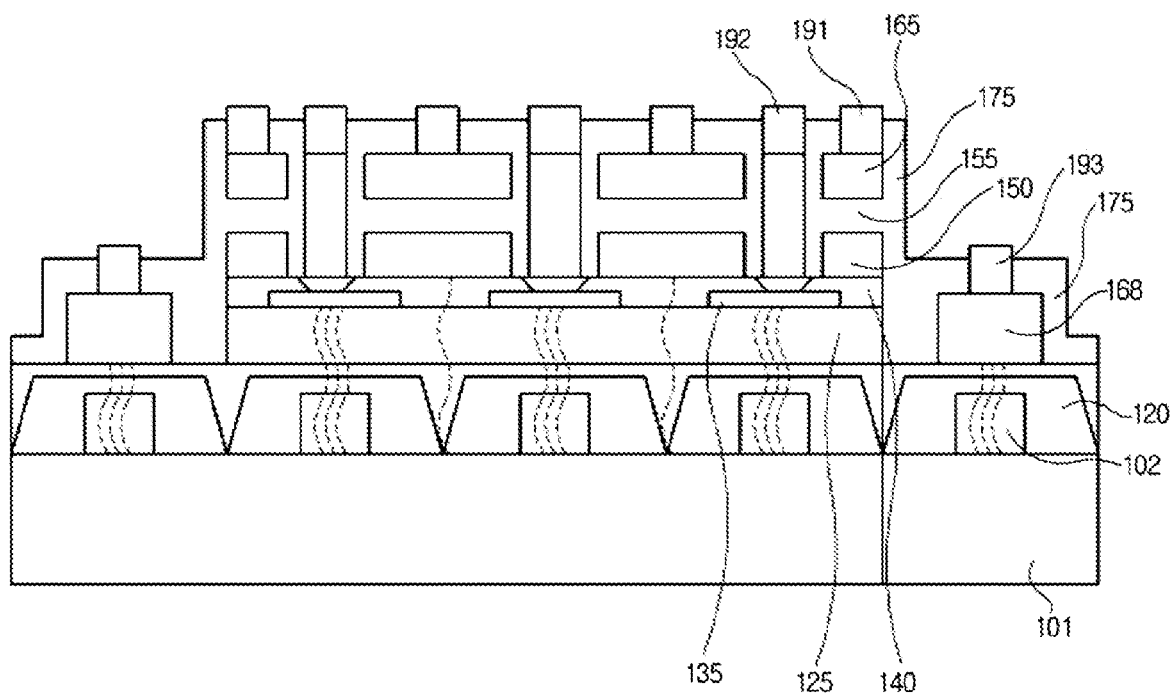

FIG. 23 and FIG. 24B illustrate a method of fabricating a vertical GaN transistor according to one exemplary embodiment of the present invention. The vertical GaN transistor may include a drain electrode 168, and the drain electrode 168 may be formed to be electrically isolated from the other electrodes (e.g., the gate electrodes 160 and the source electrodes 166). Referring to FIG. 23, the drain electrode 168 may be formed on the first semiconductor layer 120 to face at least one of the seed patterns 102. Thus, the threading dislocations (TD) generated on the seed pattern 102 may provide current paths between the drain electrode 168 and the seed pattern 102. Referring to FIG. 24B, a passivation layer 175 may be formed to cover the source electrodes 166, the gate electrodes 160, and the drain electrode 168. The passivation layer 175 may then be patterned to form contact holes that expose the source electrodes 166, the gate electrodes 160, and the drain electrode 168. Interconnection lines 191, 192, and 193 may be formed on the passivation layer 175 in the contact holes. The interconnection lines 191, 192, and 193 may be electrically connected to the source electrodes 166, the gate electrodes 160, and the drain electrode 168 through the contact holes.

Figure 25:
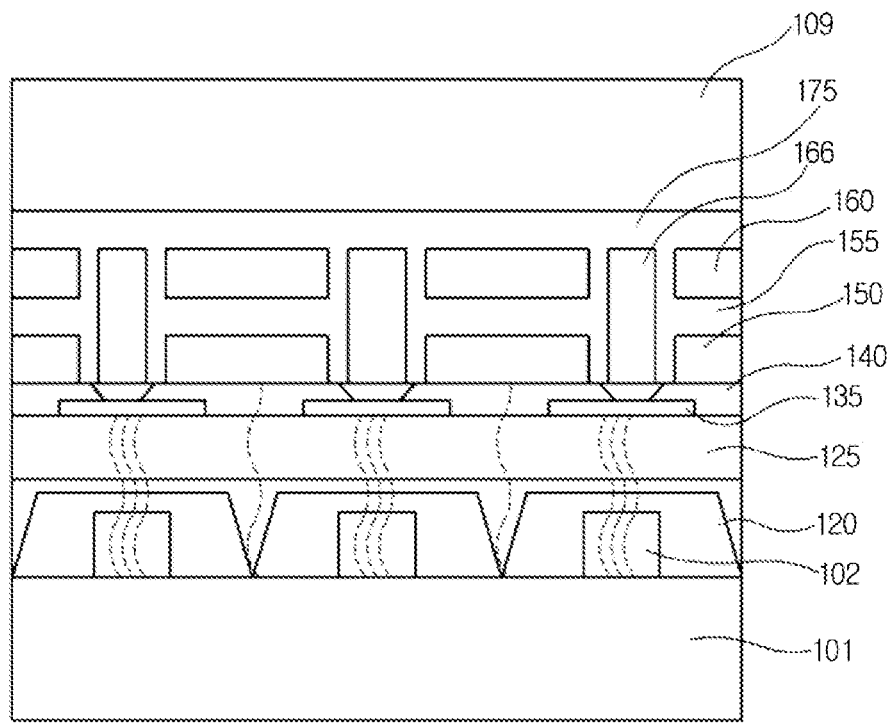
Figure 26:
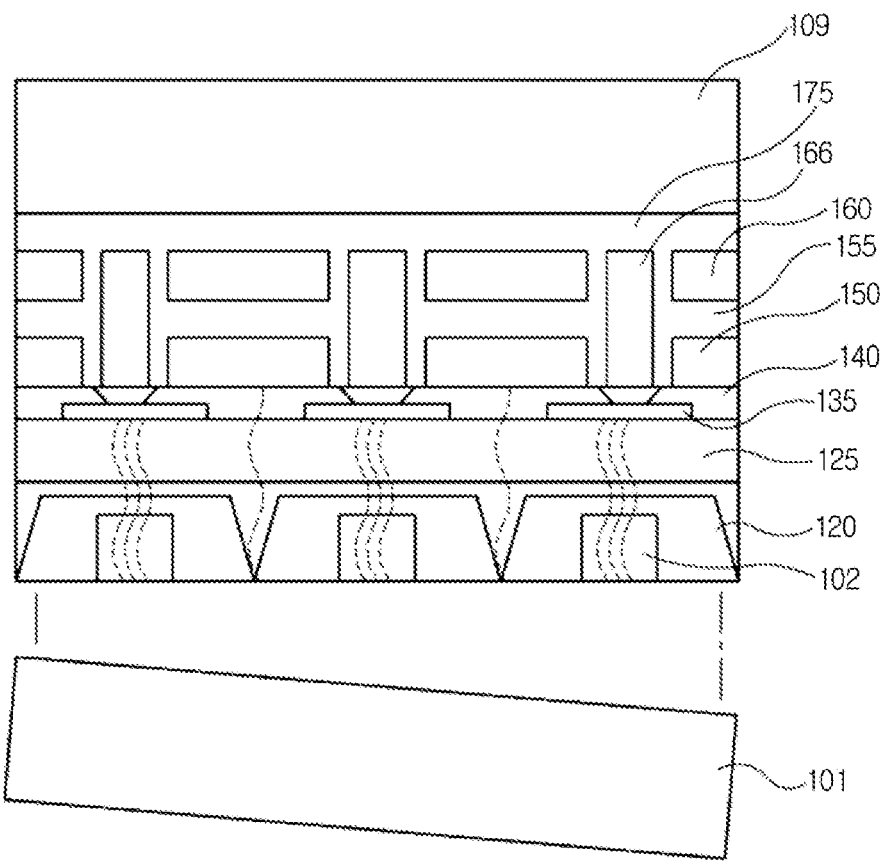
Figure 27:
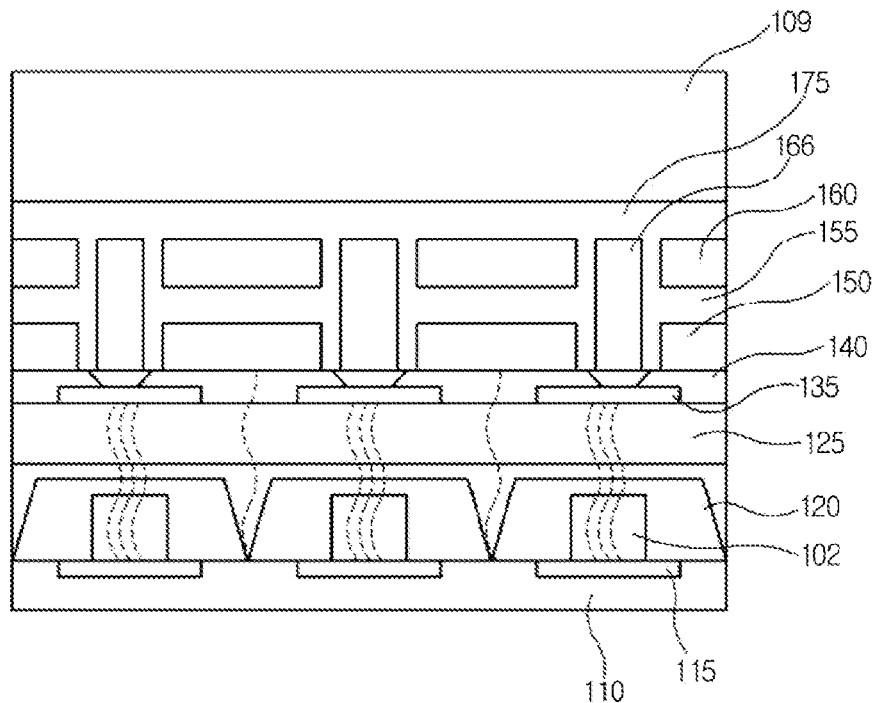

Returning again to the previous exemplary embodiment, as illustrated in FIG. 25, the second substrate 109 may be attached to a surface of the passivation layer 175 opposite to the first substrate 101. Referring to FIG. 26, the first substrate 101 may be detached from the first semiconductor layers 120 and 125. The first substrate 101 may be detached using a laser lift-off process. The second substrate 109 may be a conductive substrate or an insulation substrate. For example, the second substrate 109 may be a silicon (Si) substrate, an aluminum nitride (AlN) substrate, an aluminum silicide (AlSi) substrate or a copper (Cu) substrate. After the first substrate 101 is removed, additional blocking layers 115 may be formed on respective ones of the seed patterns 102 and a metal layer acting as the drain electrode 110 may be formed to cover the additional blocking layers 115 and the first semiconductor layer 120 as illustrated in FIG. 27. The additional blocking layers 115 may be formed of the same material as the blocking layers 135. Further, the additional blocking layers 115 may be formed to have substantially the same width as the blocking layers 135. At least one electrode group of the drain electrodes 110 and 168, the gate electrodes 160 and the source electrodes 166 may be formed to include at least one of titanium (Ti), aluminum (Al), nickel (Ni), gold (Au), platinum (Pt), and molybdenum (Mo). Alternatively, after the drain electrodes 110 and 168, the gate electrodes 160 or the source electrodes 166 are formed, an annealing process may be performed.

Figure 28:
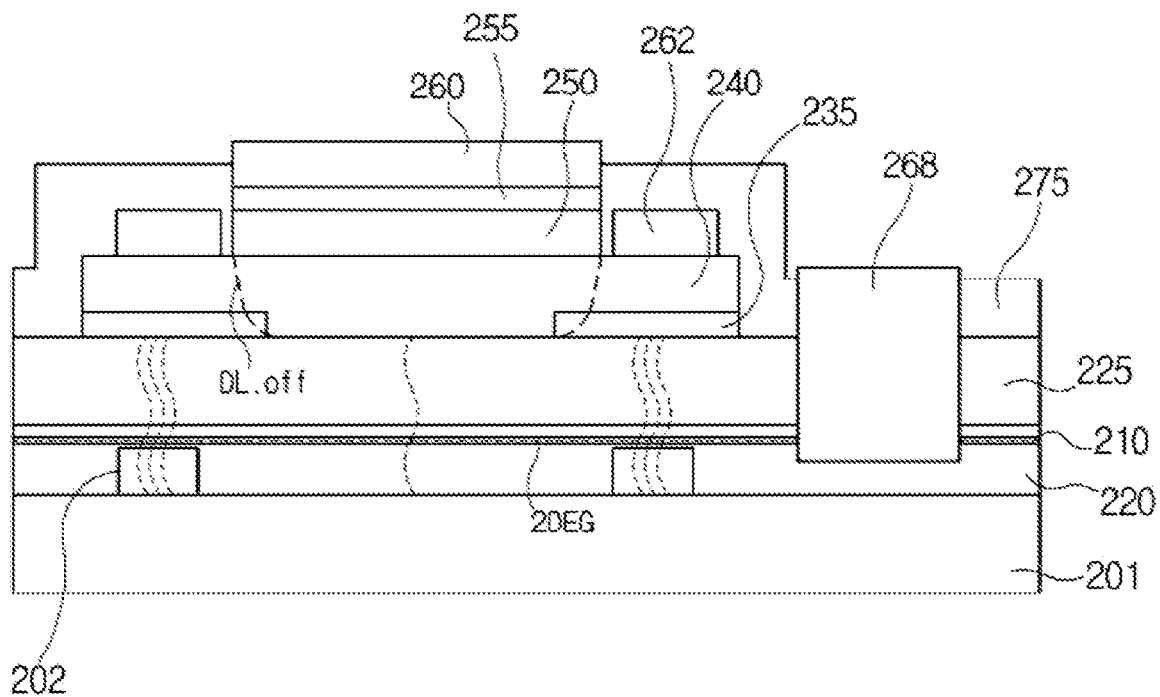
FIG. 28 is a cross-sectional view illustrating an off-state of a vertical gallium nitride transistor according to an exemplary embodiment of the present invention.
Figure 29:
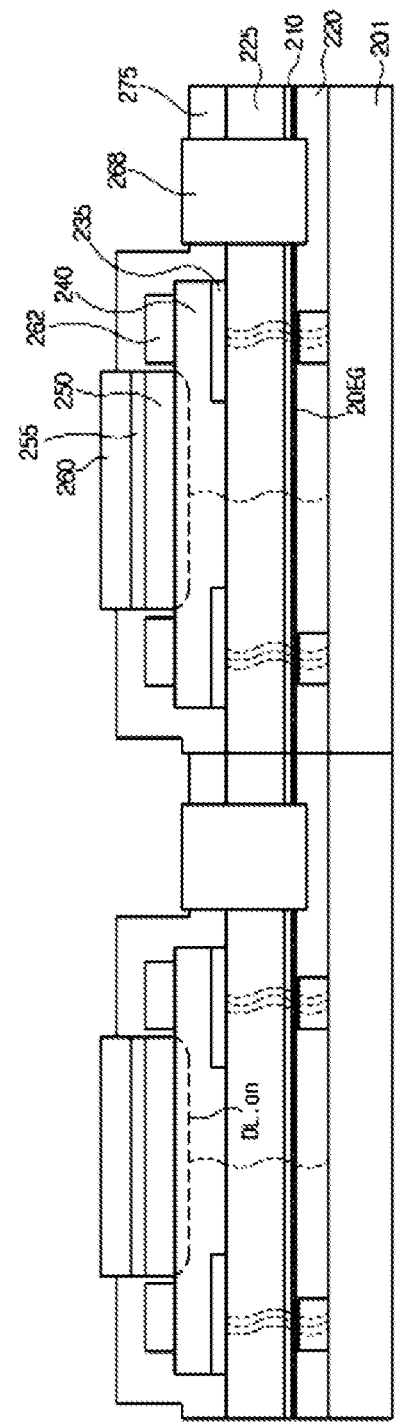
FIG. 29 is a cross-sectional view illustrating an on-state of the vertical gallium nitride transistor according to the exemplary embodiment of FIG. 28.

FIG. 28 is a cross-sectional view illustrating an off-state of a vertical gallium nitride transistor according to an exemplary embodiment of the present invention, and FIG. 29 is a cross-sectional view illustrating an on-state of the vertical gallium nitride transistor shown in FIG. 28. According to the present exemplary embodiment, a channel layer between a pair of first semiconductor layers may be formed of an indium gallium nitride (InGaN) layer that is suitable for generation of a two-dimension electron gas (2DEG), and a drain electrode may penetrate an upper layer of the pair of first semiconductor layers to contact the channel layer. Thus, the drain electrode may be formed even without using a lift-off process for removing a first substrate.

As illustrated in FIG. 28, a pair of first semiconductor layers 220 and 225 may be sequentially stacked. The first semiconductor layers 220 and 225 may be formed of a nitrified semiconductor layer doped with impurities of a first conductivity type (e.g., an N-type). The first semiconductor layers 220 and 225 may have a first band gap energy. A channel layer 210 may be disposed between the first semiconductor layers 220 and 225. The channel layer 210 may be formed of a nitrified semiconductor layer having a second band gap energy. The first band gap energy may be different from the second band gap energy. A second semiconductor layer 240 may be disposed on an upper layer 225 of the first semiconductor layers 220 and 225. The second semiconductor layer 240 may be formed of an undoped GaN layer. Source electrodes 262 and a third semiconductor layer 250 may be disposed on the second semiconductor layer 240. The third semiconductor layer 250 may be formed of a GaN layer doped with impurities of a second conductivity type (e.g., a P-type). An insulation layer 255 may be disposed on the third semiconductor layer 250. A gate electrode 260 may be disposed on the insulation layer 255. Blocking layers 235 may be disposed between the first semiconductor layer 225 and the second semiconductor layer 240. The blocking layers 235 may be located between source electrodes 262 and the channel layer 210. Thus, the blocking layers 235 may block vertical current paths between the source electrodes 262 and the channel layer 210.

The vertical GaN transistor according to the present exemplary embodiment may further include a drain electrode 268 that penetrates the first semiconductor layer 225 to contact the channel layer 210. That is, in the present exemplary embodiment, the drain electrode 268 may directly contact the two dimension electron gas (2DEG). When the channel layer 210 is a GaN layer, the two dimension electron gas (2DEG) region may be formed in the channel layer 210 because of an electric field which is generated by spontaneous polarization due to Wurtzite structure of the GaN layer and by piezoelectric polarization due to a lattice constant difference between the channel layer 210 and the first semiconductor layer 220 and 225. Thus, electron mobility in the channel layer 210 may increase. That is, the channel layer 210 may be formed of a material having a band gap energy that is different from that of the first semiconductor layers 220 and 225. If the first semiconductor layers 220 and 225 are formed of a GaN layer and the channel layer 210 is formed of an InGaN layer having a band gap energy which is less than that of the GaN layer, the two dimension electron gas (2DEG) regions may be formed in the vicinity of interfaces of the channel layer 210 having a relatively low band gap energy. These two dimension electron gas (2DEG) regions may provide the drain electrode 268 with improved electron mobility.

The first semiconductor layer 220 may be a GaN layer heavily doped with N-type impurities and the first semiconductor layer 225 may be a GaN layer lightly doped with N-type impurities. The first semiconductor layer 220 formed of an N-type GaN layer with a high impurity concentration may include seed patterns 202 therein. The first semiconductor layer 220 may be disposed on a substrate 201. The drain electrode 268 may be formed to contact the channel layer 210. Thus, the drain electrode 268 may be formed even without using a lift-off process for removing the substrate 201. As a result, the substrate 201 may be continuously attached to the vertical GaN transistor.

As illustrated in FIG. 28, when no bias voltage is applied to the gate electrodes 260, depletion regions DL in the second semiconductor layer 240 under the third semiconductor layers 250 may be generated to reach the blocking layers 235. In such a case, the depletion regions (DL_off) may completely contact the blocking layers 235. Thus, the depletion regions DL_off and the blocking layers 235 may block all the current paths between the source electrodes 262 and the channel layer 210. As a result, the vertical GaN transistor may be normally turned off. That is, the vertical GaN transistor may exhibit a normally-off characteristic. Meanwhile, as illustrated in FIG. 29, if a positive voltage is applied to the gate electrode 260, a forward bias is applied between the second and third semiconductor layers 240 and 250 to reduce a width of the depletion region DL. In such a case, the depletion regions (see DL_on) may be separated from the blocking layers 235. Thus, if a drain voltage is applied between the drain electrode 268 and the source electrodes 262, an on-current (i.e., a drain current) may flow through the second semiconductor layer 240 between the depletion regions DL_on and the blocking layers 235. In order that the vertical GaN transistor operates at an off state or an on state, the first to third semiconductor layers 220, 225, 240, and 250 may have the same configurations (e.g., the same impurity concentrations and the same thicknesses) as the first to third semiconductor layers 120, 125, 140, and 150 described with reference to FIG. 10 and FIG. 11. In particular, the second semiconductor layer 240 (i.e., undoped GaN layer) acting as a channel modulation layer may be formed to a thickness of about 0.2 micrometers to about 1.0 micrometers to induce the depletion regions DL.

Figure 30:
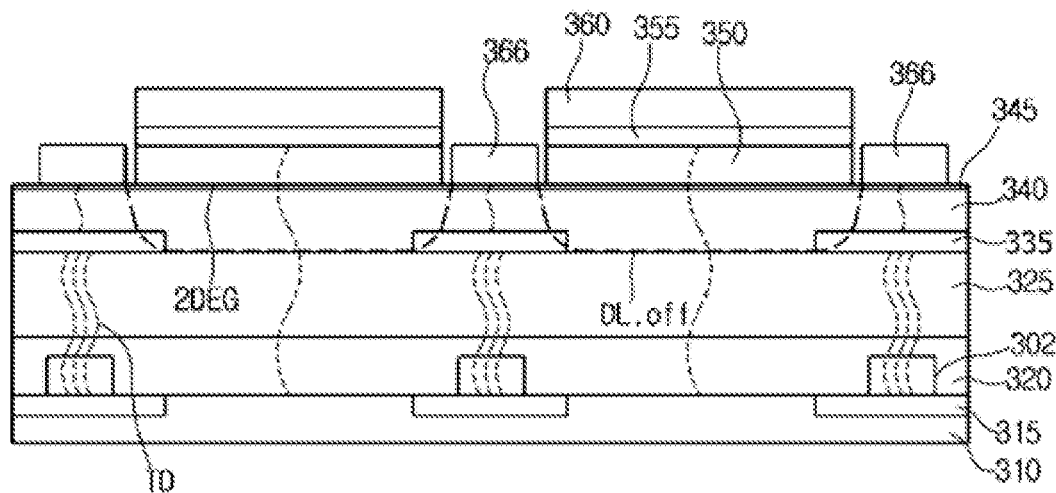
FIG. 30 is a cross-sectional view illustrating an off-state of a vertical gallium nitride transistor according to an exemplary embodiment of the present invention.
Figure 31:
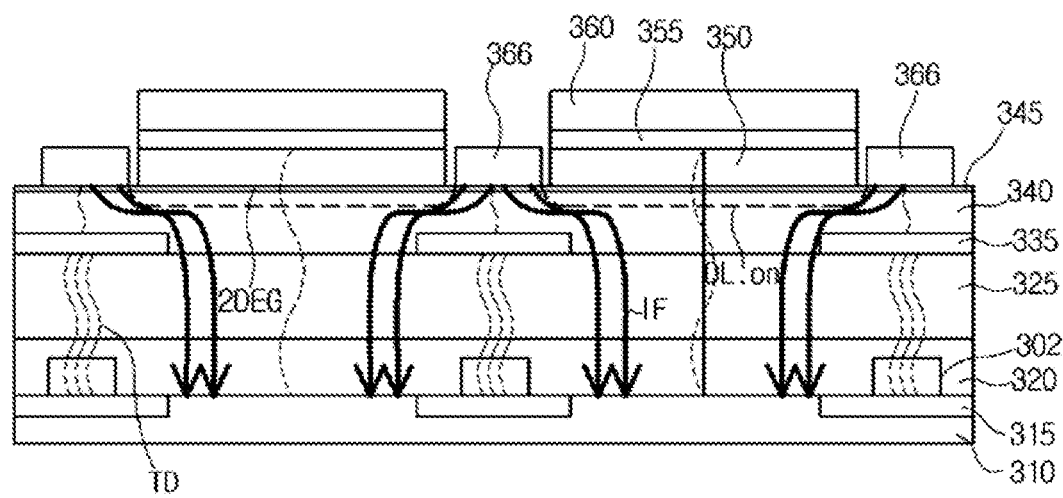
FIG. 31 is a cross-sectional view illustrating an on-state of the vertical gallium nitride transistor according to the exemplary embodiment of FIG. 30.

FIG. 30 is a cross-sectional view illustrating an off-state of a vertical GaN transistor according to an exemplary embodiment of the present invention, and FIG. 31 is a cross-sectional view illustrating an on-state of the vertical GaN transistor shown in FIG. 30. A difference between the present exemplary embodiment and the previous exemplary embodiments is that a barrier layer formed of an aluminum gallium nitride (AlGaN) layer is disposed at a junction interface between a second semiconductor layer and a third semiconductor layer. Thus, in a method of fabricating the vertical GaN transistor, the present exemplary embodiment may be substantially the same as the previous exemplary embodiment described with reference to FIGS. 10 to 27 except the additional step of forming the barrier layer. Accordingly, to avoid duplicate explanation, differences between the present exemplary embodiment and the previous exemplary embodiment illustrated in FIGS. 10 to 27 will be mainly described hereinafter.

Referring to FIGS. 30 and 31, the vertical gallium nitride transistor may include a drain electrode 310, first semiconductor layers 320 and 325 sequentially stacked on the drain electrode 310 and doped with impurities of a first conductivity type (e.g., an N-type), a second semiconductor layer 340 stacked on the first semiconductor layer 325 and formed of an undoped GaN layer, source electrodes 366 stacked on the second semiconductor layer 340, third semiconductor layers 350 of a second conductivity type (e.g., P-type GaN layers) stacked on the second semiconductor layer 340, insulation layers 355 stacked on the third semiconductor layers 350, gate electrodes 360 stacked on the insulation layers 355, and blocking layers 335 disposed between the first and second semiconductor layers 325 and 340 and located under the source electrodes 366 to block vertical current paths between the source electrodes 366 and the drain electrode 310. The vertical gallium nitride transistor may further include additional blocking layers 315 that are disposed between the drain electrode 310 and the first semiconductor layer 320 to be parallel with the blocking layers 335. The vertical GaN transistor may further include a barrier layer 345 disposed between the second and third semiconductor layers 340 and 350. The barrier layer may extend to be disposed between the source electrodes 366 and the second semiconductor layer 340. Although not shown in the drawings, the vertical gallium nitride transistor may also include a vertical drain electrode that penetrates the first and second semiconductor layers 320, 325, and 340 to be directly or indirectly connected to the first semiconductor layer 320.

The barrier layer 345 may be formed of a semiconductor layer having a band gap energy which is different from that of the second semiconductor layer 340. For example, when the second semiconductor layer 340 is formed of a GaN layer, the barrier layer 345 may be formed of an AlGaN layer having a band gap energy which is greater than that of the GaN layer. In such a case, two dimension electron gas (2DEG) regions may be formed in the second semiconductor layer 340 having a relatively low band gap energy and in the vicinity of an interface of the second semiconductor layer 340. In addition, a drain breakdown voltage of the vertical GaN transistor may be improved because of the presence of the barrier layer 345 having a super-lattice structure between the source electrodes 366 and the drain electrode 310. The first semiconductor layer 320 may correspond to a GaN layer which is heavily doped with N-type impurities and the first semiconductor layer 325 may correspond to a GaN layer which is lightly doped with N-type impurities. The first semiconductor layer 320 may include seed patterns 302 which are used to grow the semiconductor layers 320, 325, and 340.

As illustrated in FIG. 30, when no bias voltage is applied to the gate electrodes 360, depletion regions DL in the second semiconductor layer 340 under the third semiconductor layers 350 may be generated to reach the blocking layers 335. In such a case, the depletion regions (DL_off) may completely contact the blocking layers 335. Thus, the depletion regions DL_off and the blocking layers 335 may block all the current paths between the source electrodes 366 and the drain electrode 310. As a result, the vertical GaN transistor may be normally turned off. That is, the vertical GaN transistor may exhibit a normally-off characteristic.

As illustrated in FIG. 31, if a positive voltage is applied to the gate electrode 360, a forward bias is applied between the second and third semiconductor layers 340 and 350 to reduce a width of the depletion region DL. In such a case, the depletion regions (DL_on) may be separated from the blocking layers 335. Thus, if a drain voltage is applied between the drain electrode 310 and the source electrodes 366, an on-current (i.e., a drain current) may flow through the second semiconductor layer 340 between the depletion regions DL_on and the blocking layers 335 along current paths IF. In addition, if a positive voltage is applied to the gate electrode 360, two dimension electron gas (2DEG) regions may be formed in the vicinity of a top surface of the second semiconductor layer 340. The two dimension electron gas (2DEG) regions may be formed due to the presence of the barrier layer 345. The two dimension electron gas (2DEG) regions may improve the current flow between the source electrodes 366 and the drain electrode 310. That is, the barrier layer 345 may increase electron mobility by forming the two dimension electron gas (2DEG) regions having a high concentration in the second semiconductor layer 340. The two dimension electron gas (2DEG) regions may be formed by an electric field which is generated by spontaneous polarization due to Wurtzite structure of the GaN layer and piezoelectric polarization due to a lattice constant difference between the second semiconductor layer 340 (i.e., an undoped GaN layer) and the barrier layer 345 (i.e., an AlGaN layer).

The barrier layer 345 may be formed to have a thickness of about 10 nanometers to about 100 nanometers to form the two dimension electron gas (2DEG) regions. For example, when the barrier layer 345 is an $Al_{0.26}Ga_{0.7}N$ layer, the barrier layer 345 may be formed to a thickness of about 20 nanometers. In order that the vertical GaN transistor operates at an off state or an on state, the first to third semiconductor layers 320, 325, 340, and 350 may have the same impurity concentrations and thicknesses as described with reference to FIGS. 10 and 11. In particular, the second semiconductor layer 340 (i.e., undoped GaN layer) acting as a channel modulation layer may be formed to a thickness of about 0.2 micrometers to about 1.0 micrometers to induce the depletion regions DL.

FIGS. 32 to 46 are cross-sectional views illustrating a method of fabricating a vertical gallium nitride transistor shown in FIGS. 30 and 31. The method of fabricating the vertical gallium nitride transistor may include a step of forming seed patterns 302 of a first conductivity type on a first substrate 301, a step of growing the seed patterns 302 to sequentially form first semiconductor layers 320 and 325 doped with impurities of the first conductivity type (e.g., an N-type), a step of forming blocking layers 335 on the first semiconductor layer 325 to face respective ones of the seed patterns 302, a step of forming second semiconductor layers 340 (e.g., undoped GaN layers) on respective exposed portions of the first semiconductor layer 325, a step of forming a barrier layer 345 on the blocking layers 335 and the second semiconductor layers 340, a step of forming a third semiconductor layer 350 of a second conductivity type (e.g., a P-type GaN layer) on the barrier layer 345, a step of forming an insulation layer 355 on the third semiconductor layer 350, a step of forming gate electrodes 360 disposed on the insulation layer 155 and source electrodes 366 disposed between the gate electrodes 360, a step of attaching a second substrate 309 to a surface of the resultant structure opposite to the first substrate 301, a step of removing the first substrate 301, and a step of forming a drain electrode 310 on a surface of the resultant structure opposite to the second substrate 309.

Figure 32:
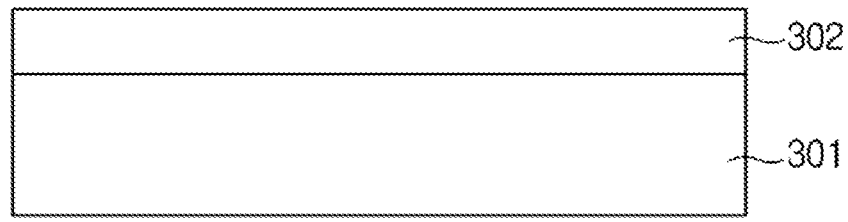
FIGS. 32 to 46 are cross-sectional views illustrating a method of fabricating the vertical gallium nitride transistor according to an exemplary embodiment of the present invention.
Figure 33:
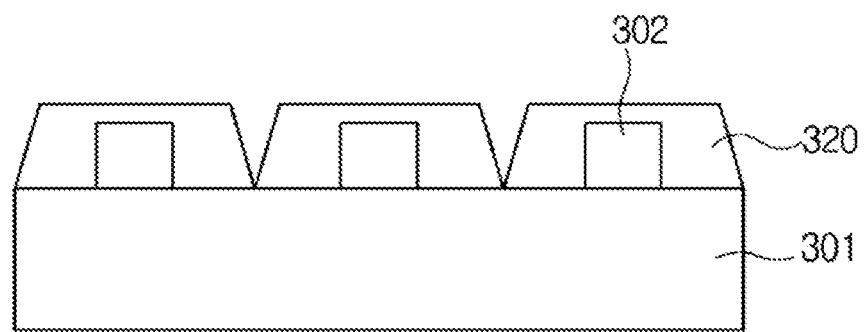

In the step of forming the seed patterns 302, the seed patterns 302 may be formed of an undoped GaN layer having an excellent adhesion to the first substrate 301. As illustrated in FIG. 32, the seed patterns 102 may be formed by forming an undoped GaN layer on the first substrate 301 and by patterning the undoped GaN layer using an etch process to form GaN patterns (see "302" of FIG. 33). Referring to FIG. 33, a GaN layer heavily doped with N-type impurities may be grown on the seed patterns 302 to form the first semiconductor layer 320.

Figure 34:
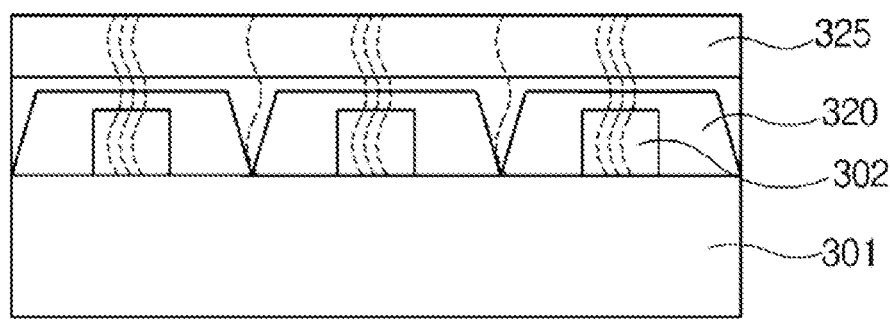

Referring to FIG. 34, a GaN layer lightly doped with N-type impurities may be grown on the first semiconductor layer 320 to form the first semiconductor layer 325. That is, the steps of forming the first semiconductor layers 320 and 325 may include a step of growing the seed patterns 302 to form the first semiconductor layer 320 and a step of forming the first semiconductor layer 325 on the first semiconductor layer 320. Thus, the first semiconductor layers 320 and 325 may be formed to include a lower GaN layer 320 heavily doped with N-type impurities and an upper GaN layer 325 lightly doped with N-type impurities which are sequentially stacked on the first substrate 301.

Figure 35:
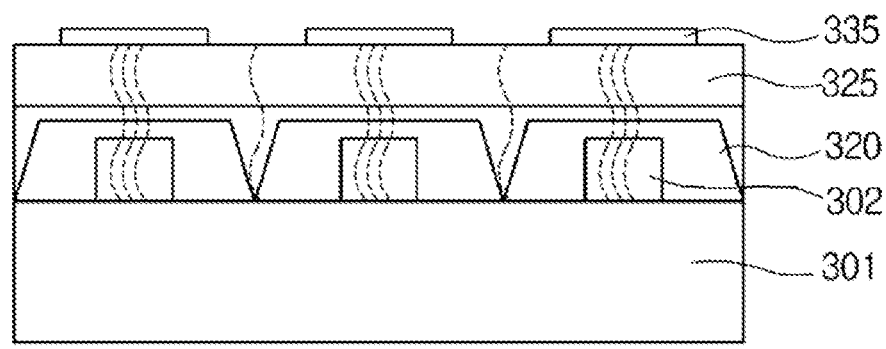

Referring to FIG. 35, the blocking layers 335 may be formed on the upper GaN layer 325 to face respective ones of the seed patterns 302. Each of the blocking layers 335 may be formed of an insulation layer having a width which is greater than a width of each seed pattern 302. The blocking layers 335 may be formed by forming an insulation layer such as a silicon oxide layer on the upper GaN layer 325 and by patterning the insulation layer using an etch process.

Figure 36:
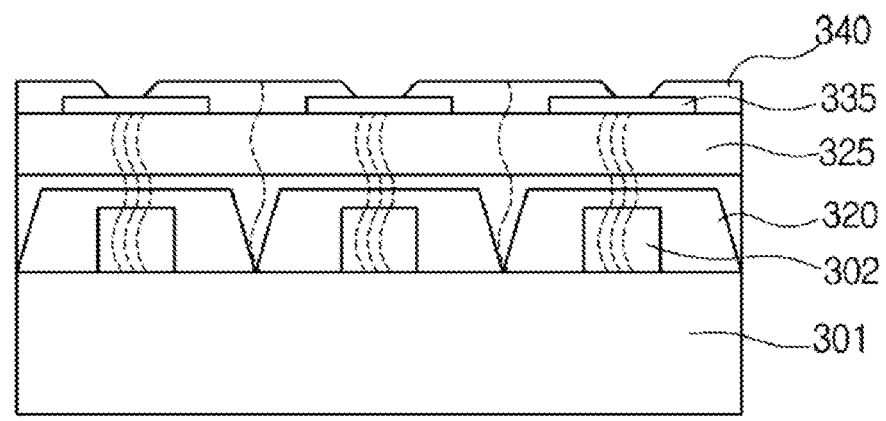

Referring to FIG. 36, an undoped GaN layer may be grown using the first semiconductor layer 325 as a seed layer to form the second semiconductor layers 340. The second semiconductor layers 340 may be formed to cover edges of the blocking layers 335.

Figure 37:
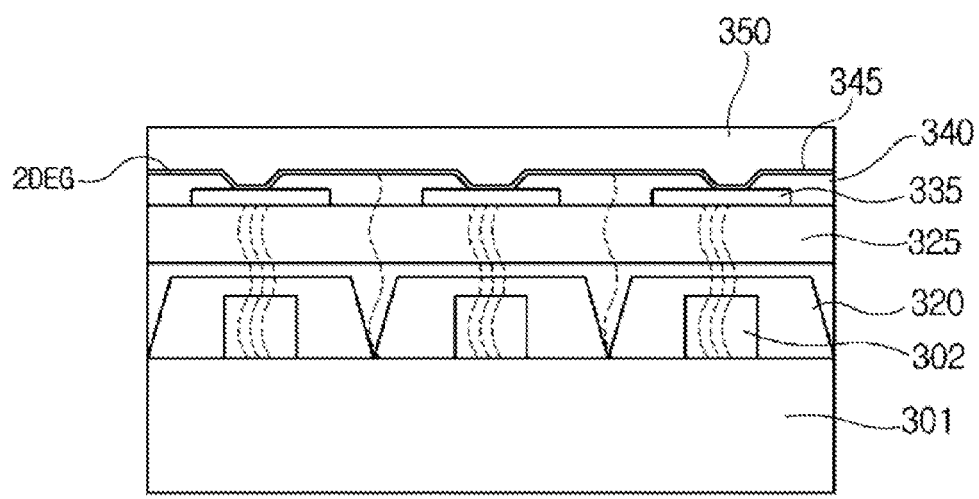
Figure 38:
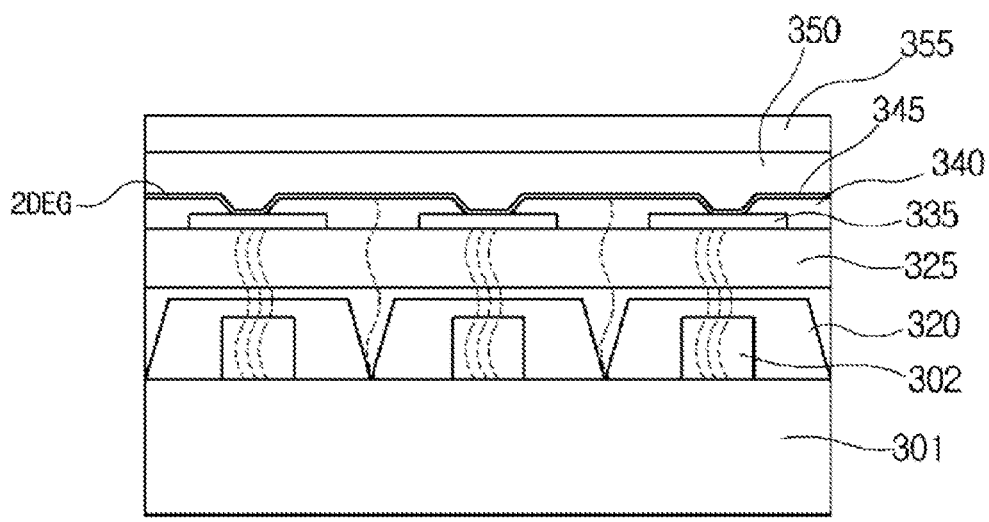

Referring to FIG. 37, the barrier layer 345 may be formed on the second semiconductor layers 340 and the blocking layers 335. The barrier layer 345 may be formed of an aluminum gallium nitride (AlGaN) layer which is thinner than the second semiconductor layers 340 and the third semiconductor layer 350 to be formed thereon in a subsequent process. For example, the barrier layer 345 may be formed to have a thickness of about 10 nanometers to about 100 nanometers. After the barrier layer 345 is formed, the third semiconductor layer 350 may be formed of a P-type GaN layer on an entire surface of the barrier layer 345 as illustrated in FIG. 37. The insulation layer 355 may be formed on the third semiconductor layer 350, as illustrated in FIG. 38.

Figure 39:
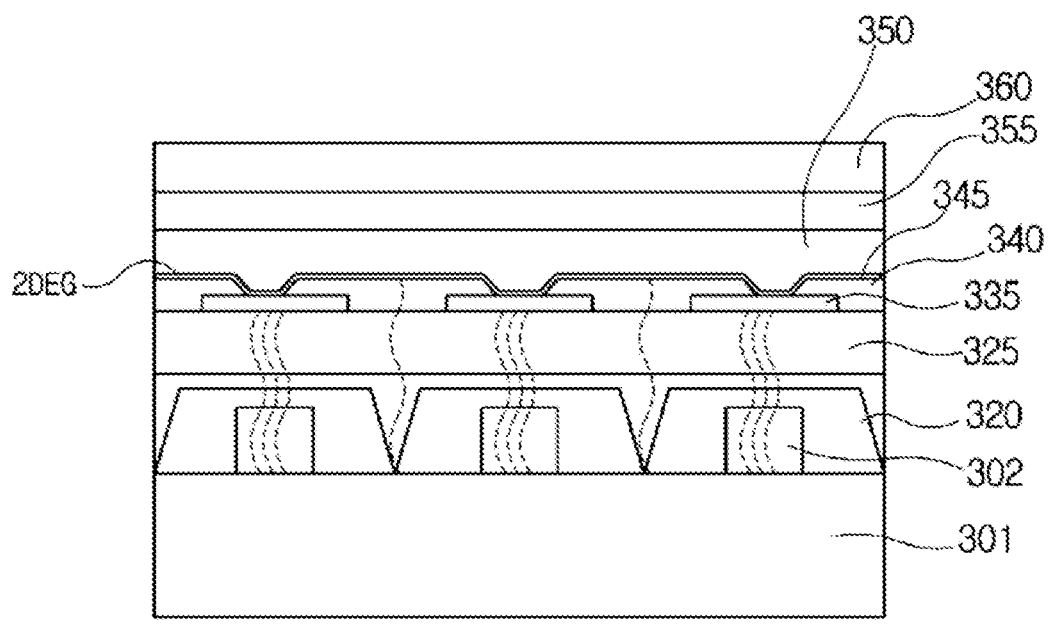
Figure 40:
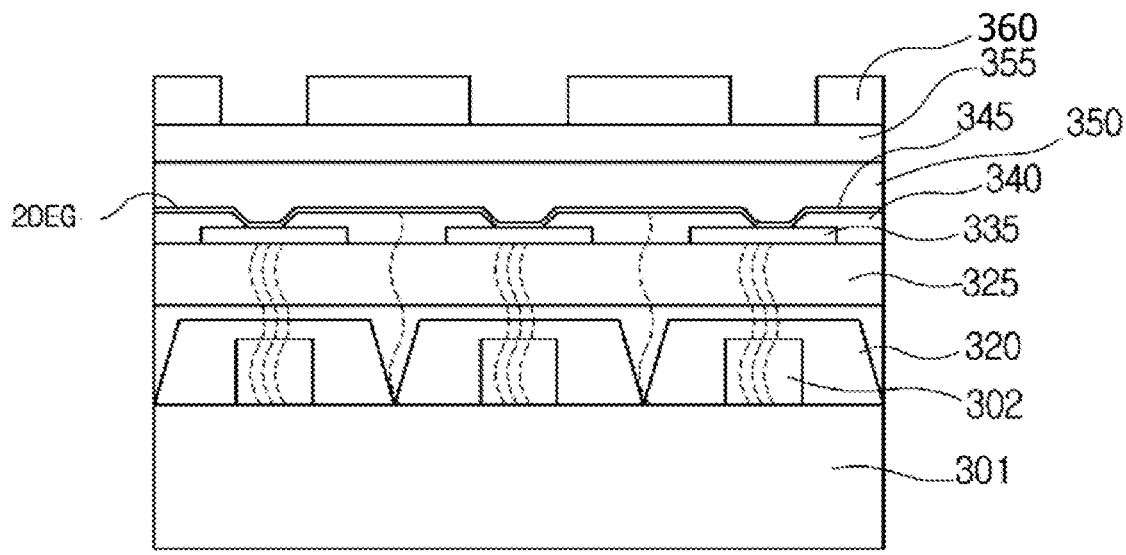
Figure 41:
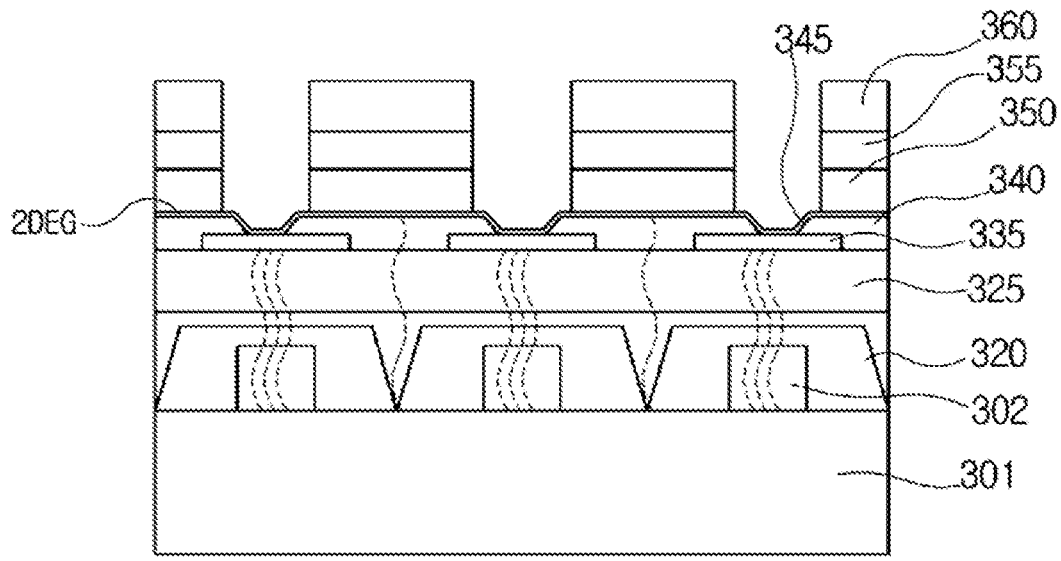
Figure 42:
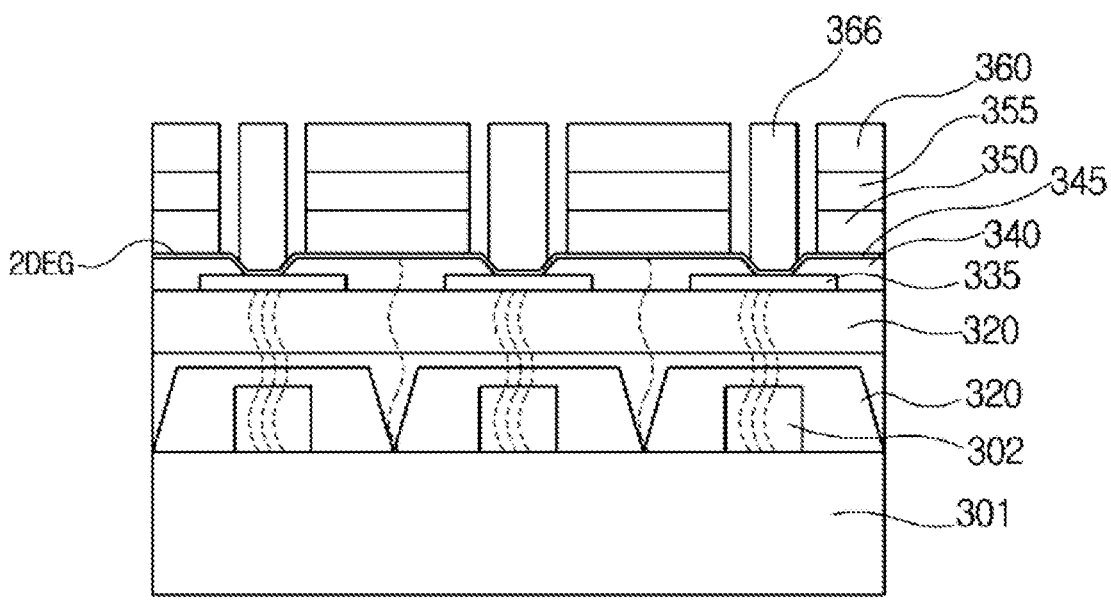
Figure 43:
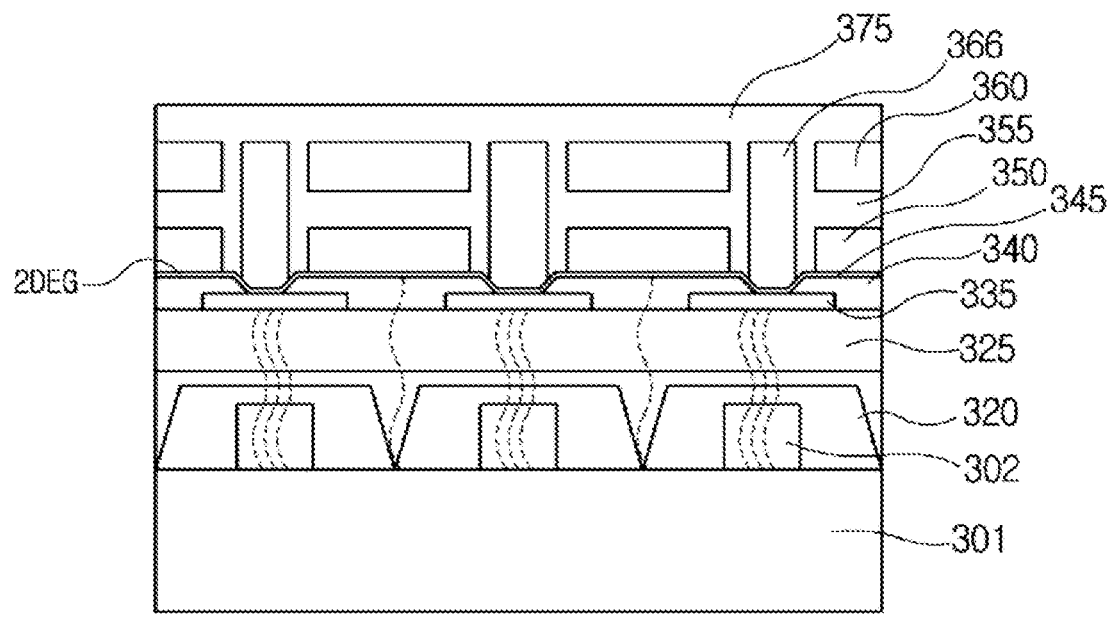

The step of forming the source electrodes 366 and the gate electrodes 360 may include a step of forming a metal layer 360 on the insulation layer 355 as illustrated in FIG. 39, a step of patterning the metal layer 360 to form the gate electrodes 360 as illustrated in FIG. 40, a step of patterning the insulation layer 355 and the P-type GaN layer 350 to form openings that expose portions of the barrier layer 345 on the blocking layers 335 as illustrated in FIG. 41, a step of forming the source electrodes 366 composed of a metal layer in the openings as illustrated in FIG. 42, and a step of forming an insulation layer 375 that fills spaces between the source electrodes 366 and the gate electrodes 360 and covers the source electrodes 366 and the gate electrodes 360 as illustrated in FIG. 43.

Figure 44:
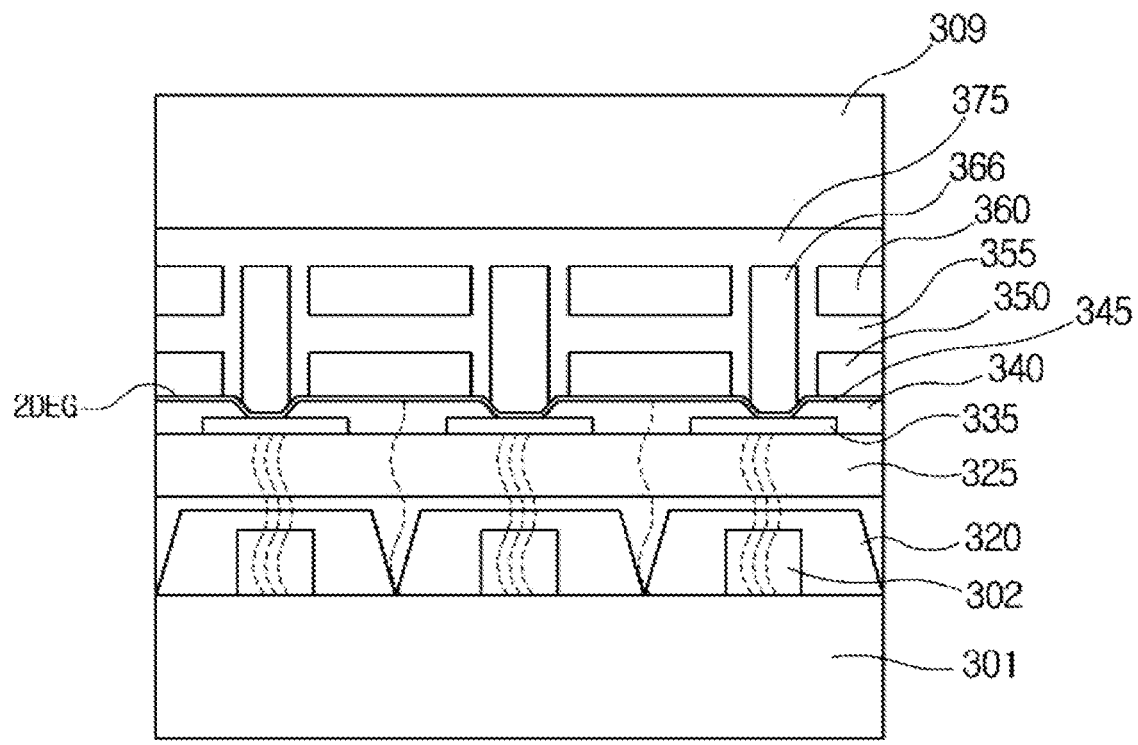
Figure 45:
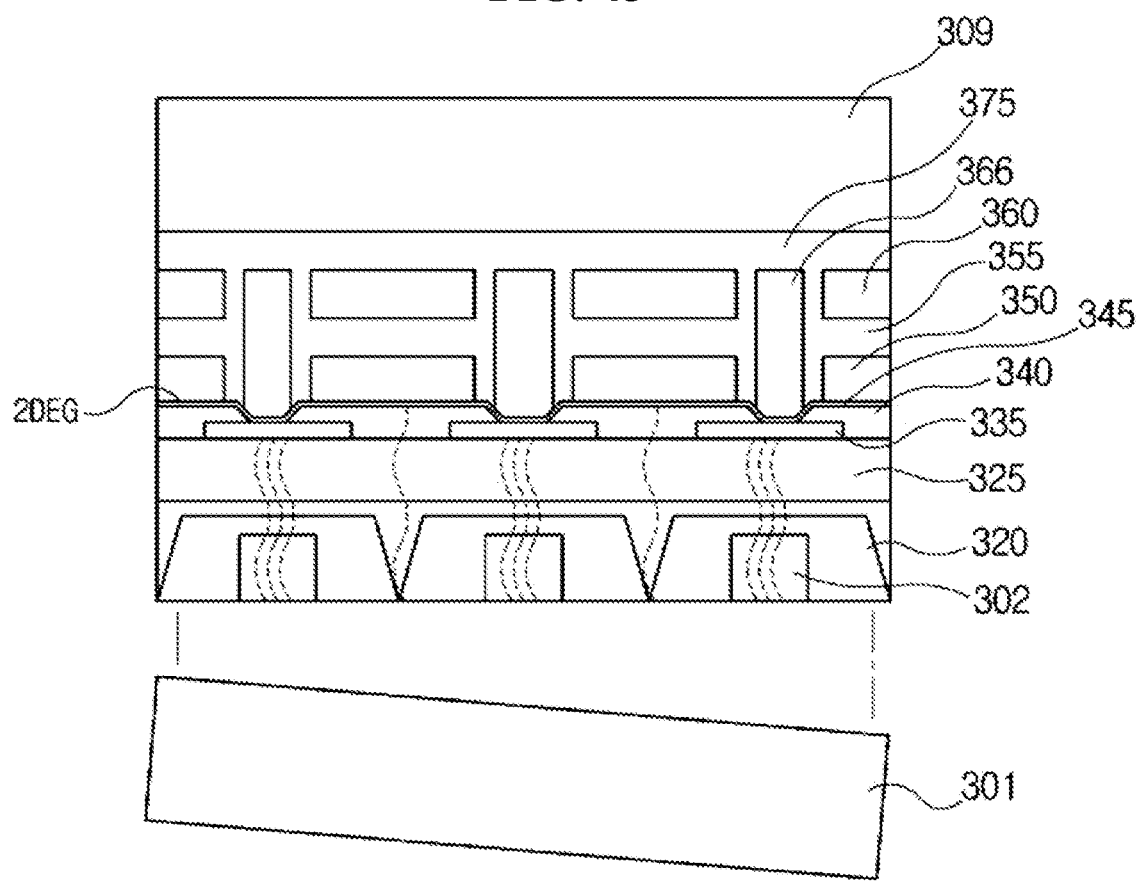
Figure 46:
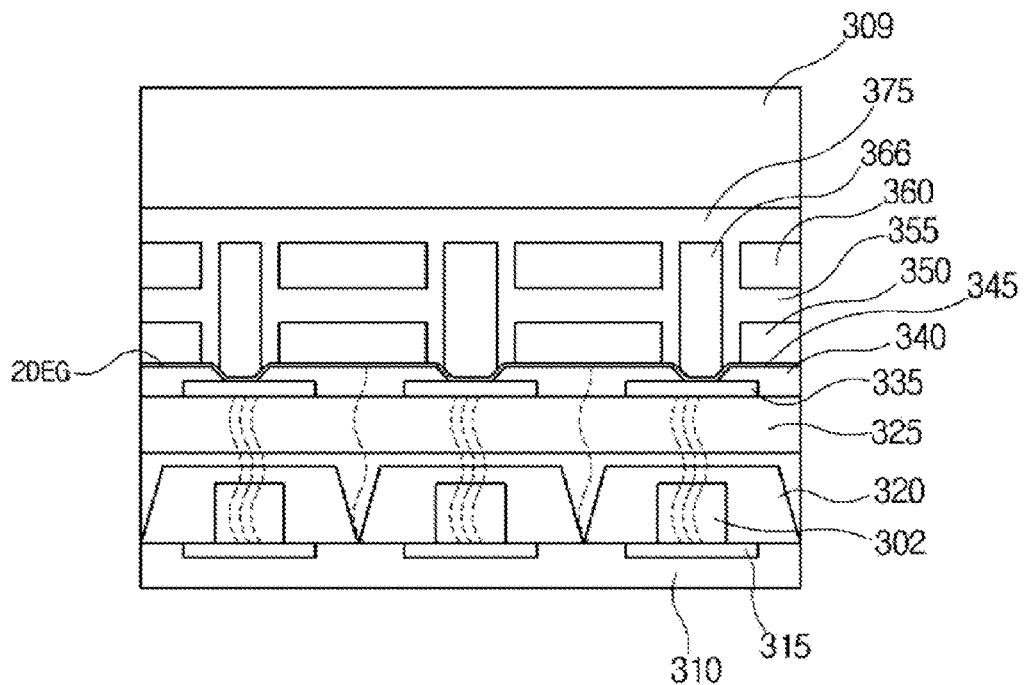

As illustrated in FIG. 44, the second substrate 309 may be attached to a surface of the insulation layer 375 opposite to the first substrate 301. Referring to FIG. 45, the first substrate 301 may be detached from the first semiconductor layer 320. After the first substrate 101 is removed, additional blocking layers 315 may be formed on respective ones of the seed patterns 302 and a metal layer acting as the drain electrode 310 may be formed to cover the additional blocking layers 315 and the first semiconductor layer 320 as illustrated in FIG. 46. The additional blocking layers 315 may be formed of the sane material as the blocking layers 335. Further, the additional blocking layers 115 may be formed to have substantially the same width as the blocking layers 335.

Figure 47:
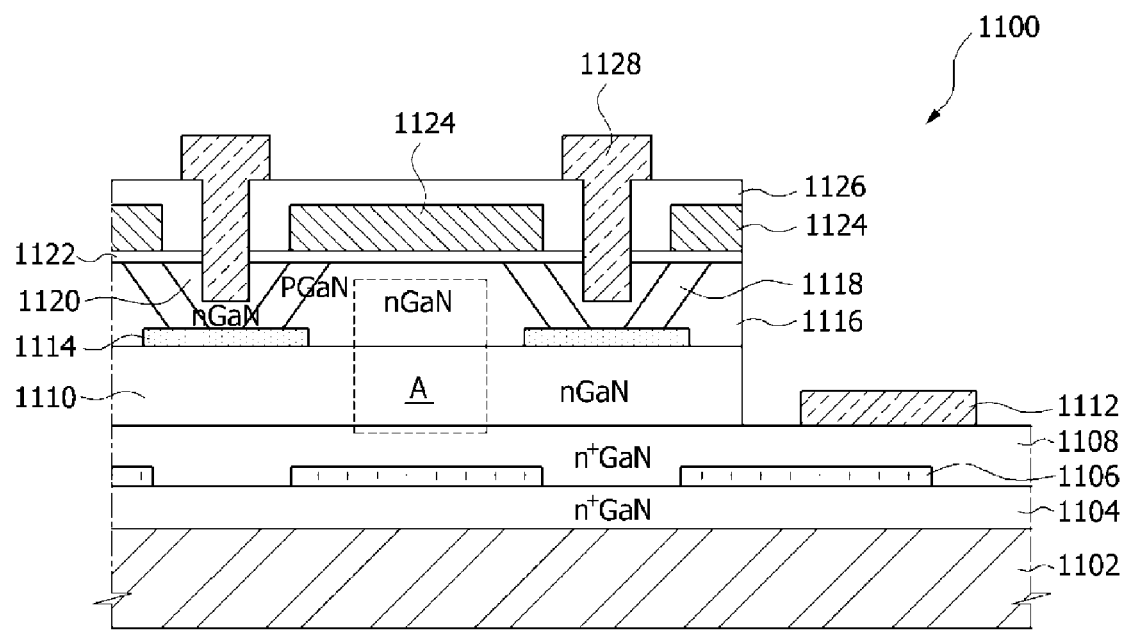
FIG. 47 is a cross-sectional view illustrating a vertical gallium nitride transistor according to an exemplary embodiment of the present invention.

FIG. 47 is a cross-sectional view illustrating a vertical gallium nitride transistor 1100 according to an exemplary embodiment of the present invention. Referring to FIG. 47, the vertical gallium nitride transistor 1100 may include a buffer layer 1104 disposed on a substrate 1102. The substrate 1102 may be a sapphire substrate. The buffer layer 1104 may be an N-type GaN layer. Although not shown in the drawings, an additional buffer layer may be disposed between the substrate 1102 and the buffer layer 1104. In such a case, the additional buffer layer may be an aluminum gallium nitride (AlGaN) layer. Mask patterns 1106 may be disposed on the buffer layer 1104. The mask patterns 1106 may act as a mask for an epitaxial lateral overgrowth (ELO) performed in a subsequent process. In one exemplary embodiment, the mask patterns 1106 may be formed of a silicon oxide layer. The mask patterns 1106 may expose portions of the buffer layer 1104. A GaN layer 1108 may be disposed on the exposed portions of the buffer layer 1104 and surfaces of the mask patterns 1106. The GaN layer 1108 may be doped with N-type impurities. In one exemplary embodiment, the GaN layer 1108 may have an impurity concentration of at least about $1 \times 10^{18}$/cm$^3$. The GaN layer 1108 may be vertically and laterally grown on the exposed portions of the buffer layer 1104. That is, the GaN layer 1108 may be grown to cover the mask patterns 1106. Thus, the GaN layer 1108 on the mask patterns 1106 may have a relatively low density of vertical threading dislocations. A first drift layer 1110 and a drain electrode 1112 may be disposed on the GaN layer 1108 to be spaced apart from each other. The first drift layer 1110 may be an N-type GaN layer. In one exemplary embodiment, the first drift layer 1110 may have an impurity concentration of about $0.1 \times 10^{18}$/cm$^3$ to about $1 \times 10^{18}$/cm$^3$. In one exemplary embodiment, the first drift layer 1110 may have a thickness of about 2 micrometers to about 20 micrometers. The drain electrode 1112 may be a metal layer.

A current blocking pattern 1114 may be disposed on the first drift layer 1110. The current blocking pattern 1114 may be formed of a silicon oxide layer. The current blocking pattern 1114 may have openings that expose portions of the first drift layer 1110. The current blocking pattern 1114 may define vertical current paths (i.e., vertical carrier movement paths). That is, if the vertical GaN transistor 1100 is turned on, carriers may vertically move through the openings of the current blocking pattern 1114. The current blocking pattern 1114 may be disposed such that the openings of the current blocking pattern 1114 may overlap with the mask patterns 1106 when viewed from a plan view. Thus, the carriers moving through the openings of the current blocking pattern 1114 may be vertically drifted toward the mask patterns 1106. As a result, the carriers may move through the first drift layer 1110 and the GaN layer 1108 that have a relatively low density of the vertical threading dislocations on the mask patterns 1106 (see portion "A" indicated by a dotted line of FIG. 47). A second drift layer 1116 may be disposed on the first drift layer 1110. The second drift layer 1116 may be an N-type GaN layer. In one exemplary embodiment, an impurity concentration of the second drift layer 1116 may be lower than that of the first drift layer 1110. The second drift layer 1116 may be grown on the first drift layer 1110 that has a relatively low density of the vertical threading dislocations over the mask patterns 1106. Thus, the second drift layer 1116 may also have a relatively low density of the vertical threading dislocations (see portion "A" indicated by a dotted line of FIG. 47).

Channel layers 1118 may be disposed on respective ones of the current blocking patterns 1114. Top surfaces of the channel layers 1118 may be coplanar with a top surface of the second drift layer 1116. The channel layers 1118 may be a P-type. In one exemplary embodiment, the channel layers 1118 may be a P-type GaN layer. Inversion channel layers may be formed at the top surfaces of the channel layers 1118 under a specific bias condition, and the remaining regions of the channel layers 1118 may act as barrier regions that block drift of carriers. Donor layers 1120 may be disposed on respective ones of the current blocking patterns 1114 and may be surrounded by the channel layers 1118. In one exemplary embodiment, the donor layers 1120 may be formed of an N-type GaN layer. Top surfaces of the donor layers 1120 may be coplanar with the top surfaces of the channel layers 1118 and the second drift layer 1116. Gate electrodes 1124 may be disposed to cover the channel layers 1118 and the second drift layer 1116. The gate electrodes 1124 may be electrically insulated from the channel layers 1118 and the second drift layer 1116 by a gate insulation layer 1122, which is disposed between the gate electrodes 1124 and the second drift layer 1116 as well as between the gate electrodes 1124 and the channel layers 1118. Source electrodes 1128 may be disposed on respective ones of the donor layers 1120. In one exemplary embodiment, the source electrodes 1128 may penetrate the donor layers 1120 to contact the channel layers 1118. The source electrodes 1128 may be electrically insulated from the gate electrodes 1124 by an insulation layer 1126.

In the vertical GaN transistor 1100 described above, if a positive voltage over a threshold voltage is applied to the gate electrodes 1124, inversion channel layers may be formed at the top surfaces of the channel layers 1118. Thus, if a drain voltage is applied between the drain electrode 1112 and the source electrodes 1128, carriers in the donor layers 1120 may be laterally drifted toward the second drift layer 1116 through the inversion channel layers. The carriers injected into the second drift layer 1116 may be vertically drifted into the first drift layer 1110, and the carriers injected into the first drift layer 1110 may be drifted into the drain electrode 1112 through the GaN layer 1108. While the carriers are drifted from the source electrodes 1128 toward the drain electrode 1112, the carriers may be vertically drifted through the region "A" indicated by a dotted line of FIG. 47, and the region "A" may be a region having a relatively low density of the vertical threading dislocations. Thus, on-current of the vertical GaN transistor 1100 may be improved, and a leakage current characteristic of the vertical GaN transistor 1100 may also be improved when the vertical GaN transistor 1100 is turned off.

Figure 48:
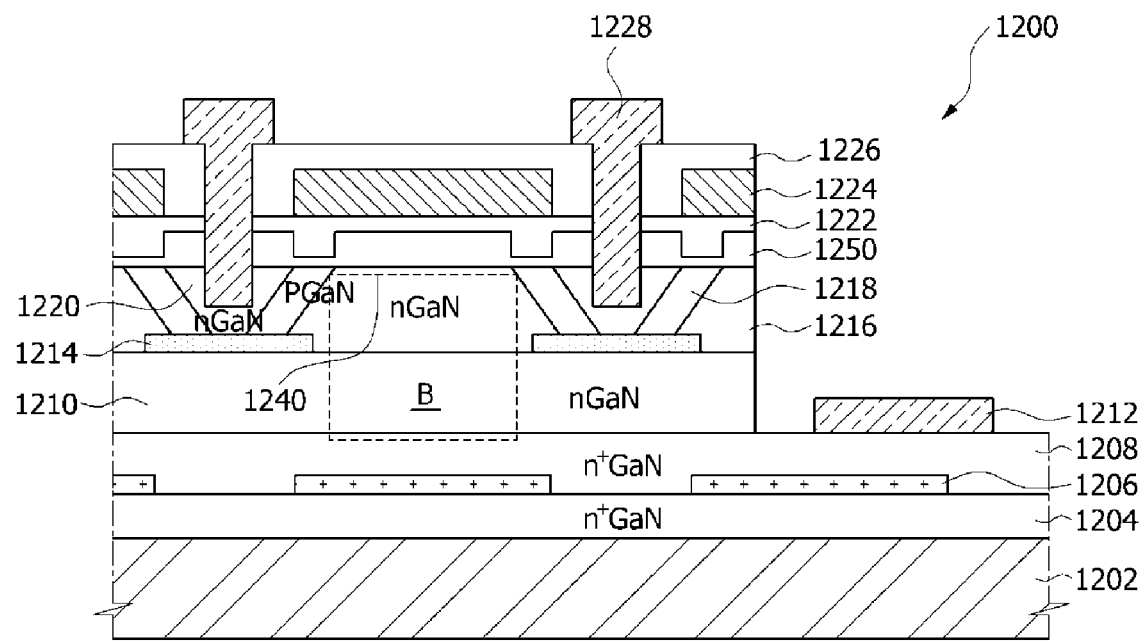
FIG. 48 is a cross-sectional view illustrating a vertical gallium nitride transistor according to an exemplary embodiment of the present invention.

FIG. 48 is a cross-sectional view illustrating a vertical gallium nitride transistor 1200 according to an exemplary embodiment of the present invention. Referring to FIG. 48, the vertical gallium nitride transistor 1200 may include a buffer layer 1204 disposed on a substrate 1202. The substrate 1202 may be a sapphire substrate. The buffer layer 1204 may be an N-type GaN layer. Although not shown in the drawings, an additional buffer layer may be disposed between the substrate 1202 and the buffer layer 1204. In such a case, the additional buffer layer may be an aluminum gallium nitride (AlGaN) layer. Mask patterns 1206 may be disposed on the buffer layer 1204. The mask patterns 1206 may act as a mask for an epitaxial lateral overgrowth (ELO) performed in a subsequent process. In one exemplary embodiment, the mask patterns 1206 may be formed of a silicon oxide layer. The mask patterns 1206 may expose portions of the buffer layer 1204. A GaN layer 1208 may be disposed on the exposed portions of the buffer layer 1204 and surfaces of the mask patterns 1206. The GaN layer 1208 may be doped with N-type impurities. In one exemplary embodiment, the GaN layer 1208 may have an impurity concentration of at least about $1 \times 10^{18}/cm^3$. The GaN layer 1208 may be vertically and laterally grown on the exposed portions of the buffer layer 1204. That is, the GaN layer 1208 may be grown to cover the mask patterns 1206. Thus, the GaN layer 1208 on the mask patterns 1206 may have a relatively low density of vertical threading dislocations. A first drift layer 1210 and a drain electrode 1212 may be disposed on the GaN layer 1208 to be spaced apart from each other. The first drift layer 1210 may be an N-type GaN layer. In one exemplary embodiment, the first drift layer 1210 may have an impurity concentration of about $0.1 \times 10^{18}/cm^3$ to about $1 \times 10^{18}/cm^3$. In one exemplary embodiment, the first drift layer 1210 may have a thickness of about 2 micrometers to about 20 micrometers. The drain electrode 1112 may be a metal layer.

A current blocking pattern 1214 may be disposed on the first drift layer 1210. The current blocking pattern 1214 may be formed of a silicon oxide layer. The current blocking pattern 1214 may have openings that expose portions of the first drift layer 1210. The current blocking pattern 1214 may define vertical current paths (i.e., vertical carrier movement paths). That is, if the vertical GaN transistor 1200 is turned on, carriers may vertically move through the openings of the current blocking pattern 1214. The current blocking pattern 1214 may be disposed such that the openings of the current blocking pattern 1214 may overlap with the mask patterns 1206 when viewed from a plan view. Thus, the carriers moving through the openings of the current blocking pattern 1214 may be vertically drifted toward the mask patterns 1206. As a result, the carriers may move through the first drift layer 1210 and the GaN layer 1208 that have a relatively low density of the vertical threading dislocations on the mask patterns 1206 (see a portion "B" indicated by a dotted line of FIG. 48). A second drift layer 1216 may be disposed on the first drift layer 1210. The second drift layer 1216 may be an N-type GaN layer. In one exemplary embodiment, an impurity concentration of the second drift layer 1216 may be lower than that of the first drift layer 1210. The second drift layer 1216 may be grown on the first drift layer 1210 that has a relatively low density of the vertical threading dislocations over the mask patterns 1206. Thus, the second drift layer 1216 may also have a relatively low density of the vertical threading dislocations (see a portion "B" indicated by a dotted line of FIG. 48).

Channel layers 1218 may be disposed on respective ones of the current blocking patterns 1214. Top surface of the channel layers 1218 may be coplanar with a top surface of the second drift layer 1216. The channel layers 1218 may have a P-type. In one exemplary embodiment, the channel layers 1218 may be a P-type GaN layer. Inversion channel layers may be formed at the top surfaces of the channel layers 1218 under a specific bias condition, and the remaining regions of the channel layers 1218 may act as barrier regions that block drift of carriers. Donor layers 1220 may be disposed on respective ones of the current blocking patterns 1214 and may be surrounded by the channel layers 1218. In one exemplary embodiment, the donor layers 1220 may be formed of an N-type GaN layer. Top surfaces of the donor layers 1220 may be coplanar with the top surfaces of the channel layers 1218 and the second drift layer 1216.

A heterogeneous semiconductor layer 1250 for forming a two dimension electron gas (2DEG) may be disposed on the second drift layer 1216. When the second drift layer 1216 is a GaN layer, the heterogeneous semiconductor layer 1250 may be an aluminum gallium nitride (AlGaN) layer. In such a case, the two dimension electron gas (2DEG) regions may be formed at a top surface of the second drift layer 1216. In the present exemplary embodiment, the heterogeneous semiconductor layer 1250 may be disposed to have different thicknesses according to positions thereof. For example, a thickness of the heterogeneous semiconductor layer 1250 on top surfaces of the channel layers 1218 may be less than a thickness of the heterogeneous semiconductor layer 1250 on top surfaces of the second drift layer 1216. The thickness of the heterogeneous semiconductor layer 1250 on the top surfaces of the channel layers 1218 may be appropriately determined to disturb that the two dimension electron gas (2DEG) regions are formed at the top surfaces of the channel layers 1218. In contrast, the thickness of the heterogeneous semiconductor layer 1250 on the top surfaces of the second drift layer 1216 may be appropriately determined such that the two dimension electron gas (2DEG) regions are sufficiently formed at the top surface of the second drift layer 1216. In one exemplary embodiment, the heterogeneous semiconductor layer 1250 may be partially disposed to expose the channel layers 1218.

Gate electrodes 1224 may be disposed on the heterogeneous semiconductor layer 1250. The gate electrodes 1224 may be electrically insulated from the channel layers 1218 and the second drift layer 1216 by a gate insulation layer 1222 which is disposed between the gate electrodes 1224 and the heterogeneous semiconductor layer 1250. Source electrodes 1228 may be disposed on respective ones of the donor layers 1220. In one exemplary embodiment, the source electrodes 1228 may penetrate the donor layers 1220 to contact the channel layers 1218. The source electrodes 1228 may be electrically insulated from the gate electrodes 1224 by an insulation layer 1226.

In the vertical GaN transistor 1200 described above, if a positive voltage over a threshold voltage is applied to the gate electrodes 1224, inversion channel layers may be formed at the top surfaces of the channel layers 1218. Thus, if a drain voltage is applied between the drain electrode 1212 and the source electrodes 1228, carriers in the donor layers 1220 may be laterally drifted toward the two dimension electron gas (2DEG) regions formed in the second drift layer 1216 through the inversion channel layers. The carriers injected into the second drift layer 1216 may be vertically drifted into the first drift layer 1210, and the carriers injected into the first drift layer 1210 may be drifted into the drain electrode 1212 through the GaN layer 1208. While the carriers are drifted from the source electrodes 1228 toward the drain electrode 1212, the carriers may be vertically drifted through a region "B" indicated by a dotted line of FIG. 48, and the region "B" may be a region having a relatively low density of the vertical threading dislocations. Thus, on-current of the vertical GaN transistor 1200 may be improved, and a leakage current characteristic of the vertical GaN transistor 1200 may also be improved when the vertical GaN transistor 1200 is turned off.

Figure 49:
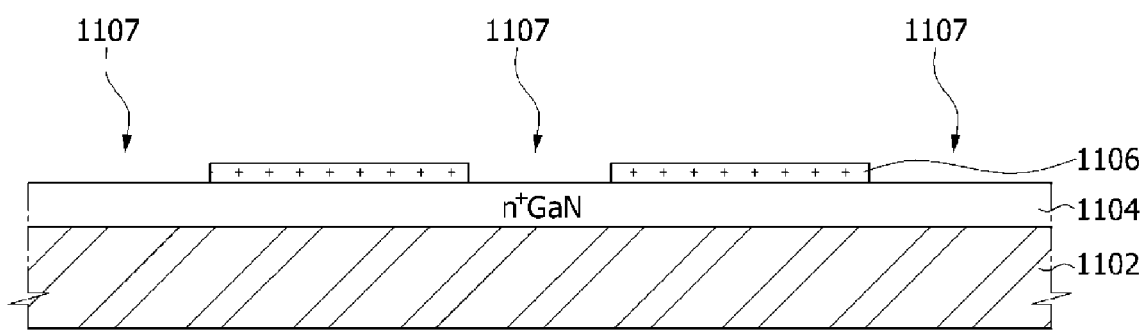
FIGS. 49 to 60 are cross-sectional views illustrating a method of fabricating the vertical gallium nitride transistors shown in FIG. 47.

FIGS. 49 to 60 are cross-sectional views illustrating a method of fabricating a vertical gallium nitride transistor shown in FIG. 47. Referring to FIG. 49, a buffer layer 1104 may be formed on a substrate 1102. The substrate 1102 may be used as a seed layer for growing the buffer layer 1104. In some embodiments, the substrate 1102 may be a sapphire substrate. The buffer layer 1104 may be formed of an N-type GaN layer. The N-type GaN layer corresponding to the buffer layer 1104 may be formed using an MOCVD process, an MBE process or an HVPE process. Subsequently, a mask layer may be formed on the buffer layer 1104 and the mask layer may be patterned to form mask patterns 1106. The mask patterns 1106 may act as a mask for an epitaxial lateral overgrowth (ELO) performed in a subsequent process. In one exemplary embodiment, the mask patterns 1106 may be formed of a silicon oxide layer. In such a case, the mask patterns 1106 may be formed to have stripe pattern shapes which are parallel with a <11-00> orientation or a <112-0> orientation. The mask patterns 1106 may be formed to have openings 1107 that expose portions of the buffer layer 1104.

Figure 50:
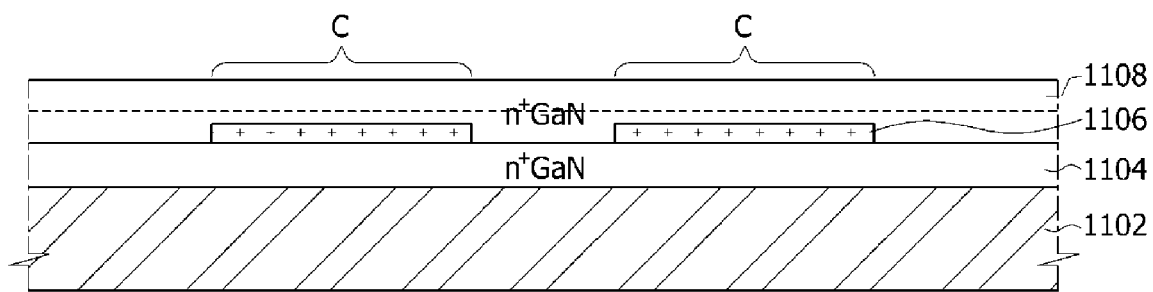

Referring to FIG. 50, a GaN layer 1108 may be formed on the exposed portions of the buffer layer 1104. The GaN layer 1108 may be formed to have an N-type. In one exemplary embodiment, the GaN layer 1108 may be formed to have an impurity concentration of at least about $1 \times 10^{18}/cm^3$. The GaN layer 1108 may be grown using the exposed portions of the buffer layer 1104 as seed layers. In particular, the GaN layer 1108 may be vertically and laterally grown on the mask patterns 1106. Thus, the GaN layer 1108 in regions "C" on the mask patterns 1106 may be formed to have a relatively low density of vertical threading dislocations. In one exemplary embodiment, the GaN layer 1108 may be removed by a predetermined thickness to still remain a thin GaN layer on the mask patterns 1106 (see a dotted line in FIG. 50).

Figure 51:
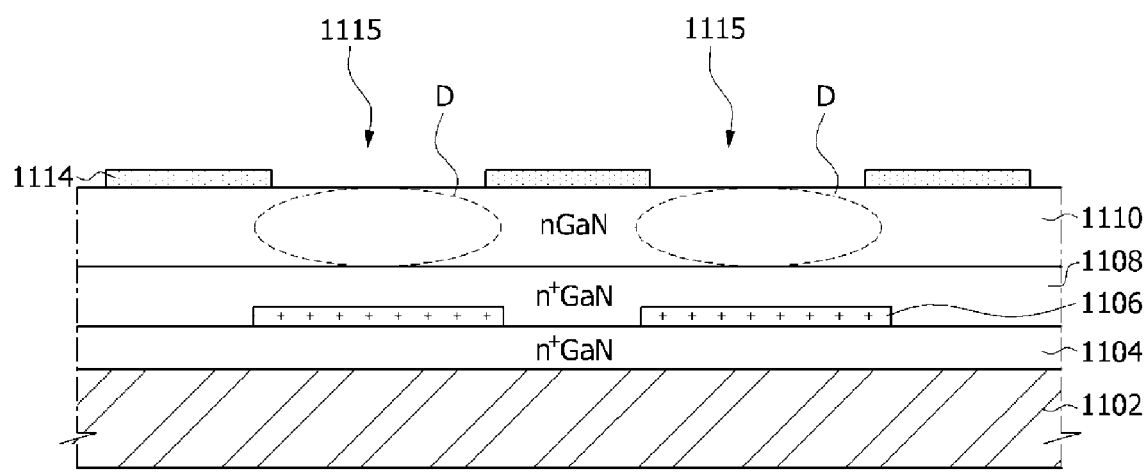

Referring to FIG. 51, a first drift layer 1110 may be formed on the GaN layer 1108. The first drift layer 1110 may be formed of an N-type GaN layer. Portions of the GaN layer 1108 vertically overlapping with the mask patterns 1106 may have a relatively low density of vertical threading dislocations, as described above. Thus, portions "D" of the first drift layer 1110 vertically overlapping with the mask patterns 1106 may also have a relatively low density of vertical threading dislocations. Subsequently, a current blocking layer may be formed on the first drift layer 1110 and the current blocking layer may be patterned to form current blocking patterns 1114. The current blocking patterns 1114 may act as a mask for an epitaxial lateral overgrowth (ELO) performed in a subsequent process. The current blocking patterns 1114 may be formed of a silicon oxide layer. In such a case, the current blocking patterns 1114 may be formed to have stripe pattern shapes which are parallel with a <11-00> orientation or a <112-0> orientation. The current blocking patterns 1114 may be formed to have openings 1115 that expose portions of the first drift layer 1110. The exposed portions of the first drift layer 1110 may correspond to the portions "D" that have a relatively low density of vertical threading dislocations.

Figure 52:
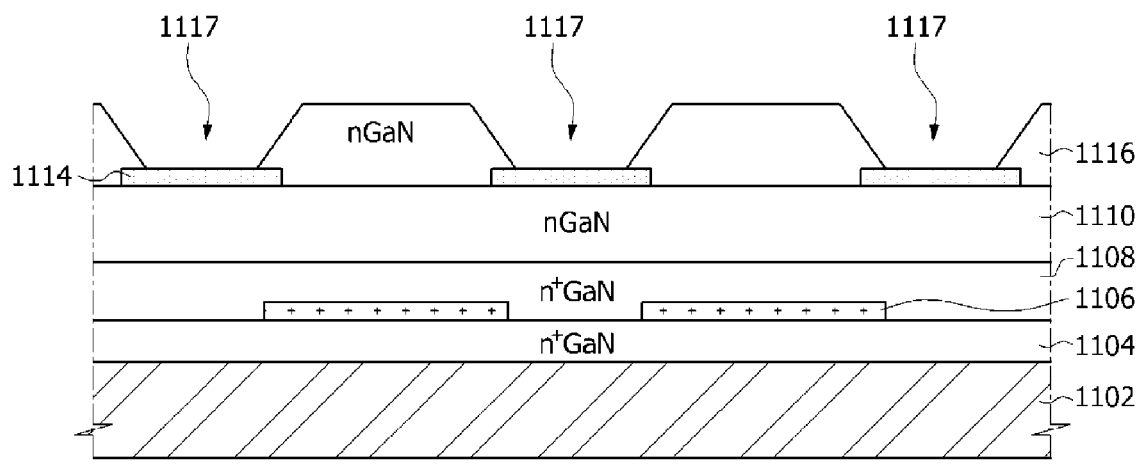

Referring to FIG. 52, second drift layers 1116 may be formed on respective ones of the exposed portions of the first drift layer 1110. The second drift layers 1116 may be formed of an N-type GaN layer. In such a case, the second drift layers 1116 may be formed such that an impurity concentration of the second drift layers 1116 is lower than that of the first drift layer 1110. The second drift layers 1116 may be vertically grown on the first drift layer 1110 at an initial stage. After the second drift layers 1116 are vertically grown to have the same thickness as the current blocking patterns 1114, the second drift layers 1116 may be vertically and laterally grown to cover edges of the current blocking patterns 1114. Thus, the second drift layers 1116 may be formed to have openings 1117 that expose central portions of the current blocking patterns 1114. The second drift layers 1116 may be grown using the portions "D" of the first drift layer 1110 as seed layers. Thus, the second drift layers 1116 may also be grown to have a relatively low density of vertical threading dislocations.

Figure 53:
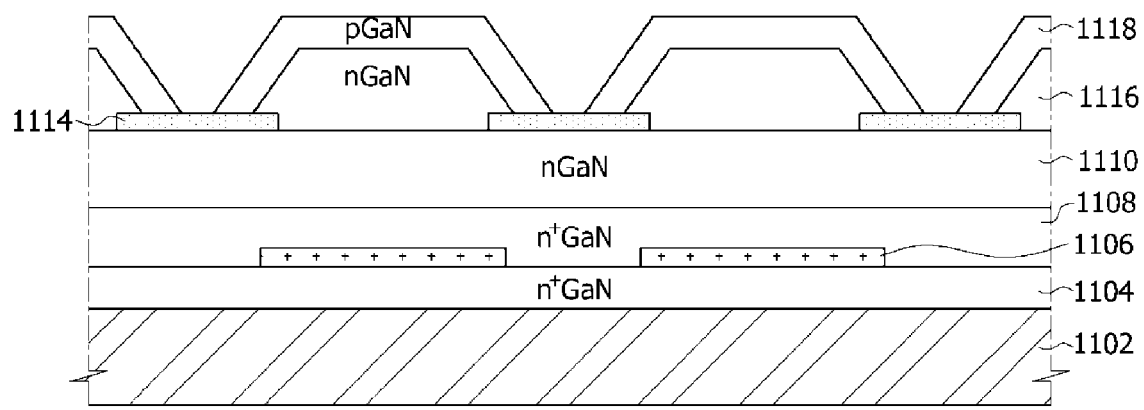

Referring to FIG. 53, channel layers 1118 may be formed on respective ones of the second drift layers 1116. The channel layers 1118 may be formed of a P-type GaN layer. The channel layers 1118 may be formed to still expose the central portions of the current blocking patterns 1114. In one exemplary embodiment, the channel layers 1118 may be doped with boron (B) ions, arsenic (As) ions, phosphorus (P) ions or magnesium (Mg) ions to have a P-type.

Figure 54:
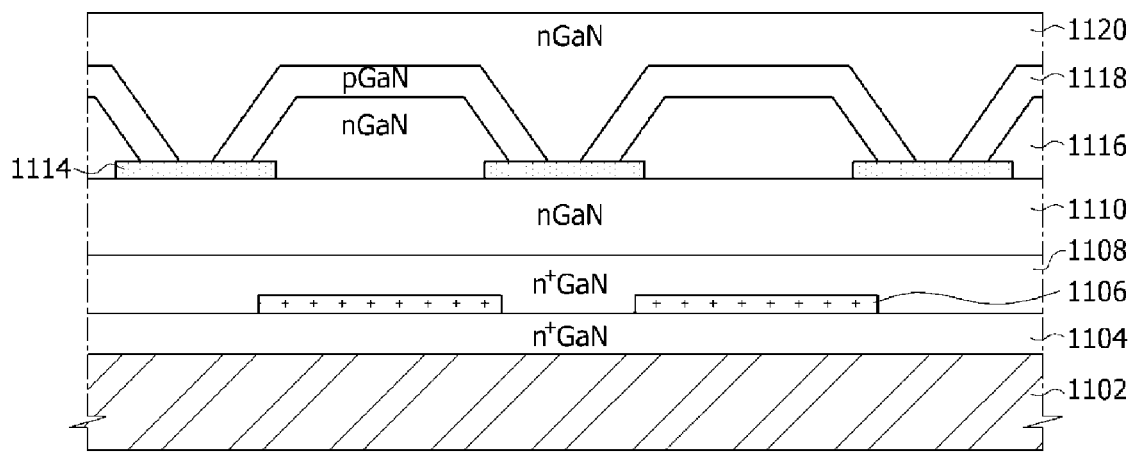

Referring to FIG. 54, a donor layer 1120 may be formed on the current blocking patterns 1114 and the channel layers 1118. The donor layer 1120 may be formed of an N-type GaN layer. The donor layer 1120 may be formed to a sufficient thickness to completely cover the current blocking patterns 1114 and the channel layers 1118.

Figure 55:
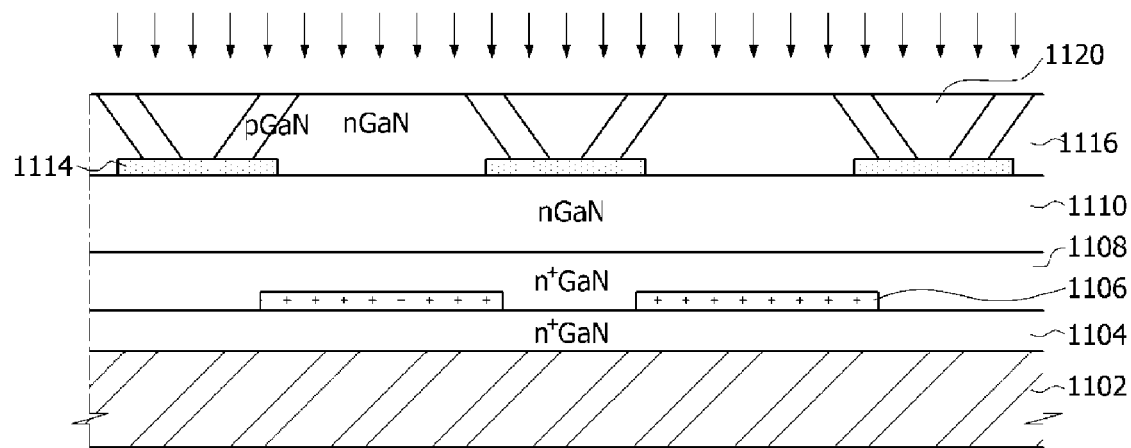

Referring to FIG. 55, the donor layer 1120 may be etched back or planarized until top surfaces of the second drift layers 1116 are exposed. As a result, a single donor layer 1120 and a single channel layer 1118 surrounding sidewalls of the single donor layer 1120 may be formed on each current blocking pattern 1114.

Figure 56:
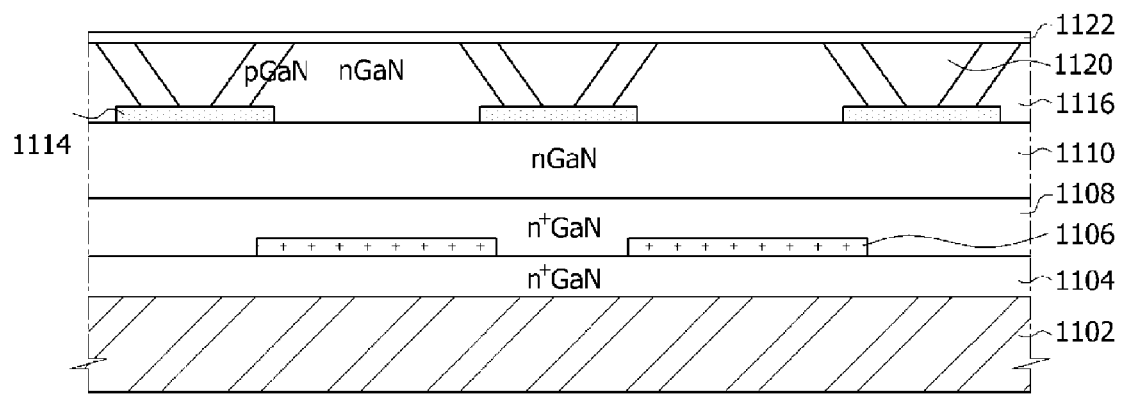

Referring to FIG. 56, a gate insulation layer 1122 may be formed on top surfaces of the second drift layers 1116, the channel layers 1118 and the donor layers 1120. In one exemplary embodiment, the gate insulation layer 1122 may be formed of a silicon oxide ($SiO_2$) layer. In such a case, the silicon oxide ($SiO_2$) layer correspond to the gate insulation layer 1122 may be formed using a deposition process such as a chemical vapor deposition (CVD) process.

Figure 57:
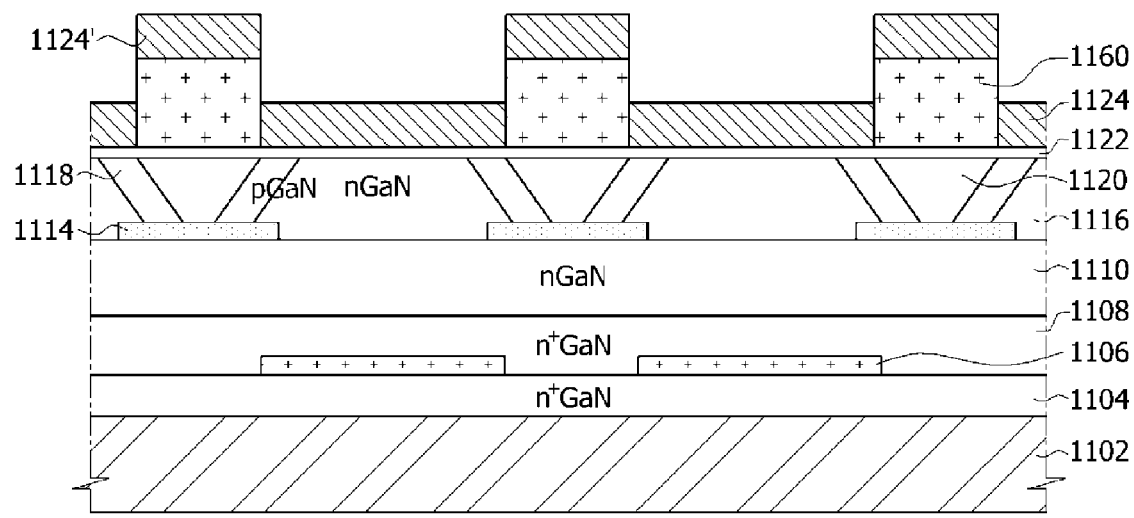

Referring to FIG. 57, resist patterns 1160 may be formed on the gate insulation layer 1122. The resist patterns 1160 may be formed to perform a subsequent lift-off process. In one exemplary embodiment, other material patterns may be formed instead of the resist patterns 1160. Subsequently, a metal layer may be deposited on a surface of the substrate including the resist patterns 1160. The metal layer may be deposited to a thickness which is less than a thickness of the resist patterns 1160. In such a case, the metal layer may include metal patterns 1124' deposited on top surfaces of the resist patterns 1160 and metal patterns 1124 deposited on exposed portions of the gate insulation layer 1122.

Figure 58:
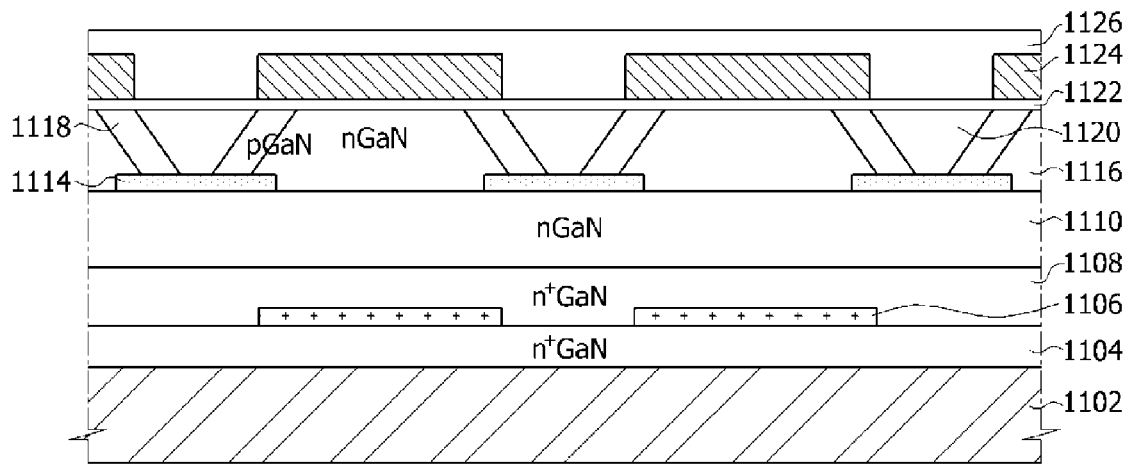

Referring to FIG. 58, the resist patterns 1160 may be removed. The resist patterns 1160 may be removed using an ashing process. When the resist patterns 1160 are removed, the metal patterns 1124' on the resist patterns 1160 may also be removed. Thus, the metal patterns 1124 on the gate insulation layer 1122 may remain to act as gate electrodes. Subsequently, an insulation layer 1126 may be formed on the gate electrodes 1124 and the gate insulation layer 1122.

Figure 59:
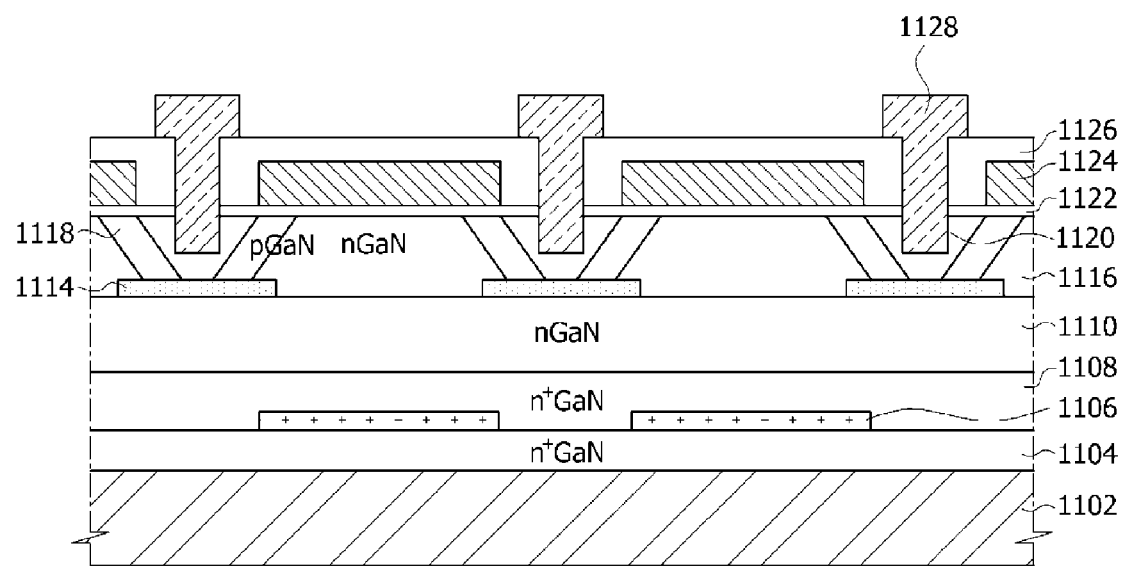

Referring to FIG. 59, the insulation layer 1126, the gate insulation layer 1122 and the donor layers 1120 may be etched to form contact holes. A metal layer may then be formed on the insulation layer 1126 to fill the contact holes, and the metal layer may be patterned to form source electrodes 1128 on the respective ones of the donor layers 1120. In one exemplary embodiment, the contact holes may be formed to expose the channel layers 1118. In such a case, the source electrodes 1128 may be formed to directly contact the channel layers 1118.

Figure 60:
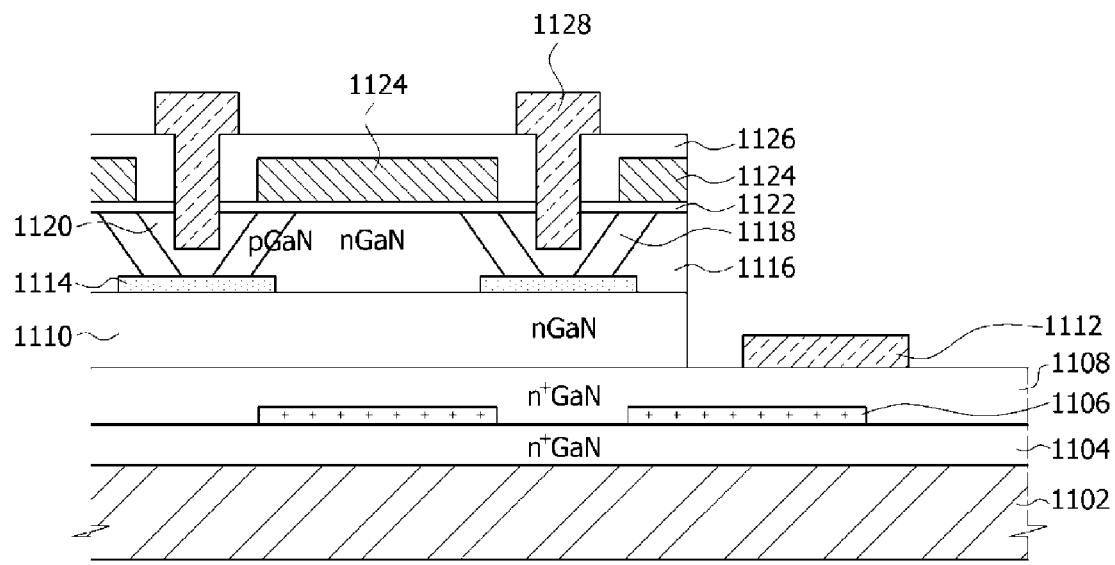

Referring to FIG. 60, a portion of the resultant including the source electrodes 1128 may be removed to expose a portion of the GaN layer 1108. A portion of the resultant including the source electrodes 1128 may be removed using a photolithography process and an etch process. A drain electrode 1112 may be formed on the exposed portion of the GaN layer 1108.

Figure 61:
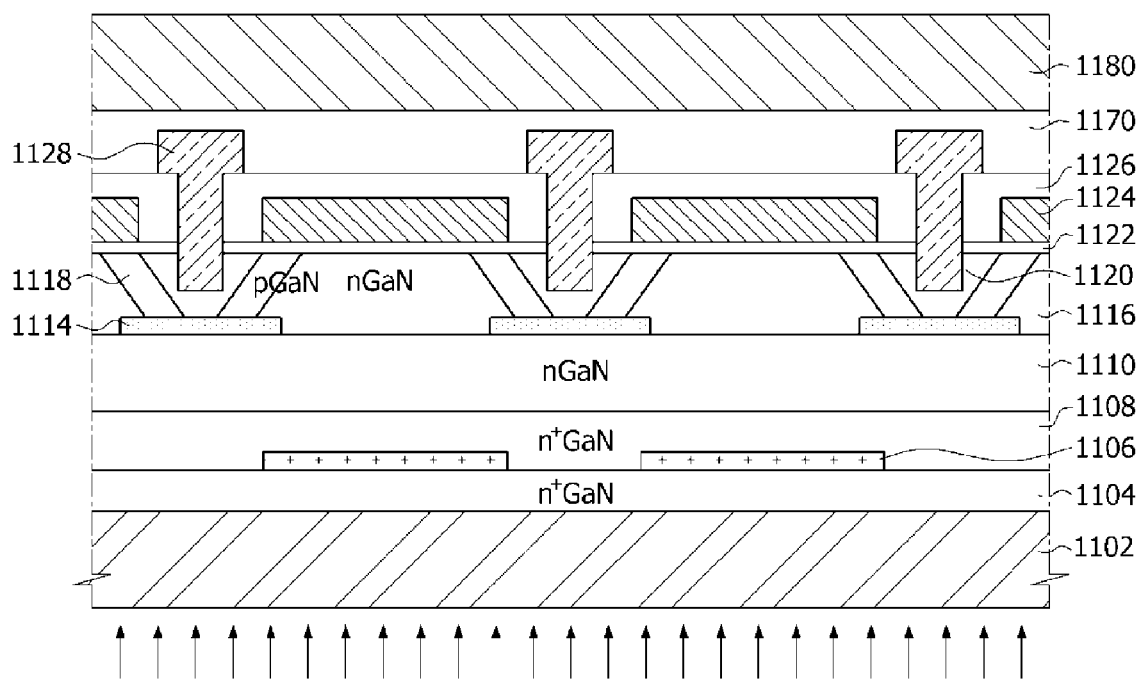
FIG. 61, FIG. 62, and FIG. 63 are cross-sectional views illustrating another method of fabricating the vertical gallium nitride transistor shown in FIG. 47.
Figure 62:
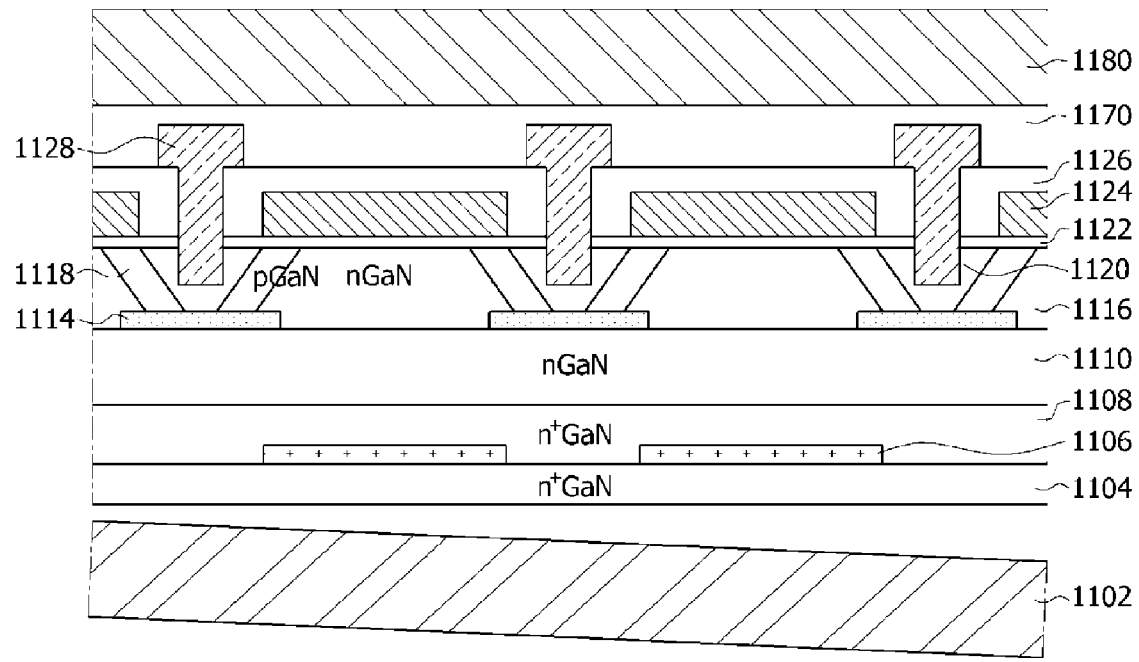
Figure 63:
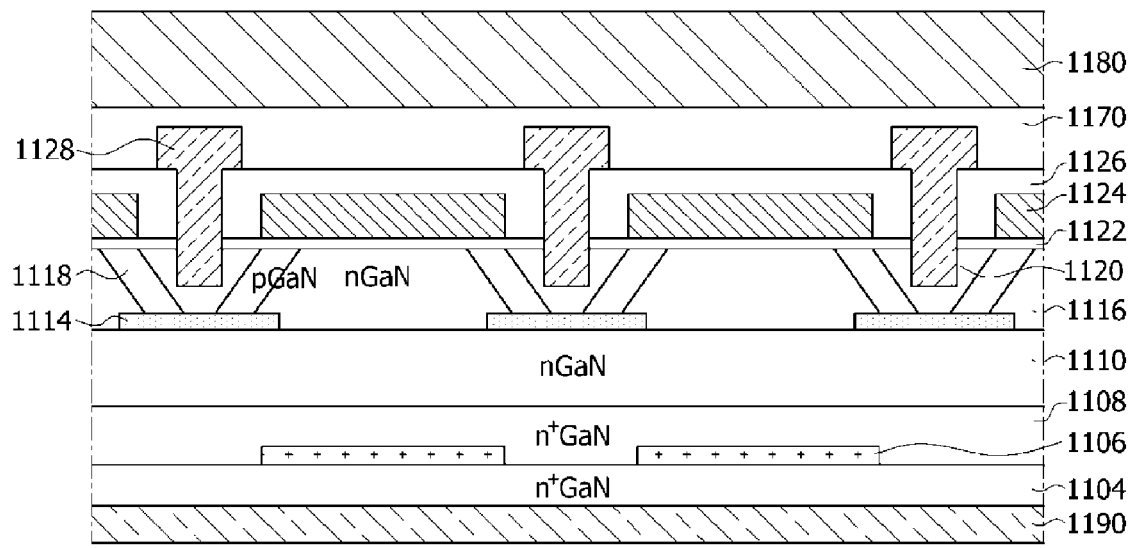

FIG. 61, FIG. 62, and FIG. 63 are cross-sectional views illustrating another method of fabricating the vertical gallium nitride transistor shown in FIG. 47. In FIG. 61, FIG. 62, and FIG. 63, the same reference numerals as described in the previous exemplary embodiment illustrated in FIGS. 49 60 denote the same elements. Accordingly, to avoid duplicate explanation, descriptions of the same elements as set forth in the previous exemplary embodiment will be omitted or briefly mentioned in this exemplar embodiment. According to the present exemplary embodiment, a drain electrode may be formed to be opposite to source electrodes. First, the same processes as described with reference to FIGS. 49 to 59 may be performed. Subsequently, as illustrated in FIGS. 61 and 62, an insulation layer 1170 may be formed to cover the source electrodes 1128 and the insulation layer 1126, and a support substrate 1180 may be attached to a surface of the insulation layer 1170 opposite to the substrate 1102. The support substrate 1180 may be a silicon substrate or a metal substrate. After the support substrate 1180 is attached to the insulation layer 1170, the substrate 1102 may be removed. In one exemplary embodiment, the substrate 1102 may be removed using a laser lift-off process. Specifically, a laser beam may be irradiated onto a bottom surface of the substrate 1102, as indicated by arrows. The laser beam may penetrate the substrate 1102 to reach a bottom surface of the buffer layer 1104. The bottom surface of the buffer layer 1104 may be expanded and damaged by the laser beam. As a result, the substrate 1102 may be lifted off and detached from the buffer layer 1104. Subsequently, as illustrated in FIG. 63, a drain electrode 1190 may be formed on the bottom surface of the buffer layer 1104. Before the drain electrode 1190 is formed, the damaged bottom surface of the buffer layer 1104 may be cured. For example, the damaged bottom surface of the buffer layer 1104 may be cured by an annealing process. In one exemplary embodiment, the annealing process may be performed after removal of a damage layer of the buffer layer 1104.

Figure 64:
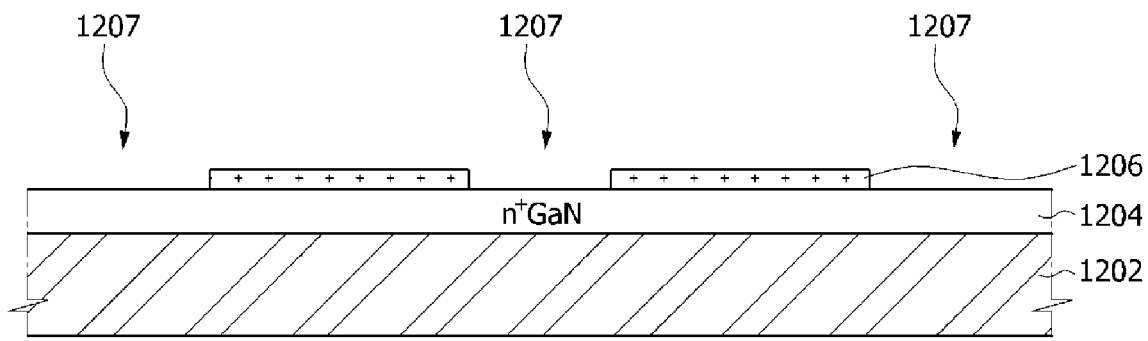
FIGS. 64 to 75 are cross-sectional views illustrating a method of fabricating the vertical gallium nitride transistor shown in FIG. 48.

FIGS. 64 to 75 are cross-sectional views illustrating a method of fabricating the vertical gallium nitride transistor shown in FIG. 48. Referring to FIG. 64, a buffer layer 1204 may be formed on a substrate 1202. The substrate 1202 may be used as a seed layer for growing the buffer layer 1204. In one exemplary embodiment, the substrate 1202 may be a sapphire substrate. The buffer layer 1204 may be formed of an N-type GaN layer. The N-type GaN layer corresponding to the buffer layer 1204 may be formed using an MOCVD process, an MBE process, or an HVPE process. Subsequently, a mask layer may be formed on the buffer layer 1204 and the mask layer may be patterned to form mask patterns 1206. The mask patterns 1206 may act as a mask for an epitaxial lateral overgrowth (ELO) performed in a subsequent process. In one exemplary embodiment, the mask patterns 1206 may be formed of a silicon oxide layer. In such a case, the mask patterns 1206 may be formed to have stripe pattern shapes which are parallel with a <11-00> orientation or a <112-0> orientation. The mask patterns 1206 may be formed to have openings 1207 that expose portions of the buffer layer 1204.

Figure 65:
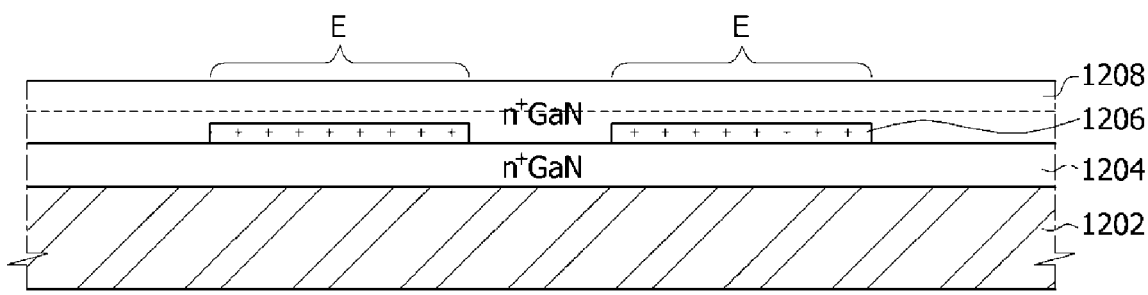

Referring to FIG. 65, a GaN layer 1208 may be formed on the exposed portions of the buffer layer 1204. The GaN layer 1208 may be formed to have an N-type. In one exemplary embodiment, the GaN layer 1208 may be formed to have an impurity concentration of at least about $1 \times 10^{18}/cm^3$. The GaN layer 1208 may be grown using the exposed portions of the buffer layer 1204 as seed layers. In particular, the GaN layer 1208 may be vertically and laterally grown on the mask patterns 1206. Thus, the GaN layer 1208 in regions "E" on the mask patterns 1206 may be formed to have a relatively low density of vertical threading dislocations. In one exemplary embodiment, the GaN layer 1208 may be removed by a predetermined thickness to still remain a thin GaN layer on the mask patterns 1206 (see a dotted line in FIG. 65).

Figure 66:
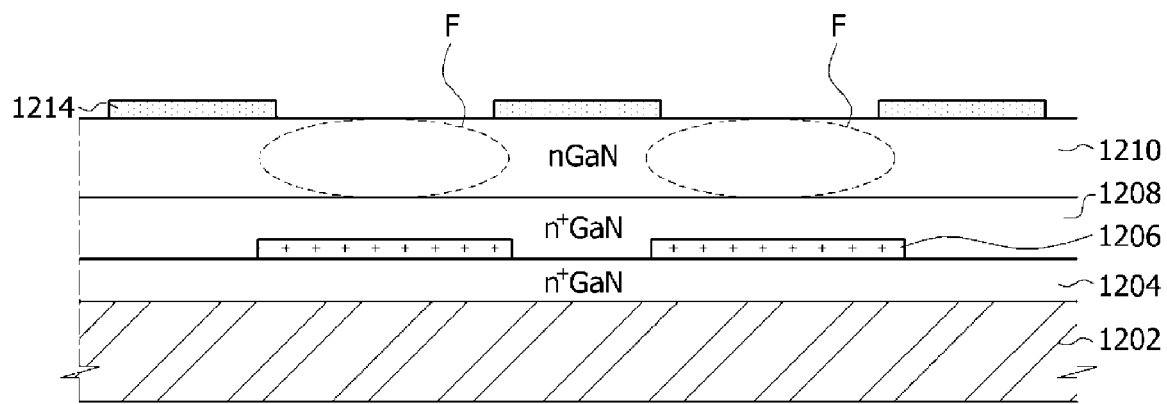

Referring to FIG. 66, a first drift layer 1210 may be formed on the GaN layer 1208. The first drift layer 1210 may be formed of an N-type GaN layer. Portions of the GaN layer 1208 vertically overlapping with the mask patterns 1206 may have a relatively low density of vertical threading dislocations, as described above. Thus, portions "F" of the first drift layer 1210 vertically overlapping with the mask patterns 1206 may also have a relatively low density of vertical threading dislocations. Subsequently, a current blocking layer may be formed on the first drift layer 1210 and the current blocking layer may be patterned to form current blocking patterns 1214. The current blocking patterns 1214 may act as a mask for an epitaxial lateral overgrowth (ELO) performed in a subsequent process. The current blocking patterns 1214 may be formed of a silicon oxide layer. In such a case, the current blocking patterns 1214 may be formed to have stripe pattern shapes which are parallel with a <11-00> orientation or a <112-0> orientation. The current blocking patterns 1214 may be formed to have openings 1215 that expose portions of the first drift layer 1210. The exposed portions of the first drift layer 1210 may correspond to the portions "F" that have a relatively low density of vertical threading dislocations.

Figure 67:
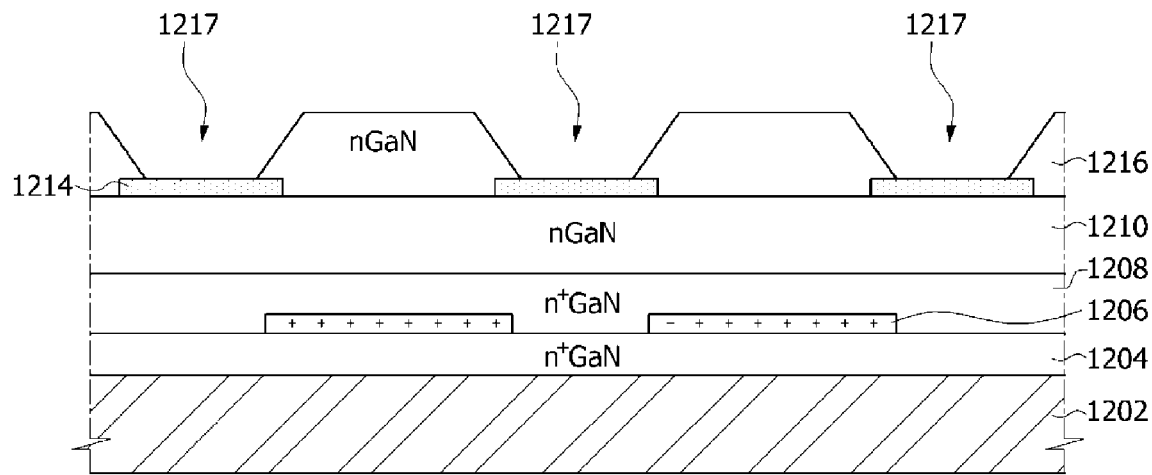

Referring to FIG. 67, second drift layers 1216 may be formed on respective ones of the exposed portions of the first drift layer 1210. The second drift layers 1216 may be formed of an N-type GaN layer. In such a case, the second drift layers 1216 may be formed such that an impurity concentration of the second drift layers 1216 is lower than that of the first drift layer 1210. The second drift layers 1216 may be vertically grown on the first drift layer 1210 at an initial stage. After the second drift layers 1216 are vertically grown to have the same thickness as the current blocking patterns 1214, the second drift layers 1216 may be vertically and laterally grown to cover edges of the current blocking patterns 1214. Thus, the second drift layers 1216 may be formed to have openings 1217 that expose central portions of the current blocking patterns 1214. The second drift layers 1216 may be grown using the portions "F" of the first drift layer 1210 as seed layers. Thus, the second drift layers 1216 may also be grown to have a relatively low density of vertical threading dislocations.

Figure 68:
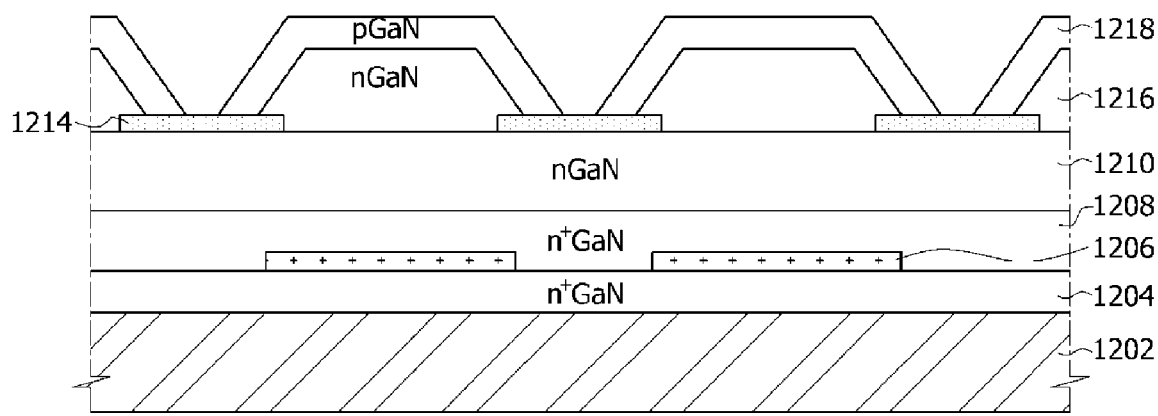

Referring to FIG. 68, channel layers 1218 may be formed on respective ones of the second drift layers 1216. The channel layers 1218 may be formed of a P-type GaN layer. The channel layers 1218 may be formed to still expose the central portions of the current blocking patterns 1214. In one exemplary embodiment, the channel layers 1218 may be doped with boron (B) ions, arsenic (As) ions, phosphorus (P) ions or magnesium (Mg) ions to have a P-type.

Figure 69:
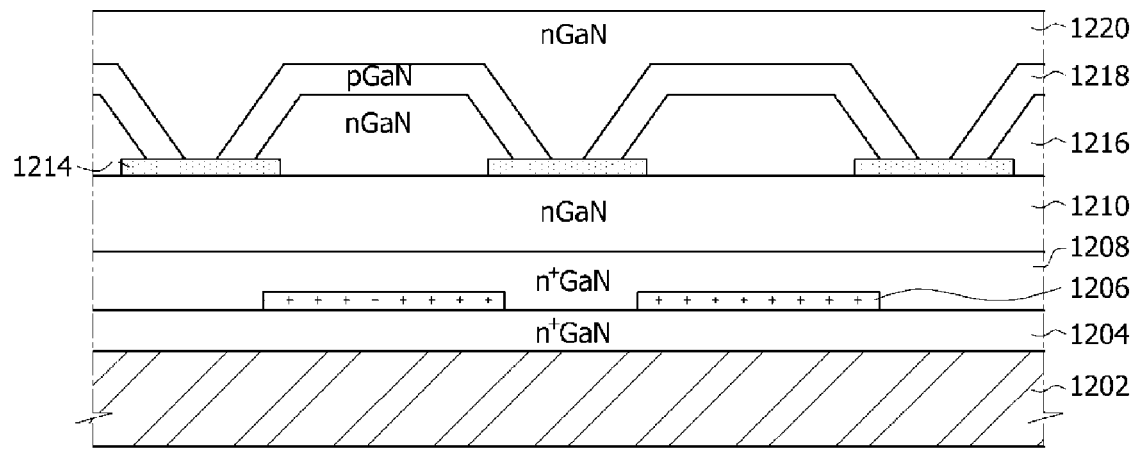

Referring to FIG. 69, a donor layer 1220 may be formed on the current blocking patterns 1214 and the channel layers 1218. The donor layer 1220 may be formed of an N-type GaN layer. The donor layer 1220 may be formed to a sufficient thickness to completely cover the current blocking patterns 1214 and the channel layers 1218.

Figure 70:
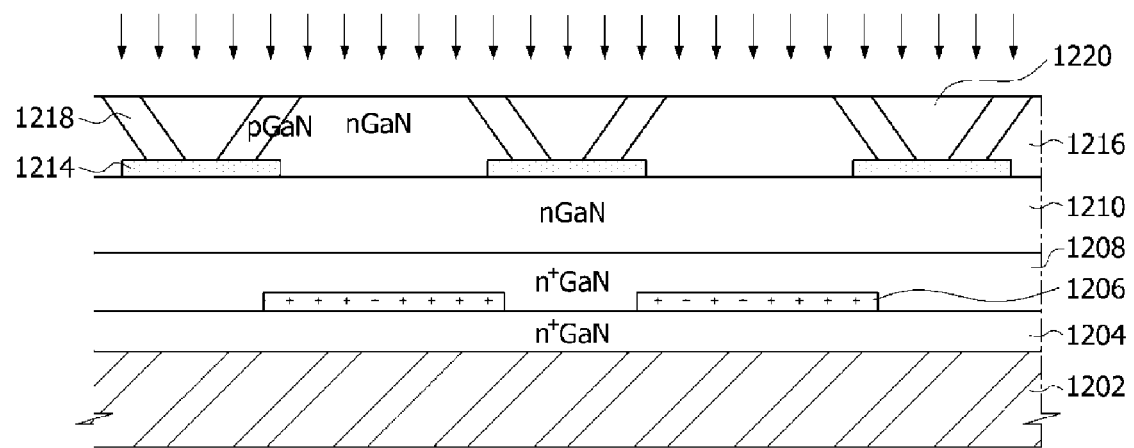

Referring to FIG. 70, the donor layer 1220 may be etched back or planarized until top surfaces of the second drift layers 1216 are exposed. As a result, a single donor layer 1220 and a single channel layer 1218 surrounding sidewalls of the single donor layer 1220 may be formed on each current blocking pattern 1214.

Figure 71:
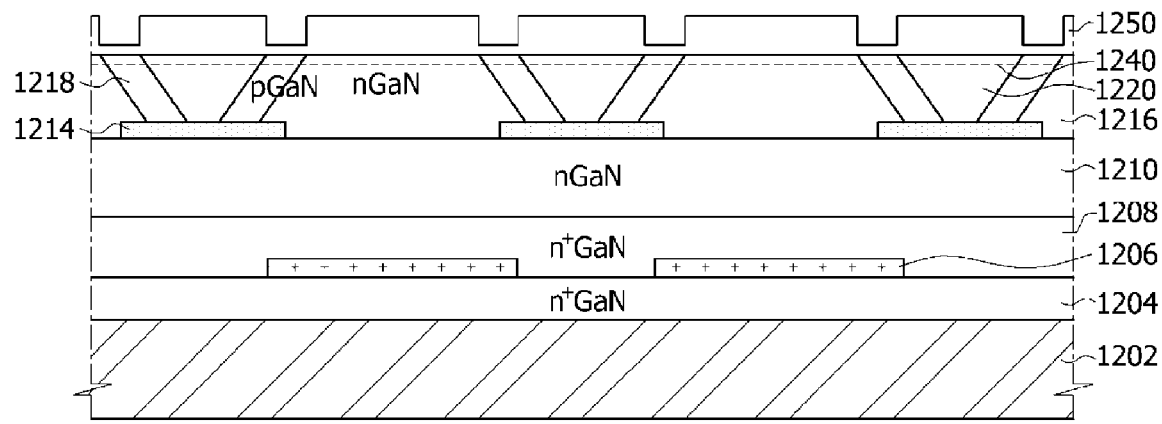

Referring to FIG. 71, a heterogeneous semiconductor layer 1250 may be formed on the donor layers 1220, the channel layers 1218 and the second drift layer 1216. The heterogeneous semiconductor layer 1250 may be formed to induce a two dimension electron gas (2DEG) at a top surface of the second drift layer 1216. When the second drift layer 1216 is formed of a GaN layer, the heterogeneous semiconductor layer 1250 may be formed of an aluminum gallium nitride (AlGaN) layer. Portions of the heterogeneous semiconductor layer 1250 may be selectively etched to reduce a thickness thereof. Specifically, portions of the heterogeneous semiconductor layer 1250 on the top surfaces of the channel layers 1218 may be selectively etched by a predetermined thickness. A thickness of the remaining heterogeneous semiconductor layer 1250 on the top surfaces of the channel layers 1218 may be appropriately determined to disturb that the two dimension electron gas (2DEG) regions are formed at the top surfaces of the channel layers 1218. The portions of the heterogeneous semiconductor layer 1250 on the top surfaces of the channel layers 1218 may be selectively etched using a photolithography process and an etch process. In one exemplary embodiment, the portions of the heterogeneous semiconductor layer 1250 on the top surfaces of the channel layers 1218 may be selectively etched to expose the top surfaces of the channel layers 1218.

Figure 72:
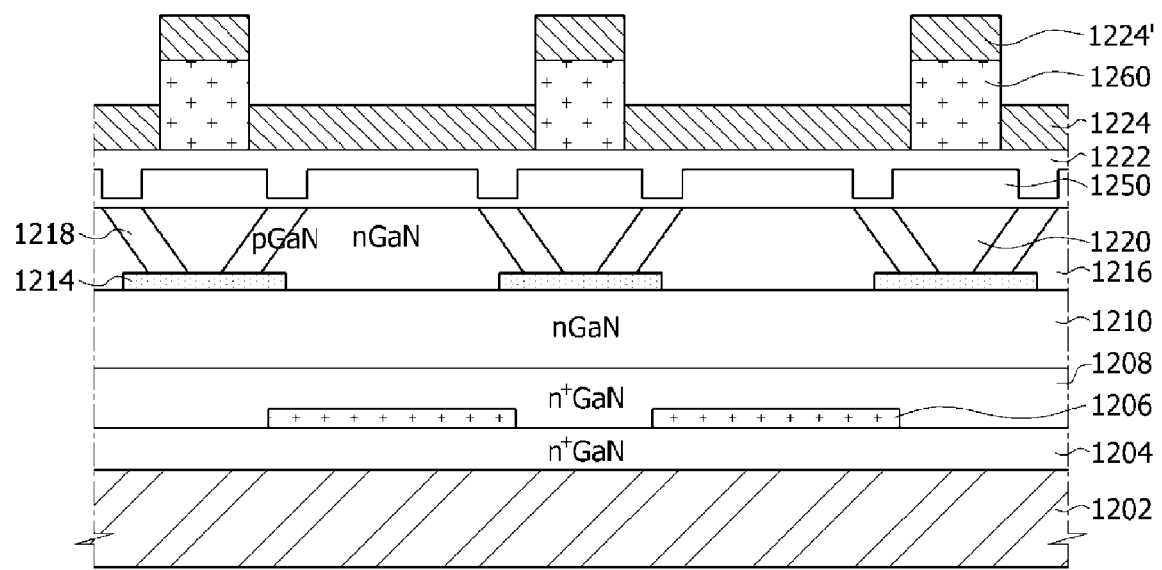

Referring to FIG. 72, a gate insulation layer 1222 may be formed on a top surface of the heterogeneous semiconductor layer 1250. In one exemplary embodiment, the gate insulation layer 1222 may be formed of a silicon oxide ($SiO_2$) layer. In such a case, the silicon oxide ($SiO_2$) layer correspond to the gate insulation layer 1222 may be formed using a deposition process such as a chemical vapor deposition (CVD) process. Subsequently, resist patterns 1260 may be formed on the gate insulation layer 1222. The resist patterns 1260 may be formed to perform a subsequent lift-off process. In one exemplary embodiment, other material patterns may be formed instead of the resist patterns 1260. Subsequently, a metal layer may be deposited on a surface of the substrate including the resist patterns 1260. The metal layer may be deposited to a thickness which is less than a thickness of the resist patterns 1260. In such a case, the metal layer may be formed to include metal patterns 1224' deposited on top surfaces of the resist patterns 1260 and metal patterns 1224 deposited on exposed portions of the gate insulation layer 1222.

Figure 73:
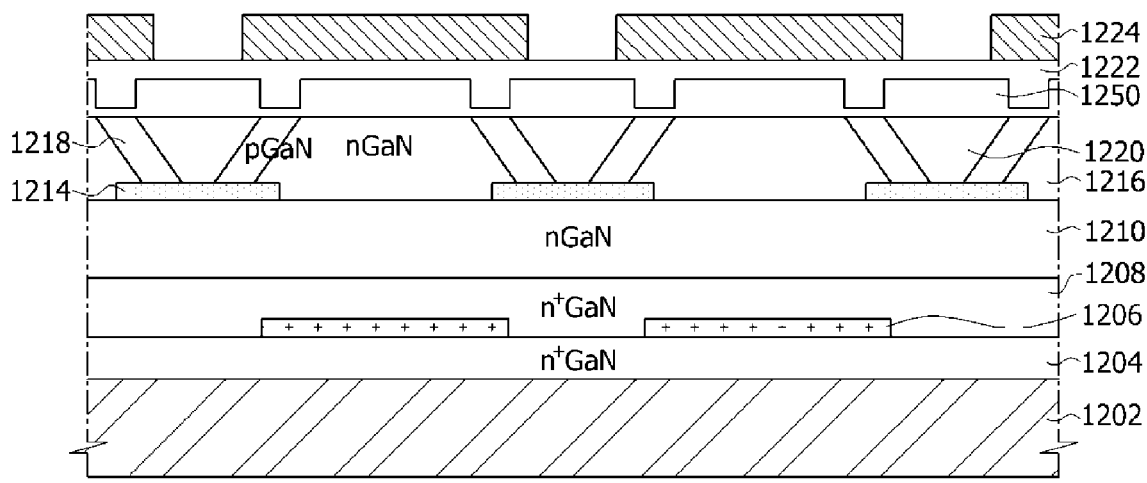

Referring to FIG. 73, the resist patterns 1260 may be removed. The resist patterns 1260 may be removed using an ashing process. When the resist patterns 1260 are removed, the metal patterns 1224' on the resist patterns 1260 may also be removed. Thus, the metal patterns 1224 on the gate insulation layer 1222 may remain to act as gate electrodes.

Figure 74:
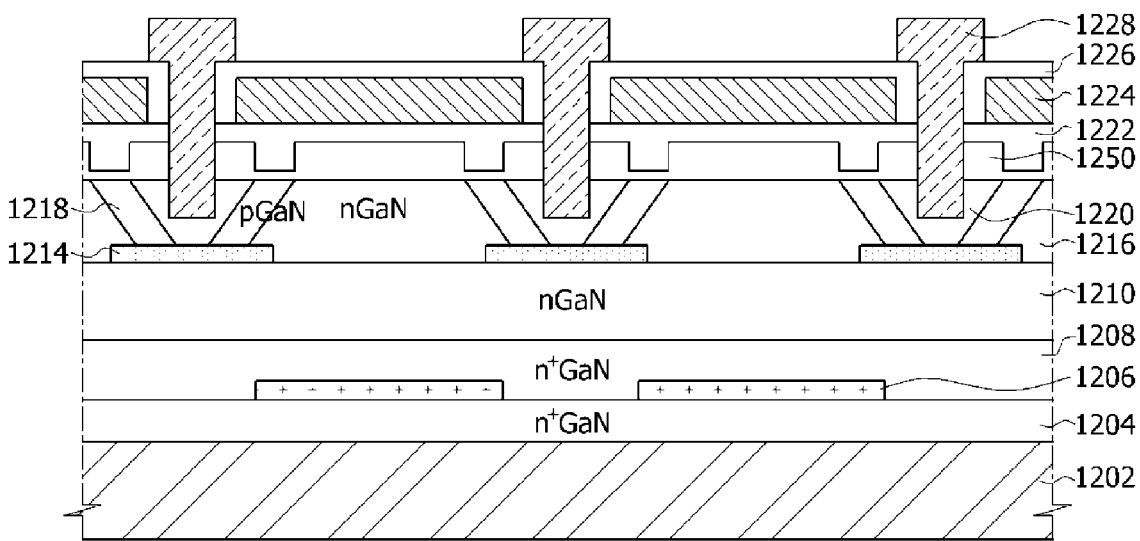

Referring to FIG. 74, an insulation layer 1226 may be formed on the gate electrodes 1224 and the gate insulation layer 1222. Subsequently, the insulation layer 1226, the gate insulation layer 1222, and the heterogeneous semiconductor layer 1250 may be etched to expose the donor layers 1220. The exposed donor layers 1220 may be additionally etched to form contact holes. A metal layer may then be formed on the insulation layer 1226 to fill the contact holes, and the metal layer may be patterned to form source electrodes 1228 on the respective ones of the donor layers 1220. In one exemplary embodiment, the contact holes may be formed to expose the channel layers 1218. In such a case, the source electrodes 1228 may be formed to directly contact the channel layers 1218.

Figure 75:
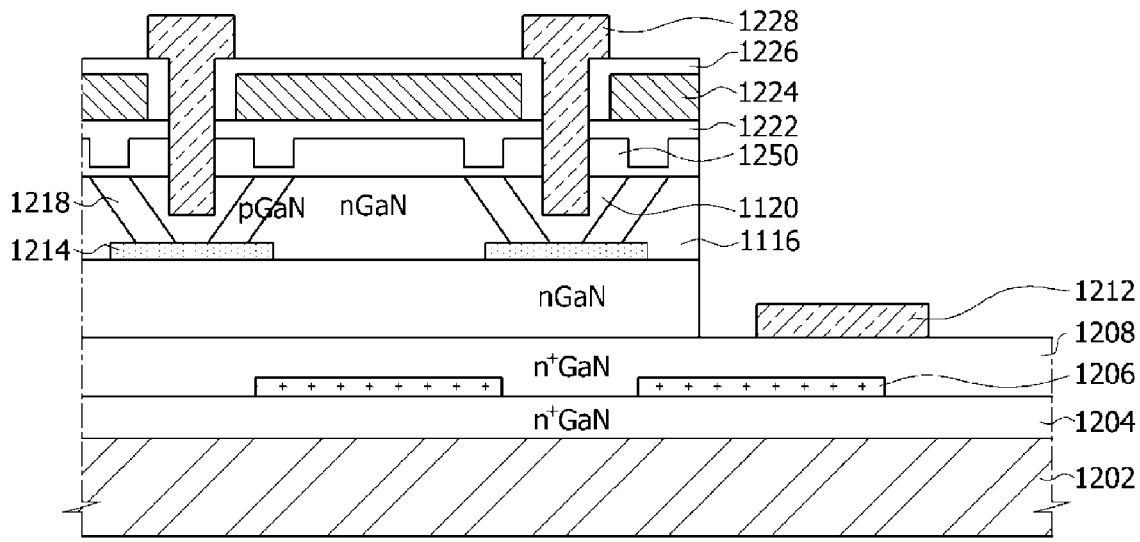

Referring to FIG. 75, a portion of the resultant including the source electrodes 1228 may be removed to expose a portion of the GaN layer 1208. The portion of the resultant including the source electrodes 1228 may be removed using a photolithography process and an etch process. A drain electrode 1212 may be formed on the exposed portion of the GaN layer 1208.

Figure 76:
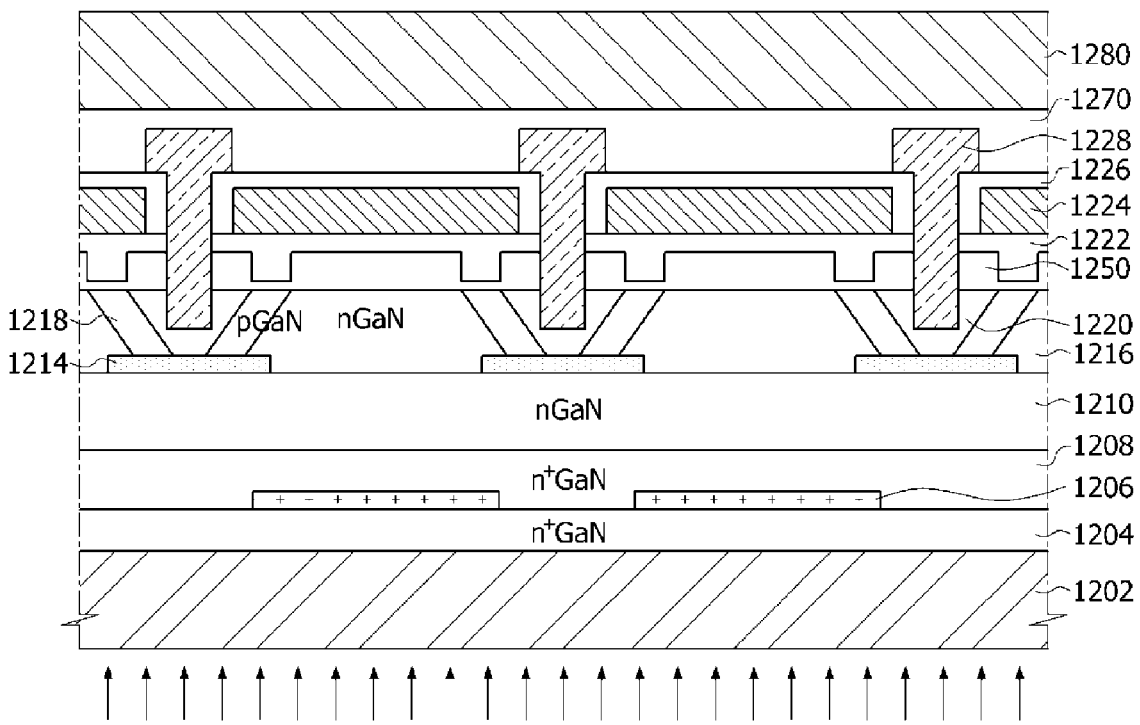
FIG. 76, FIG. 77, and FIG. 78 are cross-sectional views illustrating another method of fabricating a vertical gallium nitride transistor shown in FIG. 48.
Figure 77:
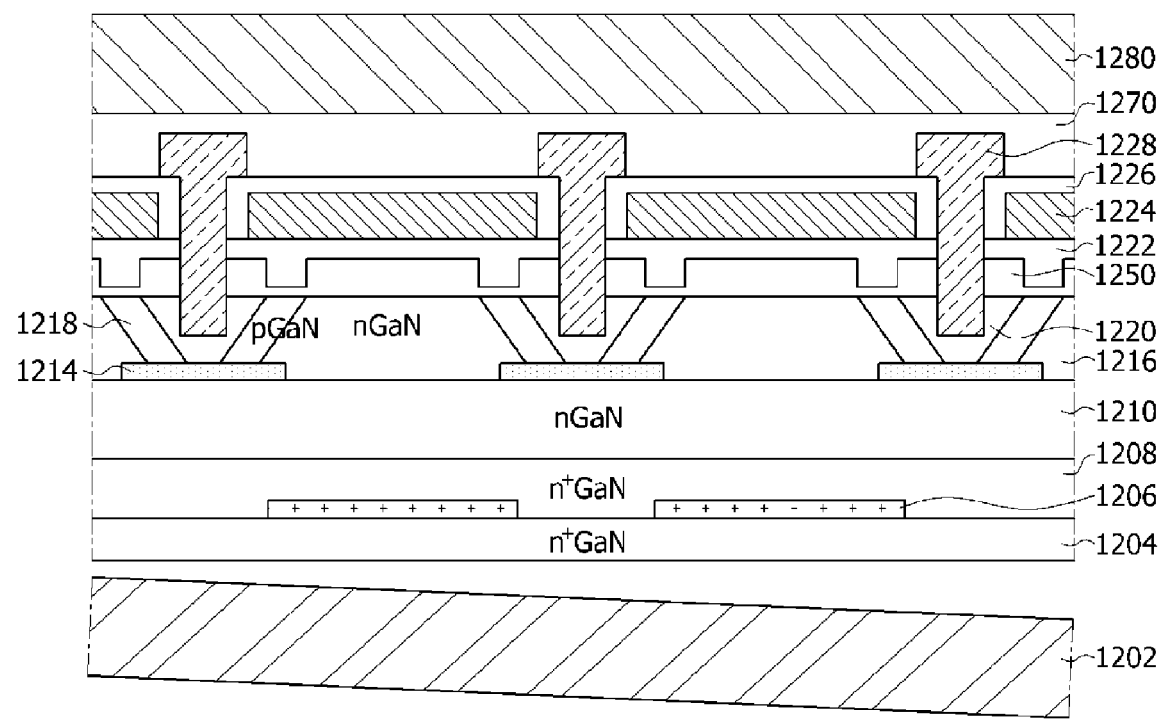
Figure 78:
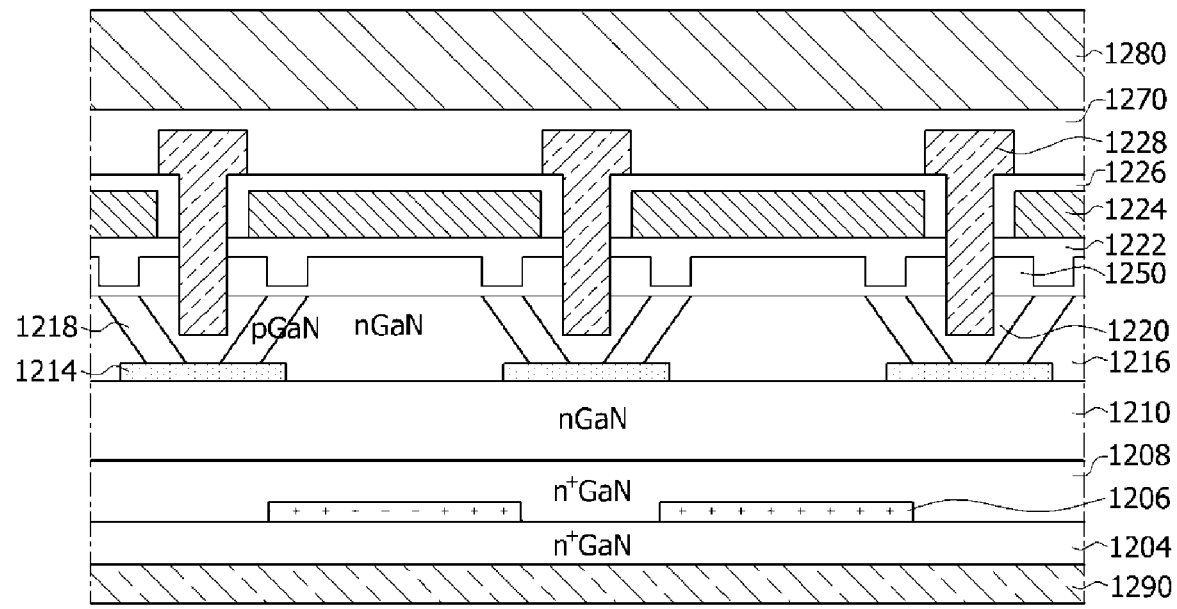
Figure 79:
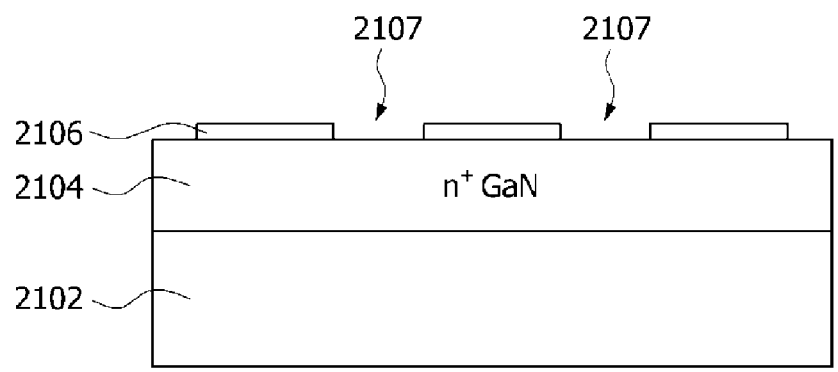
FIGS. 79 to 92 are cross-sectional views illustrating a method of fabricating a vertical gallium nitride transistor according to an exemplary embodiment of the present invention.

FIG. 76, FIG. 77, and FIG. 78 are cross-sectional views illustrating another method of fabricating the vertical gallium nitride transistor shown in FIG. 48. In FIG. 76, FIG. 77, and FIG. 78, the same reference numerals as described in the previous exemplary embodiment illustrated in FIGS. 64 to 75 denote the same elements. Accordingly, to avoid duplicate explanation, descriptions of the same elements as set forth in the previous exemplary embodiment will be omitted or briefly mentioned in this embodiment. According to the present exemplary embodiment, a drain electrode may be formed to be opposite to source electrodes. First, the same processes as described with reference to FIGS. 64 to 74 may be performed. Subsequently, as illustrated in FIGS. 76 and 77, an insulation layer 1270 may be formed to cover the source electrodes 1228 and the insulation layer 1226, and a support substrate 1280 may be attached to a surface of the insulation layer 1270 opposite to the substrate 1202. The support substrate 1280 may be a silicon substrate or a metal substrate. After the support substrate 1280 is attached to the insulation layer 1270, the substrate 1202 may be removed. In one exemplary embodiment, the substrate 1202 may be removed using a laser lift-off process. Specifically, a laser beam may be irradiated onto a bottom surface of the substrate 1202, as indicated by arrows. The laser beam may penetrate the substrate 1202 to reach a bottom surface of the buffer layer 1204. The bottom surface of the buffer layer 1204 may be expanded and damaged by the laser beam. As a result, the substrate 1202 may be lifted off and detached from the buffer layer 1204. Subsequently, as illustrated in FIG. 78, a drain electrode 1290 may be formed on the bottom surface of the buffer layer 1204. Before the drain electrode 1290 is formed, the damaged bottom surface of the buffer layer 1204 may be cured. For example, the damaged bottom surface of the buffer layer 1204 may be cured by an annealing process. In one exemplary embodiment, the annealing process may be performed after removal of a damage layer of the buffer layer 1204.

FIGS. 79 to 92 are cross-sectional views illustrating a method of fabricating a vertical gallium nitride transistor according to an exemplary embodiment of the present invention. Referring to FIG. 8079 a sacrificial layer 2104, for example, a first GaN layer, may be formed on a first substrate 2102. The first substrate 2102 may act as a substrate for growing the first GaN layer 2104. In one exemplary embodiment, the first substrate 2102 may be a sapphire substrate. The first GaN layer 2104 may be formed using an MOCVD process, an MBE process, or an HVPE process. In one exemplary embodiment, the first GaN layer 2104 may be formed to have an N-type. Subsequently, a mask layer may be formed on the first GaN layer 2104 and the mask layer may be patterned to form mask patterns 2106. The mask patterns 2106 may act as a mask for an epitaxial lateral overgrowth (ELO) performed in a subsequent process. In one exemplary embodiment, the mask patterns 2106 may be formed of a silicon oxide layer. The mask patterns 2106 may be formed to have openings 2107 that expose portions of the first GaN layer 2104.

Figure 80:
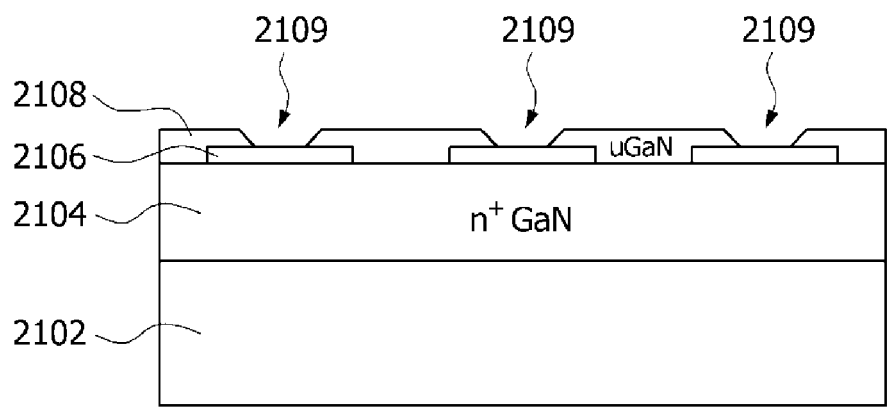

Referring to FIG. 80, second GaN layers 2108 may be grown on respective ones of the exposed portions of the first GaN layer 2104. In one exemplary embodiment, the second GaN layer 2108 may be formed of an undoped GaN layer. The second GaN layers 2108 may be vertically grown on the exposed portions of the first GaN layer 2104 at an initial stage. After the second GaN layers 2108 are vertically grown to have the same thickness as the mask patterns 2106, the second GaN layers 2108 may be vertically and laterally grown to cover edges of the mask patterns 2106. Thus, the second GaN layers 2108 may be formed to have openings 2109 that expose central portions of the mask patterns 2106.

Figure 81:
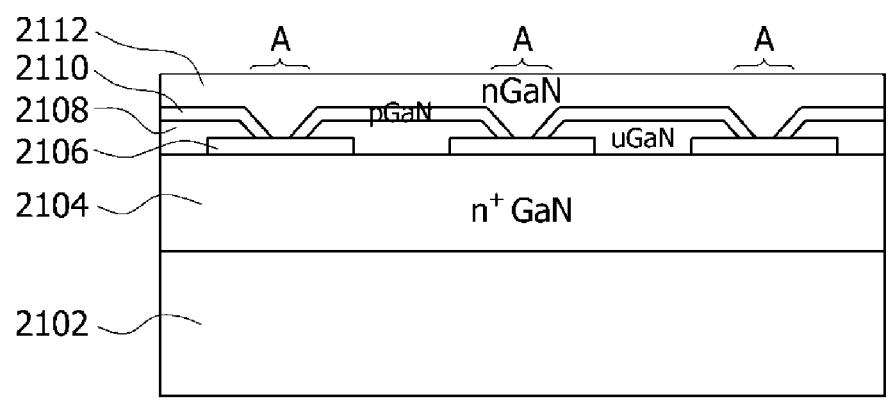

Referring to FIG. 81, third GaN layers 2110 may be grown on respective ones of the second GaN layers 2108. The third GaN layers 2110 may act as channel modulation layers having a P-type. The third GaN layers 2110 may be doped with P-type impurities, for example, boron (B) ions, arsenic (As) ions, phosphorus (P) ions or magnesium (Mg) ions. The third GaN layers 2110 may be vertically grown on top surfaces of the second GaN layers 2108 and may be laterally grown on sidewalls of the second GaN layers 2108. Thus, the third GaN layers 2110 may be formed to extend onto the top surfaces of the mask patterns 2106. The third GaN layers 2110 may be formed to still expose central portions of the mask patterns 2106. Subsequently, a fourth GaN layer 2112 may be grown on the third GaN layers 2110. The fourth GaN layer 2112 may act as a portion of a drift layer. In one exemplary embodiment, the fourth GaN layer 2112 may be formed to have an N-type. The fourth GaN layer 2112 may be vertically grown on top surfaces of the third GaN layers 2110 and may be laterally grown on sidewalls of the third GaN layers 2110. Thus, the fourth GaN layer 2112 may be grown to completely cover the mask patterns 2106. In particular, carriers may be vertically drifted through regions "A" of the fourth GaN layer 2112, and the regions "A" of the fourth GaN layer 2112 may be formed by lateral growth. Thus, formation of vertical threading dislocations (TD) may be suppressed in the regions "A" of the fourth GaN layer 2112. That is, the regions "A" of the fourth GaN layer 2112 may have a relatively low density of the vertical threading dislocations (TD).

Figure 82:
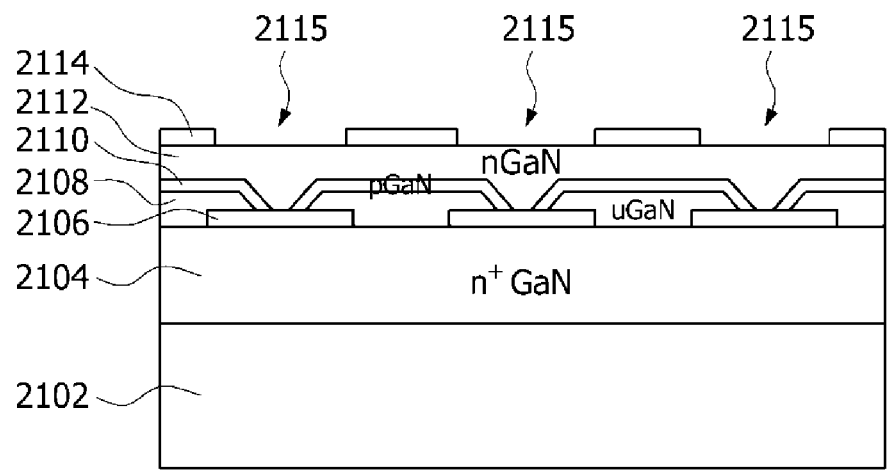

Referring to FIG. 82, current blocking patterns 2114 may formed on the fourth GaN layer 2112. In one exemplary embodiment, the current blocking patterns 2114 may be formed of a silicon oxide layer. Alternatively, the current blocking patterns 2114 may be formed of a P-type semiconductor layer. The current blocking patterns 2114 may be formed to have openings 2115 that expose portions of the fourth GaN layer 2112. The current blocking patterns 2114 may be formed to vertically overlap with the second GaN layers 2108 disposed between the mask patterns 2106.

Figure 83:
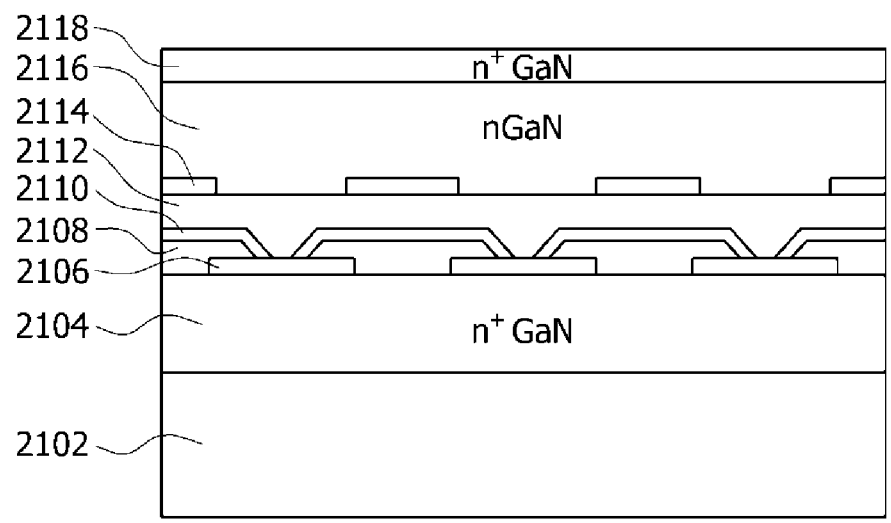

Referring to FIG. 83, a fifth GaN layer 2116 may be formed to cover the current blocking patterns 2114 and the fourth GaN layer 2112. The fifth GaN layer 2116 may be vertically grown on the exposed portions of the fourth GaN layer 2112 at an initial stage. After the fifth GaN layer 2116 is vertically grown to have the same thickness as the current blocking patterns 2114, the fifth GaN layer 2116 may be laterally grown to cover the current blocking patterns 2114. In one exemplary embodiment, the fifth GaN layer 2116 may be grown to have an N-type. The fourth and fifth GaN layers 2112 and 2116 may act as a drift layer. A sixth GaN layer 2118 may be formed on the fifth GaN layer 2116. The sixth GaN layer 2118 may be formed to have an N-type. In such a case, the sixth GaN layer 2118 may be formed to have an impurity concentration which is higher than that of the fifth GaN layer 2116.

Figure 84:
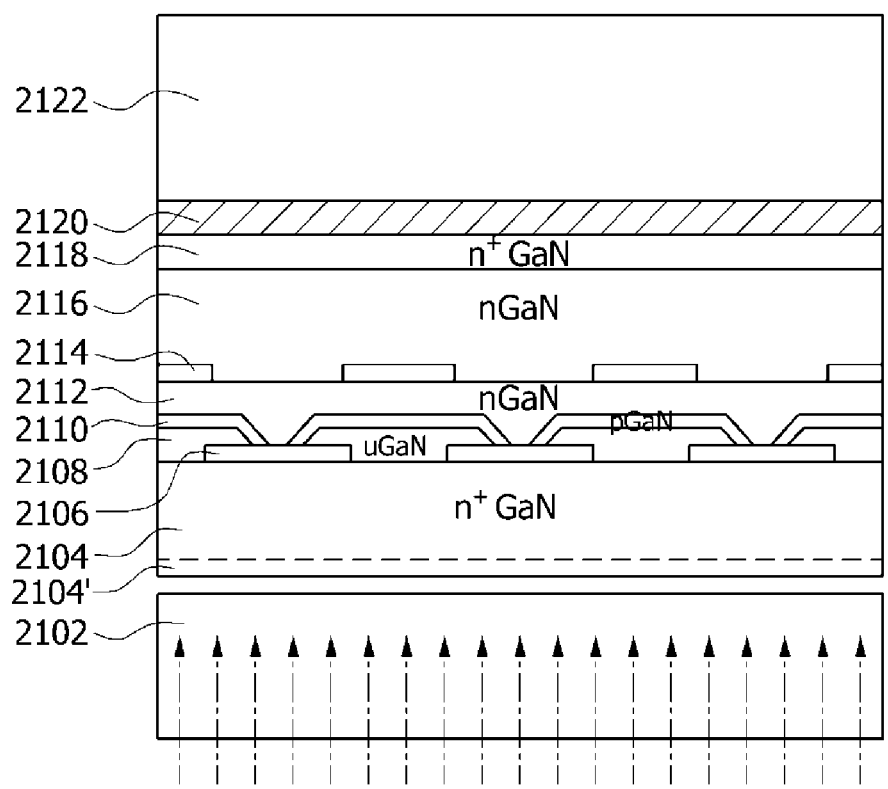

Referring to FIG. 84, a drain electrode layer 2120 may be formed on the sixth GaN layer 2118. The drain electrode layer 2120 may be formed of a metal layer. Subsequently, a second substrate 2122 may be attached to the drain electrode layer 2120. The second substrate 2122 may act as a support substrate. The second substrate 2122 may be a silicon substrate or a metal substrate. After the second substrate 2122 is attached to the drain electrode layer 2120, the first substrate 2102 may be removed. In one exemplary embodiment, the first substrate 2102 may be removed using a laser lift-off process. Specifically, a laser beam may be irradiated onto a bottom surface of the first substrate 2102, as indicated by arrows. The laser beam may penetrate the first substrate 2102 to reach a bottom surface of the first GaN layer 2104. The bottom surface of the first GaN layer 2104 may be expanded and damaged by the laser beam to produce a damage layer 2104'. As a result, the first substrate 2102 may be lifted off and detached from the first GaN layer 2104 by the damage layer 2104'.

Figure 85:
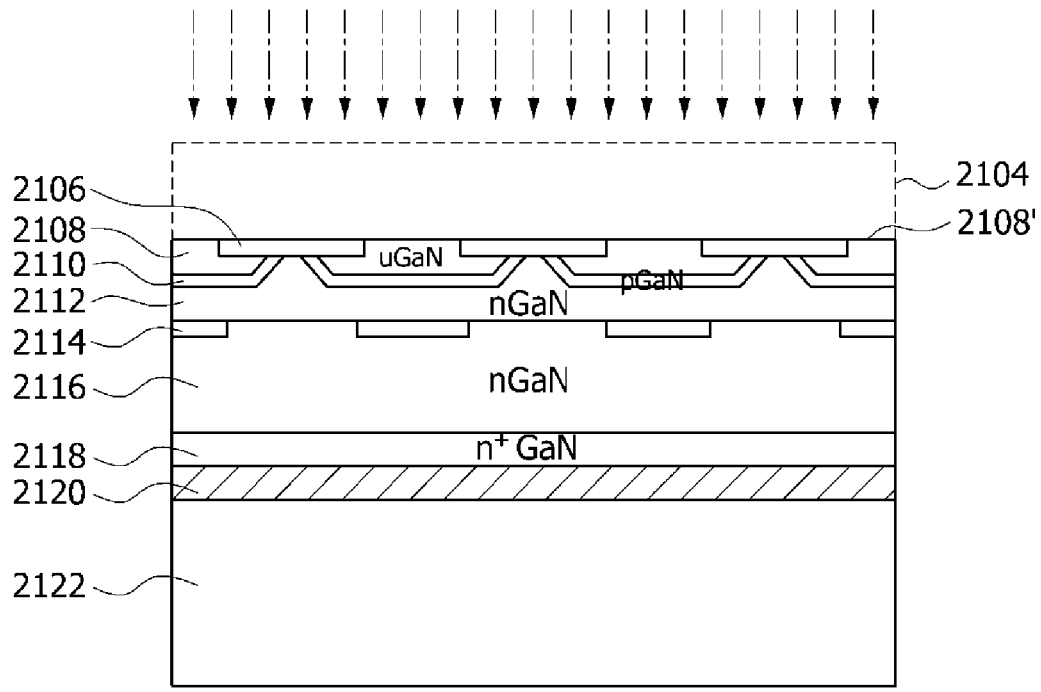

Referring to FIG. 85, after the first substrate 2102 is removed, the remaining resultant including the second substrate 2122 may be flipped or turned over. As a result, the first GaN layer 2104 may be disposed over the second substrate 2122, as illustrated in FIG. 85. Subsequently, the first GaN layer 2104 may be removed. The first GaN layer 2104 may be removed using an anisotropic etch process, for example, a reactive ion etching (RIE) process, as indicated by arrows. After the first GaN layer 2104 is removed, surfaces of the mask patterns 2106 and first surfaces 2108' the second GaN layers 2108 between the mask patterns 2106 may be exposed.

Figure 86:
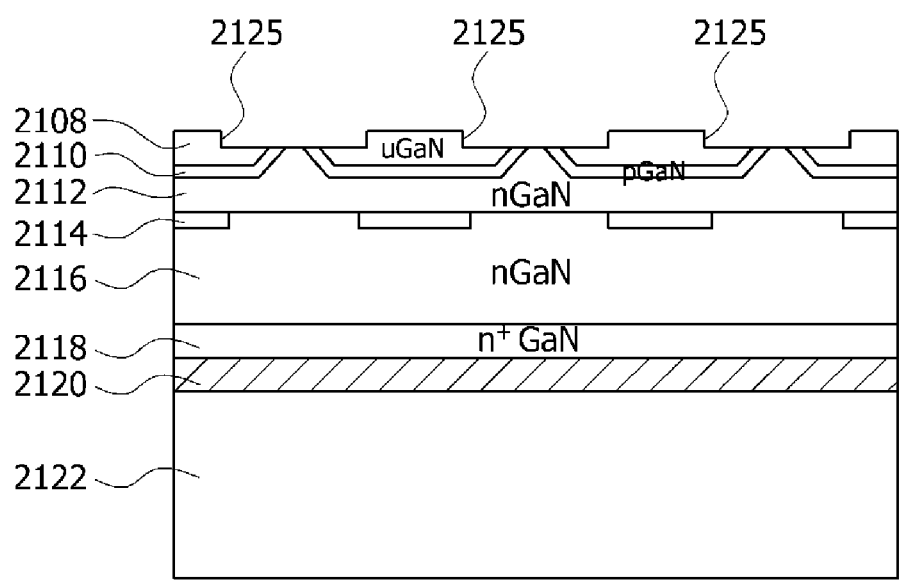

Referring to FIG. 86, the mask patterns 2106 may be removed to form recessed regions 2125. In the event that the mask patterns 2106 are formed of a silicon oxide layer, the mask patterns 2106 may be removed using an oxide etchant. Portions of the second GaN layers 2108, top surfaces of the third GaN layers 2110, and portions of the fourth GaN layer between the third GaN layers 2110 may be exposed by the recessed regions 2125.

Figure 87:
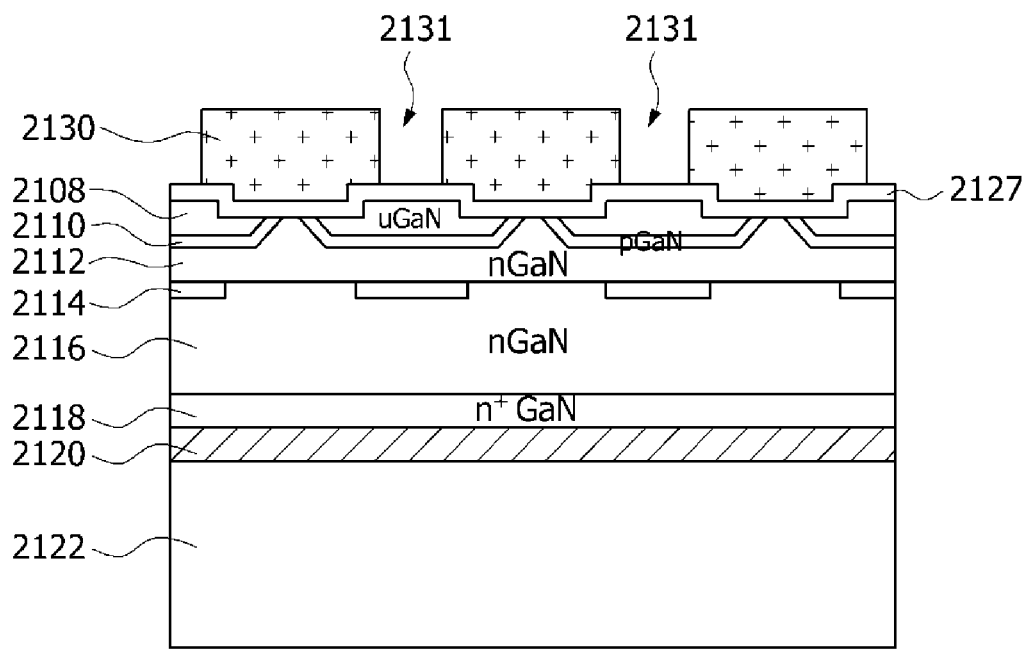

Referring to FIG. 87, a gate insulation layer 2127 may be formed on the second GaN layers 2108 including the recessed regions 2125. Subsequently, etch mask patterns 2130 may be formed on the gate insulation layer 2127. In one exemplary embodiment, the etch mask patterns 2130 may be formed of a photoresist layer. The etch mask patterns 2130 may be formed to include openings 2131 that expose portions of the gate insulation layer 2127. The etch mask patterns 2130 may be formed such that the openings 2131 of the etch mask patterns 2130 vertically overlap with respective ones of the current blocking patterns 2114.

Figure 88:
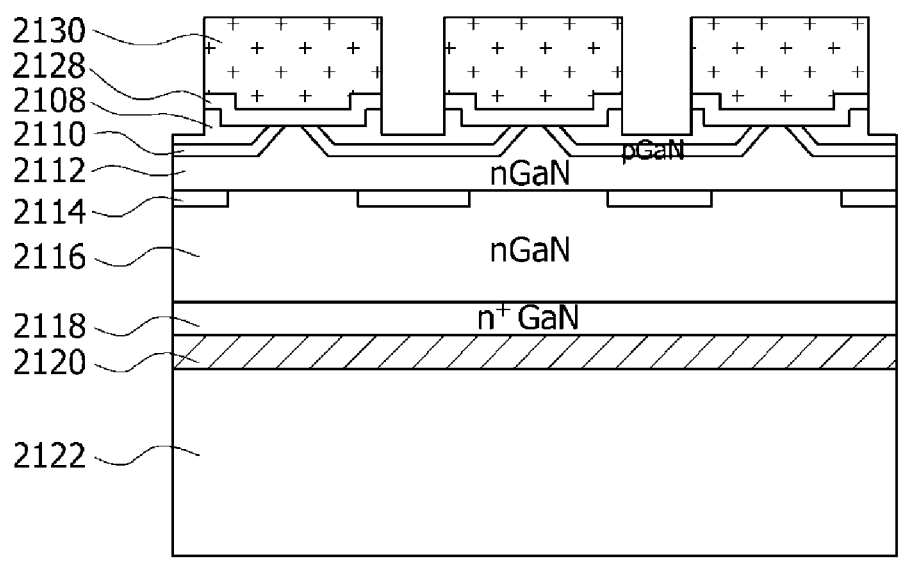

Referring to FIG. 88, the gate insulation layer 2127 and the second GaN layers 2108 may be etched using the etch mask patterns 2130 as etch masks. As a result, gate insulation patterns 2128 may be formed under the etch mask patterns 2130 and portions of the second GaN layers 2108 may be exposed by openings between the gate insulation patterns 2128. After the gate insulation patterns 2128 are formed, the etch mask patterns 2130 may be removed. In the event that the etch mask patterns 2130 are formed of a photoresist layer, the etch mask patterns 2130 may be removed using a photoresist strip process, for example, an ashing process. After the etch mask patterns 2130 are removed, an activation process may be applied to the third GaN layers 2110 functioning as channel modulation layers. In one exemplary embodiment, the activation process may be performed using a nitrogen gas as an ambient gas at a temperature of about 600 degrees Celsius for about 20 minutes. Alternatively, the activation process may be performed using a laser annealing process.

Figure 89:
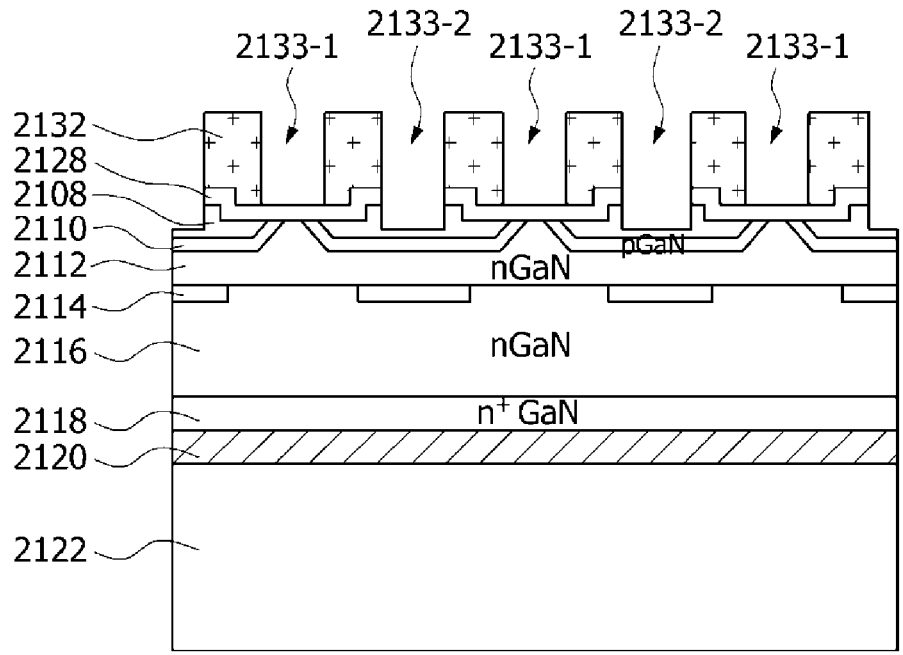

Referring to FIG. 89, lift-off mask patterns 2132 may be formed on the gate insulation patterns 2128. In one exemplary embodiment, the lift-off mask patterns 2132 may be formed of a photoresist layer. The lift-off mask patterns 2132 may be formed to have first openings 2133-1 and second openings 2133-2. The first openings 2133-1 may expose central regions of the gate insulation patterns 2128, and the second openings 2133-2 may expose portions of the second GaN layers 2108. The first openings 2133-1 and the second openings 2133-2 may be alternately disposed.

Figure 90:
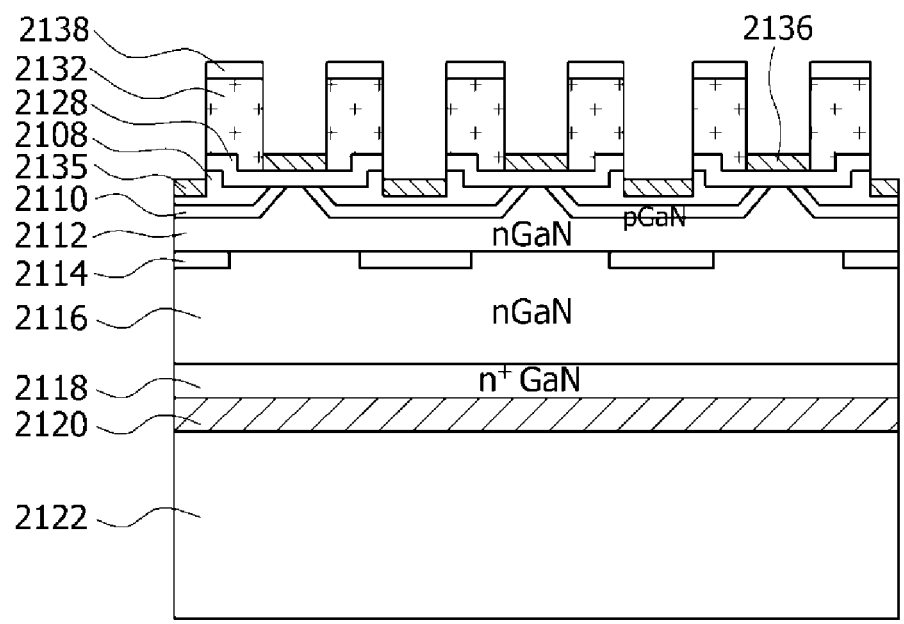

Referring to FIG. 90, a metal layer may be formed on a surface of the substrate including the lift-off mask patterns 2132. The metal layer may be deposited to a thickness which is less than a thickness of the lift-off mask patterns 2132. In such a case, the metal layer may include metal patterns 2138 deposited on the exposed surfaces of the second GaN layers 2108, metal patterns 2135 deposited on top surfaces of the lift-off mask patterns 2132, and metal patterns 2136 deposited on the exposed portions of the gate insulation patterns 2128. The metal patterns 2138 deposited on the exposed surfaces of the second GaN layers 2108 may act as source electrodes, and the metal patterns 2136 deposited on the exposed portions of the gate insulation patterns 2128 may act as gate electrodes.

Figure 91:
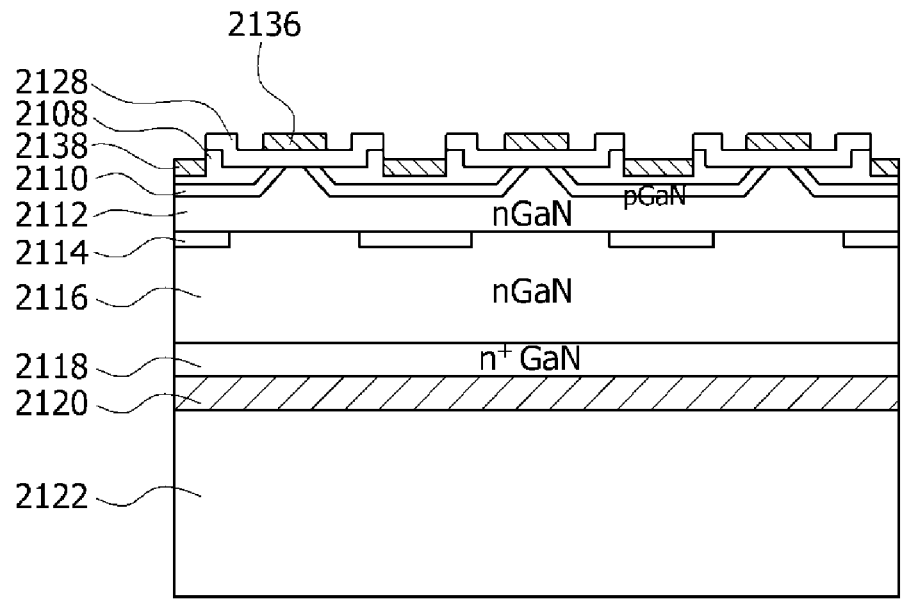

Referring to FIG. 91, the lift-off mask patterns 2132 may be removed. In the event that the lift-off mask patterns 2132 are formed of a photoresist layer, the lift-off mask patterns 2132 may be removed using a photoresist strip process, for example, an ashing process. When the lift-off mask patterns 2132 are removed, the metal patterns 2135 on the lift-off mask patterns 2132 may also be removed.

Figure 92:
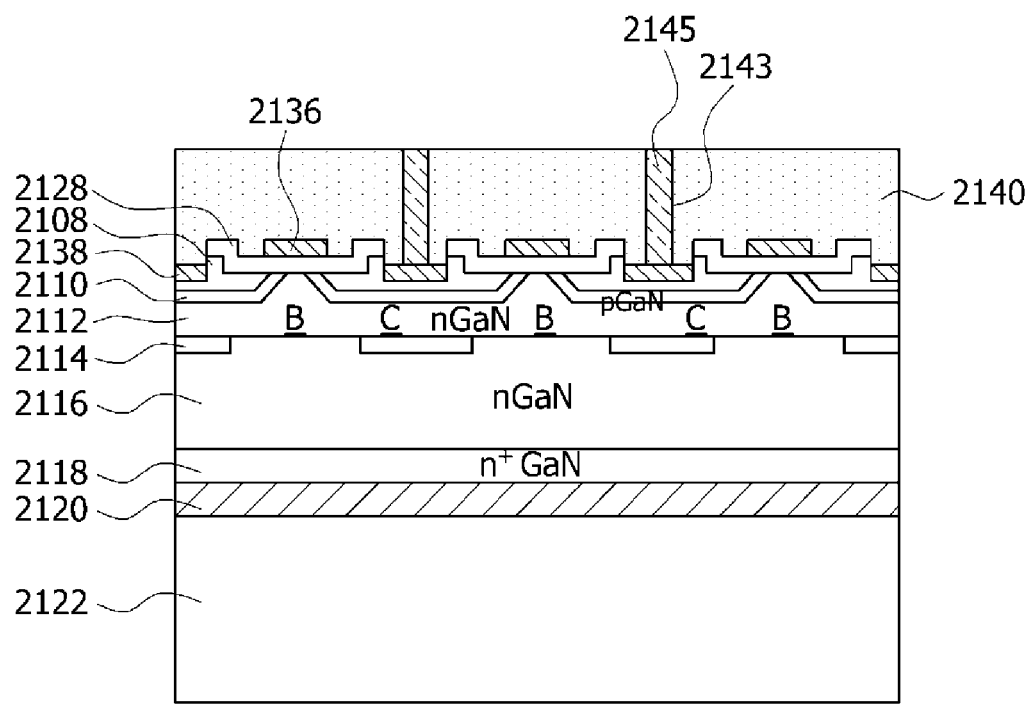

Referring to FIG. 92, a passivation layer 2140 may be formed to cover the source electrodes 2138 and the gate electrodes 2136. In one exemplary embodiment, the passivation layer 2140 may be formed of an oxide layer and a nitride layer. The passivation layer 2140 may be patterned to form via holes 2143 exposing the source electrodes 2138. While the via holes 2143 are formed, other via holes (not shown) exposing the gate electrodes 2136 may also be formed. In one exemplary embodiment, the via holes 2143 exposing the source electrodes 2138 and the other via holes exposing the gate electrodes 2136 may be formed using two separate etching process. Interconnection lines 2145 filling the via holes 2143 may then be formed.

In FIG. 92, if the vertical GaN transistor is turned on, carriers may be vertically drifted through first regions (indicated by a reference character "B") in the fourth GaN layer 2112. In contrast, the carriers are hardly drifted through second regions (indicated by a reference character "C") in the fourth GaN layer 2112 because of the presence of the current blocking patterns 2114 located under the second regions C. The first regions B may be regions which are formed by lateral growth of the fourth GaN layer 2112. Thus, the first regions B may have a relatively low density of the vertical threading dislocations. As a result, when the vertical GaN transistor is turned off, the first regions B may suppress a leakage current between the source electrodes 2138 and the drain electrode layer 2120.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A vertical gallium nitride transistor, comprising:
    a first semiconductor layer of a first conductivity type comprising a first surface, a second surface opposite to the first surface, and sidewalls;
    a second semiconductor layer of the first conductivity type surrounding the second surface and the sidewalls of the first semiconductor layer;
    a third semiconductor layer of a second conductivity type disposed between the first semiconductor layer and the second semiconductor layer, the third semiconductor layer separating the first and second semiconductor layers from each other;
    a source electrode disposed on the first surface of the first semiconductor layer, the source electrode being electrically connected to the first semiconductor layer;
    a gate electrode disposed on a first surface of the third semiconductor layer between the first and second semiconductor layers;
    a drain electrode, wherein the second semiconductor layer is disposed on a first surface of the drain electrode; and
    a current blocking layer disposed between the drain electrode and the second semiconductor layer, the current blocking layer comprising a lower surface in direct contact with the drain electrode and an upper surface that is in direct contact with the second semiconductor layer,
    wherein the first semiconductor layer, the third semiconductor layer, and the second semiconductor layer comprise a semiconductor structure.

2. The vertical gallium nitride transistor of claim 1, wherein the semiconductor structure further comprises a doped layer disposed between the drain electrode and the second semiconductor layer.

3. The vertical gallium nitride transistor of claim 1, further comprising a support substrate, wherein a second surface of the drain electrode opposite to the first surface is disposed on the support substrate.

4. The vertical gallium nitride transistor of claim 1, further comprising a current blocking layer disposed between the drain electrode and the second semiconductor layer.

5. The vertical gallium nitride transistor of claim 1,
    wherein the first and second semiconductor layers comprise N-type gallium nitride; and
    wherein the third semiconductor layer comprises P-type gallium nitride.

6. The vertical gallium nitride transistor of claim 1, wherein:
    the third semiconductor layer comprises a plurality of third semiconductor layers;
    the first semiconductor layer comprises a plurality of first semiconductor layers, the plurality of first semiconductor layers comprising a stripe pattern and a lower first semiconductor layer covering sidewalls and a bottom surface of the strip pattern;
    the source electrode comprises a plurality of source electrodes;

each of the plurality of third semiconductor layers surround at least two of the first semiconductor layers;
each of the source electrodes is electrically connected to at least two of the first semiconductor layers; and
the second semiconductor layer surrounds the sidewalls and a bottom surface of the lower first semiconductor layer.

7. The vertical gallium nitride transistor of claim 1,
wherein the drain electrode contacts the second semiconductor layer, between each of the current blocking layers.

8. The vertical gallium nitride transistor of claim 7, further comprising a low resistive layer disposed between the drain electrode and the second semiconductor layer, the low resistive layer being an etch damage layer formed by etching a portion of the second semiconductor layer.

* * * * *